US008887030B2

(12) United States Patent
Loghin et al.

(10) Patent No.: US 8,887,030 B2
(45) Date of Patent: Nov. 11, 2014

(54) ENCODER AND ENCODING METHOD PROVIDING INCREMENTAL REDUNDANCY

(75) Inventors: Nabil Loghin, Stuttgart (DE); Lothar Stadelmeier, Stuttgart (DE); Joerg Robert, Vreden (DE); Samuel Asangbeng Atungsiri, Hampshire (GB); Makiko Yamamoto, Tokyo (JP); Yuji Shinohara, Kanagawa (JP); Lui Sakai, Kanagawa (JP); Takashi Yokokawa, Kanagawa (JP)

(73) Assignee: Sony Corporation, Tokyo (JP)

(*) Notice: Subject to any disclaimer, the term of this patent is extended or adjusted under 35 U.S.C. 154(b) by 278 days.

(21) Appl. No.: 13/579,735

(22) PCT Filed: Feb. 18, 2011

(86) PCT No.: PCT/EP2011/052417
§ 371 (c)(1),
(2), (4) Date: Sep. 7, 2012

(87) PCT Pub. No.: WO2011/104182
PCT Pub. Date: Sep. 1, 2011

(65) Prior Publication Data
US 2012/0320994 A1 Dec. 20, 2012

(30) Foreign Application Priority Data
Feb. 26, 2010 (EP) .................................. 10154869

(51) Int. Cl.
*H03M 13/00* (2006.01)
*H04L 1/00* (2006.01)
*H03M 13/37* (2006.01)
*H03M 13/11* (2006.01)

(52) U.S. Cl.
CPC ............. *H03M 13/11* (2013.01); *H04L 1/0068* (2013.01); *H03M 13/1165* (2013.01); *H04L*
(Continued)

(58) Field of Classification Search
USPC ......... 714/776, 758, 786, 752, 799, 800, 803; 370/470, 472, 473, 474, 476, 479
See application file for complete search history.

(56) References Cited
U.S. PATENT DOCUMENTS 7,124,351 B2 * 10/2006 Aldridge et al. ............... 714/781
7,154,835 B2 * 12/2006 Iwata et al. .................. 369/59.25
(Continued)

FOREIGN PATENT DOCUMENTS

| CN | 1491035 A | 4/2004 |
| EP | 1 482 671 | 12/2004 |
| WO | 2005 020499 | 3/2005 |

OTHER PUBLICATIONS

Combined Chinese Office Action and Search Report issued Mar. 18, 2014 in Patent Application No. 201180011410.0 (English Translation only).
(Continued)

*Primary Examiner* — Christine Tu
(74) *Attorney, Agent, or Firm* — Oblon, Spivak, McClelland, Maier & Neustadt, L.L.P.

(57) ABSTRACT

The present invention relates to an encoder for error correction code encoding input data words (D) into codewords (Z1, Z2), comprising: an encoder input (1451) for receiving input data words (D) each comprising a first number $K_{ldpc}$ of information symbols, an encoding means (1452) for encoding an input data word (D) into a codeword (Z1, Z2, Z3, Z4) such that a codeword comprises a basic codeword portion (B) including a data portion (D) and a basic parity portion (Pb) of a second number $N_{ldpc}-K_{ldpc}$ of basic parity symbols, and an auxiliary codeword portion (A) including an auxiliary parity portion (Pa) of a third number $M_{IR}$ of auxiliary parity symbols, wherein said encoding means (14) is adapted i) for generating said basic codeword portion (B) from an input data word (D) according to a first code, wherein a basic parity symbol is generated by accumulating an information symbol at a parity symbol address determined according to a first address generation rule, and ii) for generating said auxiliary codeword portion (A) from an input data word (D) according to a second code, wherein an auxiliary parity symbol is generated by accumulating an information symbol m at a parity symbol address γ, wherein said parity symbol addresses γ are determined according to a second address generation rule $N_{ldpc}-K_{ldpc}+\{x+m \text{ mod } G_a \times Q_{IR}\} \text{ mod } M_{IR}$ if $x > N_{ldpc}-K_{ldpc}$, wherein x denotes the addresses of a parity symbol accumulator corresponding to the first information symbol of a group of size $G_a$ and $Q_{IR}$ is an auxiliary code rate dependent, predefined constant, and an encoder output (1454) for outputting said codewords (Z1, Z2).

15 Claims, 43 Drawing Sheets

(52) U.S. Cl.
CPC .......... 1/0036 (2013.01); *H04L 2001/0098* (2013.01); *H03M 13/6519* (2013.01); *H04L 1/0059* (2013.01); *H03M 13/3761* (2013.01); *H04L 1/0083* (2013.01); *H04L 1/0057* (2013.01); *H04L 1/0045* (2013.01)
USPC .......................................... 714/776; 714/758

(56) References Cited

U.S. PATENT DOCUMENTS 8,437,183 B2 * 5/2013 Sharon et al. ............ 365/185.01
8,707,125 B2 * 4/2014 Jeong et al. ................... 714/758

OTHER PUBLICATIONS

ETSI EN 302 307 V1.2.1, Digital Video Broadcasting (DVB); Second generation framing structure, channel coding and modulation systems for broadcasting, Interactive Services, News Gathering and other broadband satellite applications (DVB-S2), ETSI, pp. 1 to 78, (Aug. 2009).

ETSI EN 302 755 V1.1.1, Digital Video Broadcasting (DVB); Frame structure channel coding and modulation for a second generation digital terrestrial television broadcasting system (DVB-T2), ETSI, pp. 1 to 167, (Sep. 2009).

"DVB-T2 Call for Technologies," DVB Digital Video Broadcasting, vol. SB 1644r1, pp. 1 to 12, (Apr. 16, 2007).

Mandelbaum, D., "An Adaptive-Feedback Coding Scheme Using Incremental Redundancy," IEEE Transaction on Information Theory, pp. 388 to 389, (May 1974) XP 002628271.

Duman, T., et al., "Concatenated Codes and Iterative Decoding," Coding for MIMO Communication Systems, pp. 163 to 164, 187, (Sep. 1, 2007) XP 002621914.

Kim, J., et al., "Design of Rate-Compatible Irregular LDPC Codes for Incremental Redundancy Hybrid ARQ Systems," ISIT, pp. 1139 to 1143, (Jul. 9 to 14, 2006).

DVB, Implementation guidelines for a second generation digital terrestrial television broadcasting system (DVB-T2), DVB Document A133, pp. 1 to 194, (Feb. 2009).

ESTI, "Radio braodcasting systems; Digital Audio Broadcasting (DAB) to mobile, portable and fixed receivers," EBU/CENELEC/ETSI JTC, pp. 1 to 226, (May 1997).

International Search Report Issued Sep. 15, 2011 in PCT/EP11/052417 Filed Feb. 18, 2011.

* cited by examiner

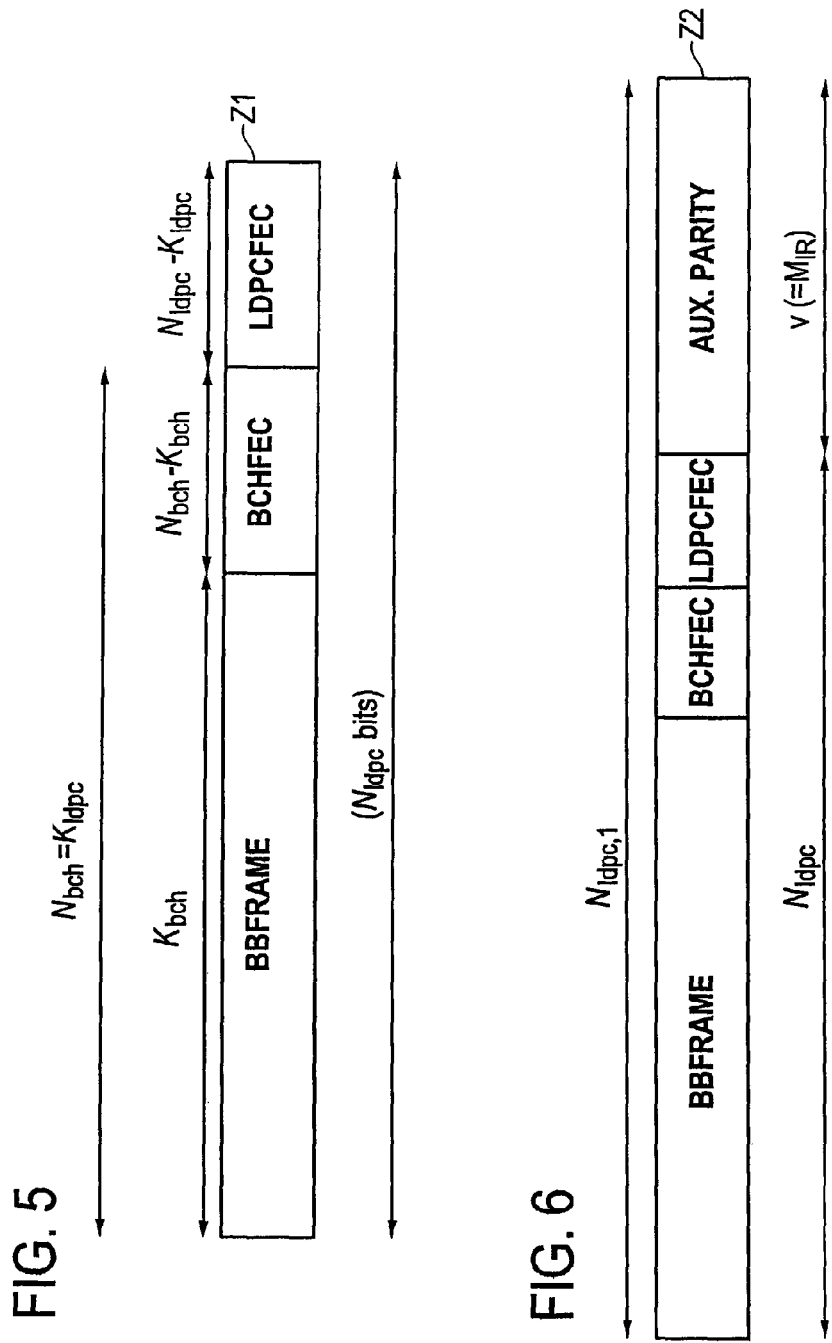

Rate 1/2

| 118 | 375 | 395 | 490 | 552 | 599 | 895 | 954 | 1005 | 1517 | 1576 | 1739 | 2030 |
|---|---|---|---|---|---|---|---|---|---|---|---|---|
| 194 | 1547 | 1598 | 1801 | 2291 | 3086 | 5097 | 5184 | 5413 | | | | |
| 140 | 238 | 253 | 1734 | 3972 | 4567 | 4573 | 5834 | 6055 | | | | |
| 243 | 378 | 919 | 1188 | 3265 | 3707 | 4176 | 4272 | 6174 | | | | |
| 201 | 1005 | 1033 | 1128 | 2945 | 3257 | 3898 | 4022 | 5194 | | | | |
| 202 | 727 | 782 | 1100 | 3117 | 3773 | 4683 | 5859 | | | | | |

FIG. 23

Rate 7/12

| 125 | 447 | 543 | 634 | 864 | 1112 | 1124 | 1206 | 1268 | 1484 | 1568 | 1668 | 1672 |
|---|---|---|---|---|---|---|---|---|---|---|---|---|
| 105 | 605 | 821 | 1587 | 2609 | 3159 | 3333 | 4096 | 4237 | 4939 | | | |
| 50 | 531 | 803 | 1595 | 2026 | 2683 | 4028 | 4729 | 5215 | 5261 | | | |
| 226 | 410 | 810 | 1378 | 2195 | 4002 | 4456 | 4731 | 5724 | 5886 | | | |
| 27 | 925 | 933 | 966 | 2134 | 2424 | 3165 | 3400 | 4488 | 5474 | | | |
| 131 | 261 | 687 | 1079 | 2778 | 3519 | 4034 | 4809 | 6079 | 6109 | | | |
| 207 | 1054 | 1706 | 1764 | 2079 | 3178 | 3439 | 3616 | 5029 | 5304 | | | |

FIG. 24

Rate 2/3

| 15 | 253 | 313 | 501 | 563 | 582 | 865 | 911 | 977 | 1266 | 1276 | 1356 | 1427 |
|---|---|---|---|---|---|---|---|---|---|---|---|---|
| 256 | 743 | 982 | 1109 | 1441 | 2337 | 2387 | 2847 | 3209 | 3776 | | | |
| 343 | 525 | 976 | 1102 | 1854 | 2900 | 3787 | 4669 | 4673 | | | | |
| 12 | 502 | 539 | 782 | 2980 | 3827 | 5035 | 5297 | 5576 | | | | |
| 556 | 593 | 1120 | 1420 | 2937 | 3800 | 4130 | 4662 | 4881 | | | | |
| 18 | 119 | 431 | 460 | 1548 | 1982 | 3230 | 4599 | 4992 | | | | |
| 178 | 253 | 416 | 771 | 2488 | 3026 | 4657 | 4815 | 5294 | | | | |
| 74 | 100 | 205 | 1214 | 1999 | 2412 | 2680 | 2952 | 5446 | | | | |

FIG. 25

Rate 3/4

| 109 | 116 | 136 | 141 | 178 | 238 | 250 | 503 | 566 | 723 | 978 | 1065 | 1068 |
|---|---|---|---|---|---|---|---|---|---|---|---|---|
| 113 | 191 | 586 | 1003 | 1496 | 1650 | 3564 | 5149 | 5210 | | | | |
| 219 | 426 | 583 | 1061 | 1146 | 1338 | 2094 | 2605 | 4627 | | | | |
| 329 | 429 | 576 | 855 | 1265 | 1810 | 3878 | 3884 | 4241 | | | | |
| 121 | 231 | 337 | 620 | 1896 | 2360 | 3027 | 3443 | 4297 | | | | |
| 199 | 216 | 676 | 831 | 1430 | 4431 | 4450 | 5094 | | | | | |
| 223 | 560 | 686 | 713 | 3276 | 3286 | 4513 | 4612 | | | | | |
| 632 | 944 | 1015 | 1043 | 2715 | 3381 | 3863 | 4586 | | | | | |
| 171 | 365 | 514 | 882 | 2595 | 3456 | 4864 | 5136 | | | | | |

FIG. 26

Rate 4/5 ( true code rate 7/9) ($N_{ldpc}$ = 16200)

| | | | | | | | | | | | | | | | | | |
|---|---|---|---|---|---|---|---|---|---|---|---|---|---|---|---|---|---|
| 5 | 896 | 1555 | 3976 | 5177 | 5570 | 6450 | 7092 | 7119 | 7737 | 9989 | 10690 | 11608 | 12337 | 13423 | 15147 | 15236 | 18042 | 18646 | 18943 |
| 6 | 2493 | 184 | 3974 | 4857 | 5219 | 6195 | 9757 | 10985 | 11147 | 12739 | 12863 | 13032 | 15380 | 15493 | 15626 | 16209 | 17132 | 19188 |
| 7 | 212 | 3210 | 4908 | 7027 | 15220 | 15928 | 18514 | 18586 |
| 8 | 727 | 1339 | 4798 | 9485 | 10059 | 15511 | 17301 | 19580 |
| 9 | 3428 | 612 | 4774 | 5359 | 9448 | 14264 | 14855 |
| 0 | 2663 | 1947 | 6850 | 13950 | 14102 | 15231 | 18805 |
| 1 | 230 | 2695 | 5852 | 8445 | 18066 | 18320 | 19412 |
| 2 | 2025 | 2794 | 7267 | 11154 | 12026 | 13208 | 19569 |
| 3 | 3039 | 283 | 7240 | 8439 | 15298 | 16123 | 19667 |
| 4 | 862 | 2889 | 6077 | 11410 | 13343 | 13820 | 18151 |
| 5 | 376 | 2110 | 6121 | 6934 | 7388 | 10517 | 19056 |
| 6 | 2034 | 2286 | 3976 | 4115 | 8590 | 8739 | 18693 |
| 7 | 951 | 2068 | 6200 | 8893 | 9899 | 12429 | 12652 |
| 8 | 3108 | 3542 | 6829 | 9093 | 11279 | 12524 | 16270 |
| 9 | 307 | 1421 | 3600 | 6992 | 7442 | 15036 | 17076 |
| 0 | 2272 | 1197 | 3977 | 4102 | 5079 | 8412 | 11240 |
| 1 | 1800 | 3280 | 3929 | 9085 | 13441 | 15445 | 16409 |
| 2 | 331 | 2308 | 5185 | 5868 | 6671 | 13213 |
| 3 | 465 | 2552 | 10559 | 13450 | 14117 | 17859 |
| 4 | 1038 | 2479 | 14092 | 16158 | 17813 | 18198 |
| 5 | 1383 | 343 | 7226 | 9948 | 14578 | 15724 |
| 6 | 94 | 236 | 5079 | 6952 | 9415 | 17216 |
| 7 | 2619 | 121 | 7920 | 8676 | 12784 | 17382 |
| 8 | 1497 | 2774 | 9088 | 13324 | 15881 | 16949 |
| 9 | 2116 | 1855 | 4178 | 7510 | 15188 | 17136 |
| 0 | 722 | 1584 | 5610 | 7870 | 10084 | 13927 |
| 1 | 2767 | 1861 | 6763 | 8392 | 15336 | 15691 |
| 2 | 2701 | 1610 | 3902 | 6783 | 8083 | 13103 |
| 3 | 3283 | 1732 | 4311 | 6931 | 8934 | 12248 |
| 4 | 168 | 1099 | 4288 | 8166 | 17047 | 17578 |
| 5 | 3074 | 243 | 4470 | 5665 | 10952 | 12858 |
| 6 | 3460 | 945 | 6979 | 12352 | 14343 | 16203 |
| 7 | 2049 | 1746 | 5923 | 6842 | 9865 | 16902 |
| 8 | 566 | 1427 | 11410 | 11512 | 12141 | 16256 |
| 9 | 3645 | 1168 | 4269 | 6718 | 7336 | 11516 |

FIG. 30

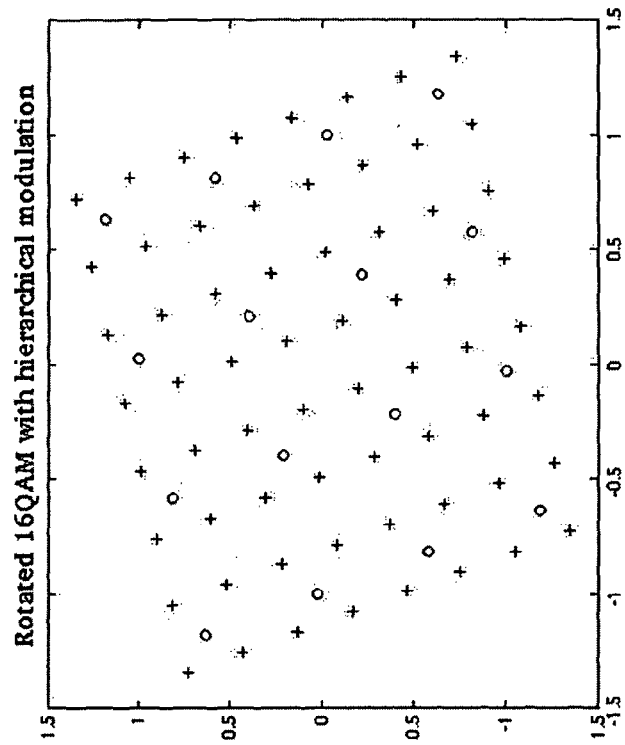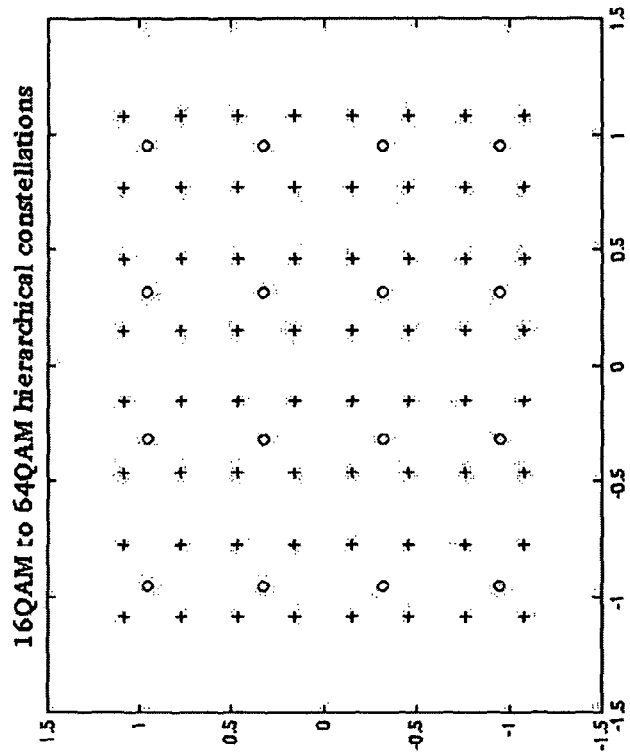
Fig. 56

ENCODER AND ENCODING METHOD PROVIDING INCREMENTAL REDUNDANCY

FIELD OF INVENTION

The present invention relates to an encoder and a corresponding encoding method for error correction code encoding input data words into codewords. Further, the present invention relates to a transmitter and a corresponding transmission method for broadcasting data in a broadcasting system. Still further, the present invention relates to a computer program for implementing said transmission method on a computer. Finally, the present invention relates to a broadcasting system comprising such a transmitter and one or more receivers for receiving data broadcast by said transmitter.

The present invention relates particularly to an LDPC encoder as, for instance, used in a transmitter of a Digital Video Broadcasting (DVB) system utilizing Orthogonal Frequency Division Multiplexing (OFDM). Further, the present invention can be applied in other systems, which apply the same or similar LDPC encoding schemes from DVB.

BACKGROUND OF THE INVENTION

The transmission parameters of known broadcasting systems, such as the broadcasting systems in accordance with the DVB-T2 standard (second generation digital terrestrial television broadcasting systems standard), are generally optimized for fixed reception with stationary receivers, e.g. with roof-top antennas. In future broadcasting systems, such as the upcoming DVB-NGH (DVB Next Generation Handheld; in the following also referred to as NGH) standard, a mobile receiver (which is the main focus of this upcoming standard) shall be enabled to receive data correctly also in bad reception situations, e.g. despite suffering from multipath propagation, fading effects and Doppler shifts. Such broadcasting systems are particularly characterized by the fact that there is generally no feedback channel and no signalling from receivers to transmitters.

SUMMARY OF INVENTION

It is an object of the present invention to provide an encoder and a corresponding encoding method as well as a transmitter and a corresponding transmission method for broadcasting data in a broadcasting system by which the probability of error-free reception/reconstruction of data by a mobile receiver is increased compared to transmitters and transmission methods in known broadcasting systems, even under bad reception conditions. It is a further object of the present invention to enable the use of different types of decoders and receivers, but to ensure compatibility. It is a still further object of the present invention to provide a computer program for implementing said encoding method and a broadcasting system.

According to an aspect of the present invention there is provided an encoder for error correction code encoding input data words into codewords, comprising:

an encoder input for receiving input data words each comprising a first number $K_{ldpc}$ of information symbols, an encoding means for encoding an input data word into a codeword such that a codeword comprises a basic codeword portion including a data portion and a basic parity portion of a second number $N_{ldpc} - K_{ldpc}$ of basic parity symbols, and an auxiliary codeword portion including an auxiliary parity portion of a third number $M_{IR}$ of auxiliary parity symbols, wherein said encoding means is adapted i) for generating said basic codeword portion from an input data word according to a first code, wherein a basic parity symbol is generated by accumulating an information symbol at a parity symbol address determined according to a first address generation rule, and ii) for generating said auxiliary codeword portion from an input data word according to a second code, wherein an auxiliary parity symbol is generated by accumulating an information symbol m at a parity symbol address γ, wherein said parity symbol addresses γ are determined according to a second address generation rule $$N_{ldpc} - K_{ldpc} + \{x + m \bmod G_a \times Q_{IR}\} \bmod M_{IR} \text{ if } x \geq N_{ldpc} - K_{ldpc},$$

wherein x denotes the addresses of a parity symbol accumulator corresponding to the first information symbol of a group of size $G_a$ and $Q_{IR}$ is an auxiliary code rate dependent, predefined constant, and an encoder output for outputting said codewords.

According to a further aspect of the present invention a transmitter for broadcasting data in a broadcasting system is provided, comprising:

a data input for receiving at least one transmitter input data stream segmented into input data words, an encoder as defined above for error correction code encoding the input data words into codewords, a data mapper for mapping the codewords onto frames of a transmitter output data stream, and a transmitter unit for transmitting said transmitter output data stream.

According to further aspects of the present invention there are provided a corresponding encoding method, transmission method and a computer program comprising program means for causing a computer to carry out the steps of said encoding method, when said computer program is carried out on a computer.

Preferred embodiments of the invention are defined in the dependent claims. It shall be understood that the claimed apparatus, the claimed methods and the claimed computer program have similar and/or identical preferred embodiments as the claimed encoder and as defined in the dependent claims.

The present invention is based on the idea to enable a mobile receiver, for instance an in-car receiver or a handheld receiver (e.g. in a mobile phone or a PDA) in a broadcasting system to decode broadcast data even under severe transmission channel conditions by improving the provided error correction measures. In particular, it is proposed to provide a sufficient amount of redundancy by the encoder to increase the robustness of the code. Said additional redundancy is provided by the transmitter such that a receiver can, but does not mandatorily, use it if reception or reconstruction (decoding) of received broadcast data is erroneous or could only be made with insufficient quality. The broadcasting operator also has the ability to choose from a variety of different coding and modulation schemes, thereby trading off throughput versus robustness.

To ensure that a receiver (e.g. an existing legacy receiver), in particular its decoder, can correctly decode received data without any additional redundancy provided according to the present invention, a first code is applied by the error correction code encoder (generally applying forward error correction) to generate a basic codeword portion for the data words of the data to be broadcast. This way of encoding can be the known standard way of encoding input data words into codewords, for instance the forward error correction (FEC) encoding as applied in DVB-T2, DVB-S2, DVB-C2, or the upcoming DVB-NGH transmitters (e.g. LDPC encoding), i.e. the basic codeword portion may correspond to a ("normal" error correction code) codeword according to the DVB-T2 standard (in the following also referred to as T2). In addition, however, it is proposed according to the present invention to provide incremental redundancy for the decoder of the receiver by generating an auxiliary codeword portion from the input data words according to a second code. The "total" code, i.e. the code according to which the "total" codeword (comprising the basic codeword portion and the auxiliary codeword portion) is generated, thus has a lower code rate than the first code. Hence, said "total" code, in particular said auxiliary codeword portion, provides a higher robustness and enables (better) decoding than the first code even under bad reception conditions.

Hence, under normal reception conditions the decoder does generally not (need to) use the auxiliary codeword portion at all, but only uses the basic codeword portion to decode the received data. In situations where the decoder realizes that the decoding of received data is erroneous or with insufficient quality it uses part of or the complete auxiliary codeword portion to better decode the received data. Thus, the basic codeword portion can be used as it is by a receiver/decoder for decoding, and the auxiliary codeword portion needs only to be used if really needed for decoding.

Furthermore, the auxiliary codeword portion represents an additional measure for improving the decoding abilities, particularly for mobile receivers in case of bad reception conditions. Both the basic codeword portion as well the auxiliary codeword portion are mapped into the transmitter output data stream by an appropriate data mapper of the transmitter, said transmitter output data stream generally being segmented into frames. For instance, a framing structure as applied according to the DVB-T2 system using T2 frames and FEF (Future Extension Frames) frames can be used for transporting the two codeword portions in an appropriate way.

Preferably, the encoder and the decoder apply a systematic code for generating said codewords such that said basic codeword portion comprises a data portion, in particular the input data word, and a basic parity portion, and said auxiliary codeword portions comprises an auxiliary parity portion. For instance, the basic codeword portion may be a combination of information symbols (e.g. information bits or information bytes) of an input data word and generated basic parity symbols (e.g. basic parity bits or bytes), said combination representing a basic codeword of a first code, which can be decoded by the decoder. In this example, the auxiliary codeword portion may comprise auxiliary parity symbols (e.g. auxiliary parity bits or bytes), said auxiliary codeword portion representing an auxiliary codeword of a second code, which can be used, to improve the likelihood of decoding said first codeword.

For generating said (basic and auxiliary) parity symbols of said basic and auxiliary codeword portion parity symbol accumulators are used, as generally known and applied, e.g. according to DVB-T2 (ETSI EN 302 755 V1.1.1 (2009-09) "Digital Video Broadcasting (DVB); Framing structure Channel Coding and Modulation for a Second Generation Digital Terrestrial Television Broadcasting System (DVB-T2)"), DVB-C2 (DVB BlueBook A138 "Digital Video Broadcasting (DVB); Frame structure channel coding and modulation for a second generation digital transmission system for cable systems (DVB-C2) or DVB-S2 (ETSI EN 302 307 V1.2.1 (2009-08) "Digital Video Broadcasting (DVB); Second generation framing structure, channel coding and modulation systems for Broadcasting, Interactive Services, News Gathering and other broadband satellite applications (DVB-S2)"). For such a parity symbol accumulation an address generation rule is used to determine the addresses of the parity symbols, at which an information symbol is accumulated ("accumulating" being in general also referred to as "encoding"). Generally, however, only a single address generation rule is applied, which is applied for determining all parity addresses of the basic codeword, which shall not exclude that more address generation rules are applied for generating the basic code. According to the present invention, however, different address generation rules are used for generating the basic parity symbols and the auxiliary parity symbols to obtain the desired features of the first and second codes. Particularly the second address generation rule to obtain each auxiliary parity symbol by accumulating an information symbol m at a parity symbol address γ, wherein said parity symbol addresses γ are determined according to the second address generation rule, is given as $$N_{ldpc} - K_{ldpc} + \{x + m \bmod G_a \times Q_{IR}\} \bmod M_{IR} \text{ if } x \geq N_{ldpc} - K_{ldpc},$$

wherein x denotes the addresses of a parity symbol accumulator corresponding to the first information symbol of a group of size $G_a$ and $Q_{IR}$ is an auxiliary code rate dependent, predefined constant, is designed such that the desired backward compatibility of the codes is obtained, as explained later. Thus, the total code also comprises the first code. Furthermore, the second address generation rule follows the same blockwise (and quasi-cyclic) encoding principle (in groups of length $G_a$) as is done for all LDPC codes of the DVB family of standards. In particular, both groups can have the same length.

The encoder and the encoding method of the present invention can be generally applied to extend a basic code into an extended code (having a lower code rate than said basic code), but where different types of decoders can decode at least the basic code, i.e. where backward compatibility is ensured for legacy decoders which cannot decode the extended code, but only the basic code.

According to a preferred embodiment said encoding means is adapted for generating a basic parity symbol by accumulating an information symbol m at a parity symbol address γ, wherein said parity symbol addresses γ are determined according to the first address generation rule $$\{x + m \bmod G_b \times Q_{ldpc}\} \bmod (N_{ldpc} - K_{ldpc}) \text{ if } x < N_{ldpc} - K_{ldpc}$$

wherein x denotes the addresses of a parity symbol accumulator corresponding to the first information symbol of a group of size $G_b$ and $Q_{ldpc}$ is a basic code rate dependent, predefined constant. Hence, according to this embodiment the same address generation rule is applied that is defined in the DVB-T2 (or DVB-C2 or DVB-S2) standard, which enables receivers according to the DVB-T2 standard to decode the first code. Another advantage of this backward compatibility is that it simplifies decoding of several data input streams, which are either encoded by the basic encoding rule or by the extended encoding rule, which outputs both basic and auxiliary codeword portions in the following way: if successful decoding of the basic codeword portions is possible, the decoder can use the same (basic) decoding operation. Only, if decoding of the basic code fails, the decoder has to change the decoding operation according to the extended code (and can ignore those input data streams, which are encoded only by the basic encoder only).

According to a further embodiment said group sizes used in said first and second address generation rules are identical, i.e. $G_a=G_b$. Preferably a group size of 360 is selected (according to the LDPC code generation of DVB). Thus, a blockwise (or groupwise) encoding is performed by subsequently taking groups of $G=G_a=G_b$ (preferably =360) information symbols (preferably, information bits) and encoding them into parity symbols. In this way the quasi-cyclic structure for both the basic parity portion and the auxiliary parity portion is maintained, which enables blockwise and, thus, simpler decoding based on said groups having a fixed group size.

Preferably, said encoding means is adapted for blockwise generating said basic parity symbols and said auxiliary parity symbols by use of a group of subsequent information symbols, wherein each information symbol i of said group of subsequent information symbols is accumulated at a set of different parity symbol addresses γ, wherein the set of parity symbol addresses, at which the first information symbol of said group is accumulated, is taken from a predetermined address table and wherein the symbol addresses, at which the subsequent information symbols of said group are accumulated, are determined from said set of parity symbol addresses according to said first or said second address generation rule, respectively, and wherein a separate set of parity symbol addresses is taken from said address table for generating each new block of basic parity symbols and auxiliary parity symbols. The use of such predetermined address tables enables that the parity symbol addresses contained therein can be optimized in advance for each desired combination of values of the data rate, group sizes $G_a$, $G_b$, code rate dependent predefined constants $Q_{ldpc}$, $Q_{IR}$, third number of auxiliary parity symbols $M_{IR}$ and length of the basic codeword portion $N_{ldpc}$, so that the obtained code is as strong as possible and allows correcting of as many errors as possible. Further, the addresses provided in said address tables (whose number are valid for groups of $G_a$ and $G_b$ of information symbols) provide the advantage that these address generation rules (and also the address tables) can be formulated and stored efficiently and with a reasonable amount of storage space in the transmitter and the receivers. Otherwise, the address generation rules and the address tables would be much larger and could have an extremely large size, if for each information symbol the parity address had to be provided in a table explicitly.

In a particular advantageous application the following parameter values are used: $M_{IR}=N_{ldpc}=4320$, $Q_{IR}=12$, $G=G_a=G_b=360$. Further, for the code rate identifiers the values 1/2, 7/12, 2/3, and 3/4 and for the parameter $Q_{ldpc}$ the values (in the same sequence, i.e. corresponding to the respective code rate) 6, 5, 4, and 3 are selected. As is known from the DVB-T2 and DVB-S2 standards the code rate identifiers are not always identical to the true code rate (however, for the selected codes, the code identifier corresponds to the true code rate). Optimized address tables including the parity symbol addresses for these different code rates and these parameter values are defined in further dependent claims. Hence, according to such embodiments the encoding means is adapted for subsequently taking a new row of the following address table as a new set of different parity symbol addresses γ for accumulating a new group of subsequent information symbols.

While the present invention can be used in a general way to extend an existing code, in a preferred application said basic codeword portion is provided for regular decoding and said auxiliary codeword portion is provided as incremental redundancy if regular decoding of the codeword by use of the basic codeword portion is erroneous.

According to a preferred embodiment of the transmitter the data mapper is adapted for mapping the basic codeword portion of a codeword onto a different portion of the transmitter output data stream, in particular onto a different frame, than the auxiliary codeword portion of the same codeword. This provides the advantage that the auxiliary codeword portion might not be affected by disturbances of the channel that affect the basic codeword portion, such as time selective fadings or noise bursts. Generally, the amplitude and phase of different reception paths also depend on the position of the receiver. Further, in case of a moving receiver, especially the phase of the signals of different reception paths changes, which causes a time-selective channel. The changes in the time direction can also have a very regular structure, the change rate of which over the time axis being proportional to the relative velocity of the receiver to the transmitter and the transmission frequency of a signal. Also other disturbances, such as impulsive noise, can have a regular structure, e.g. caused by the line cycle frequency of the power grid or by bursts from other data transmission systems, e.g. a GSM communications system. Mapping the basic codeword portion on the one hand and the corresponding auxiliary codeword portion on the other hand onto different portions of the transmitter output data stream may in such situations avoid that all data related to a particular codeword are affected by such regular disturbances and may thus ensure correct decoding of the codeword at the receiver. Further, as will be explained below in more detail, a receiver can fall into sleeping mode during the transmission of the auxiliary data portion, if said auxiliary data portion is not required for decoding.

According to another preferred embodiment of the transmitter said data mapper is adapted for mapping the basic codeword portion of a codeword onto a frame of a first type of the transmitter output data stream, in particular onto a T2 frame of a transmitter output data stream in accordance with a DVB broadcasting system, and for mapping the auxiliary codeword portion of the respective codeword onto a frame of a second type, arranged between frames of the first type, of the transmitter output data stream, in particular onto an FEF frame of a transmitter output data stream in accordance with a DVB broadcasting system. This provides the advantage that stationary receivers only access the data transmitted in the frames of the first type, for instance that receivers in accordance with the DVB-T2 standard only access the data transmitted in the T2 frames. Mobile receivers generally also access the data transmitted in the frames of the first type which are also, according to the present invention, sufficient for correctly decoding the received codewords and for reproducing the encoded data words. However, if the decoder realizes that the decoding is erroneous or that the decoded data have insufficient quality, it may then also access the data, i.e. the auxiliary codeword portion, transmitted in the frames of a second type and use these additional data as incremental redundancy, i.e. use the basic codeword portion and (part or all of) the auxiliary codeword portion for decoding, which finally provides an increased probability that the data are decoded correctly since the total code of a codeword, i.e. a combination of the basic codeword portion and the auxiliary codeword portion, has lower code rate than the first code according to which the first codeword is encoded.

This embodiment provides the additional advantage that the existing framing structure as defined in the DVB-T2 standard may be used, for instance in such a way that stationary receivers (in accordance with the DVB-T2 standard) only access the data transmitted in the T2 frames and that mobile receivers access the data transmitted in the T2 frames and, if needed, in addition the auxiliary codeword portions transmitted in the FEF frames. Stationary receivers may, of course, also make use of the auxiliary codeword portions transmitted in the FEF frames if needed, but will generally ignore these data.

In a preferred embodiment the encoder comprises a first encoding unit for encoding, according to said first code, the input data word into a basic codeword including said basic codeword portion and a second encoding unit for encoding, according to said second code, the input data word into an auxiliary codeword including said auxiliary codeword portion. Further, the data mapper is adapted for mapping the basic codeword onto a different portion of the transmitter output data stream, in particular onto a different frame, than the auxiliary codeword. Hence, according to this embodiment, an already existing encoder, i.e. the first encoding unit, can be used without any changes, and simply a second encoder, i.e. the second encoding unit, is added which is also provided with the input data words from which the auxiliary codewords are generated according to the second code, which itself may also have a lower code rate than the first code applied by the first encoding unit, but which can also have the same or a higher code rate.

While it is generally possible to map both the basic codewords and the auxiliary codewords completely onto the transmitter output data stream, it is in certain embodiments (in particular if the auxiliary codewords do not only contain auxiliary parities but also parts of or the complete input data word and/or basic parities of the basic codeword) sufficient for achieving the desired object that only the auxiliary parity portion is mapped onto the transmitter output data stream in addition to the basic codeword. The receiver then exploits, in case of need, the auxiliary parity portion as redundancy for decoding a received basic codeword that could not be decoded correctly.

The second encoding unit may further be adapted for encoding, according to said second code, the input data word into an auxiliary codeword including said basic codeword portion and said auxiliary codeword portion. Hence, the basic codeword portion is part of both the basic codeword and the auxiliary codeword, but is not further used in the auxiliary codeword, from which basically the auxiliary parity portion is embedded into the transmitter output data stream. Such an embodiment has the advantage that the first encoding unit can be the (conventional) encoder of a known receiver, e.g. a receiver in accordance with the DVB-T2 standard, which can generally be used without changes, and to which the second encoding unit is added according to the invention.

Alternatively, the second encoding unit may further be adapted for encoding, according to said second code, the input data word into an auxiliary codeword including only said auxiliary codeword portion. Such an encoding unit can be easily added to an existing encoder and performs only the minimum required steps for implementing the present invention on the transmitter side.

According to an alternative embodiment of the transmitter said encoder comprises a single encoding unit for encoding the input data word into a codeword including said basic codeword portion and said auxiliary codeword portion, and wherein said data mapper is adapted for mapping the basic codeword portion of said codeword onto a different portion of the transmitter output data stream, in particular onto a different frame, than the auxiliary codeword portion of said codeword. This embodiment requires less processing capacity since only a single encoding process is carried out for generating the codewords, which are thereafter split up into the basic codeword portion, on the one hand, and the auxiliary codeword portion on the other hand.

According to a further embodiment said encoder is adapted for encoding the input data words into codewords, a codeword comprising a basic codeword portion and an auxiliary codeword portion, said auxiliary codeword portion including at least two auxiliary codeword sub-portions, said basic codeword portion being provided for regular decoding and said at least two auxiliary codeword sub-portions being provided as incremental redundancies if regular decoding of the codeword by use of the basic codeword portion and less redundancies is erroneous. This embodiment provides the advantage that a receiver may decide how many additional incremental redundancies it requires for correct decoding if the regular decoding, i.e. the decoding by use of only the basic codeword portion, is erroneous. This is enabled by encoding the input data words such that two or more auxiliary codeword sub-portions (e.g. two or more groups of auxiliary parity symbols) are generated which can stepwise be used as such incremental redundancies, i.e. the auxiliary codeword sub-portions are generated such that not all sub-portions are required completely to perform a correct decoding of a received codeword, but one or more sub-portions thereof are also sufficient for a correct decoding. If more sub-portions are used, however, the code rate decreases and the probability of correct decoding increases.

Thus, each receiver may decide by itself (which decision may also change from time to time) how many additional incremental redundancies, i.e. how many of those at least two auxiliary codeword sub-portions shall be used for increasing the quality of decoding, if needed. Hence, if only a small sub-portion is additionally required, the other auxiliary codeword sub-portions may be ignored and may not even be received or at least demapped at all so that during time when these other auxiliary codeword sub-portions are transmitted the receiver can be switched into sleeping mode saving battery power and processing time.

This embodiment may be developed further such that the data mapper is adapted for mapping the at least two auxiliary codeword sub-portions of a codeword onto said transmitter output data stream such that the auxiliary codeword sub-portion used as first incremental redundancy is received by a receiver after reception of the respective basic codeword portion, but before further auxiliary codeword sub-portions. Such an embodiment ensures that a receiver can be switched into sleeping mode after having received sufficient auxiliary codeword sub-portions for enabling a correct decoding if, as proposed, the "most helpful" auxiliary codeword sub-portions (e.g. the largest auxiliary codeword sub-portions) are transmitted first. In another embodiment, the auxiliary codeword sub-portions may be mapped on the transmitter output data stream such that at first a small auxiliary codeword sub-portion is provided, and that thereafter auxiliary codeword sub-portions are provided with increasing size.

The sequence of the auxiliary codeword sub-portions can preferably be derived by the receiver from the sequence of the related basic codeword portions transmitted before so that no additional signalling is required for signalling the sequence of the auxiliary codeword sub-portions, e.g. the sequence of the auxiliary codeword sub-portions is identical to the then already known sequence of the related basic codeword portions.

Further, if in the frames (e.g. T2 frames) preceding a frame (e.g. FEF frame) containing auxiliary codeword sub-portions data from various transmitter input data streams (e.g. PLPs) are contained, the auxiliary codeword sub-portions may be grouped together such that, for instance, the largest or smallest sub-portions of all auxiliary codeword portions are transmitted first, and that thereafter further groups of sub-portions are transmitted.

Generally, the basic codeword portions and the auxiliary codeword portions are mapped onto the transmitter output data stream such that a basic codeword portion of a codeword is received by a receiver before the corresponding auxiliary codeword portion is received. Alternatively, however, the data mapper is adapted for mapping the basic codeword portions and the auxiliary codeword portions onto frames of a transmitter output data stream such that the auxiliary codeword portion of a codeword is received by a receiver before the corresponding basic codeword portion is received. The auxiliary codeword portions are thus buffered in the receiver in a respective buffer. If it is clear that the decoding of the corresponding codeword based on only the basic codeword portion was correct, the corresponding auxiliary codeword portion (if any) can be deleted from the buffer. Even if decoding based on the basic codeword portion is not correct, the corresponding auxiliary codeword portion is already available in the buffer. This provides the advantage that no or reduced waiting times (for waiting for the auxiliary parity portion, if the decoding was erroneous based on the basic codeword portion) occur, which is particularly important for reducing zapping times and for mobile receivers in case of sudden signal distortions. Hence, this embodiment also provides the advantage that no interruption of the service occurs (due to waiting for reception of auxiliary codeword portions) in case of (e.g. sudden) bad reception conditions of the basic codeword portions.

According to another embodiment the data input is adapted for receiving at least two transmitter input data streams segmented into input data words and the encoder is adapted for selectively encoding a transmitter input data stream only according to the first code, according to the second code or according to both codes. Hence, according to this embodiment the transmitter, for instance under control of the system operator of the broadcasting system, has the freedom to apply the idea of the present invention to provide incremental redundancies into the transmitter output data stream only for selected transmitter input data streams but must not generally apply it to all transmitter input data streams. For instance, a system operator may decide to apply the present invention for data streams that are provided for reception by both a stationary receiver and a mobile receiver, while other data streams that shall generally only be received by stationary receivers are not processed according to the present invention, i.e. no auxiliary codeword portions are generated and transmitted.

Generally, the transmitter output data stream can be transmitted by any kind of transmitter, for instance having only a single antenna or multiple antennas such as, for instance, used in MIMO (Multiple Input Multiple Output) systems. In a preferred embodiment, however, the data mapper is adapted for mapping the basic codeword portions of the codewords onto a first transmitter output data stream and for mapping the auxiliary codeword portions of the codewords onto a second transmitter output data stream, and the transmitter unit comprises a MIMO precoder for MIMO precoding said first and second output data streams, and at least two antennas including a first antenna and a second antenna for transmitting said MIMO precoded first and second transmitter output data streams. For instance, the MIMO precoder is adapted for spatial multiplexing such that a first antenna transmits said first transmitter output data stream and a second antenna transmits said second transmitter output data stream. Generally, however, any other embodiment of MIMO precoding (e.g. Alamouti precoding) can also be applied on the two transmitter output data streams before outputting them by two or more antennas of a MIMO system.

A receiver may also have only a single antenna or multiple antennas, wherein generally each antenna of the receiver receives signals from all antennas of the transmitter. It may, however, also be possible that generally the antennas of the receiver are tuned to receive the signals from the first antenna only (i.e. for receiving the first transmitter output data stream) and that only in case of decoding problems or errors the antennas are additionally tuned to receive the signals from the second antenna (for receiving the second transmitter output data stream). According to a further embodiment it may be possible that the receiver comprises one antenna that is tuned to the first antenna of the transmitter and that the receiver comprises a second antenna that is tuned to receive the signals from the second antenna of the transmitter, and that the signals received at the second antenna are only evaluated in case of need.

In a further embodiment the transmitter comprises a modulator for modulating the basic codeword portion of a codeword differently than the auxiliary codeword portion of the same codeword before or after mapping the codewords onto the frames of the transmitter output data stream. In general, the auxiliary codeword portion can be transmitted in any dimension, which is orthogonal to the basic codeword portion of a codeword, such as time, frequency, space (MIMO) or spreading code. The term "orthogonal" shall be understood as generally known in the art of coding and modulation, i.e. to provide separable data streams (which might even overlap before separation, such as OFDM subcarriers and their related partial spectra). This provides the advantage that the auxiliary codeword portion is additionally protected against disturbances by which the basic codeword portion may be disturbed. Another possibility is the application of a hierarchical modulation. In this case, the basic codeword portion addresses the more reliable bits of the modulation scheme, while the auxiliary codeword portion addresses the less reliable bits.

BRIEF DESCRIPTION OF DRAWINGS

These and other aspects of the present invention will be apparent from and explained in more detail below with reference to the embodiments described hereinafter. In the following drawings FIG. 5 shows the format of an FEC codeword in accordance with a DVB-T2 standard, FIG. 6 shows the format of a codeword in accordance with the present invention, FIGS. 23 to 26 show various code rate dependent address tables of the mini code used for generation of the parity bits according to the present invention, FIG. 30 shows a code rate dependent address table of a short code for illustrating the principle of the generation of the parity bits, FIG. 56 shows 16-QAM to 64-QAM hierarchical constellations with rotation on right.

FIG. 1 shows an example block diagram of a transmitter 10 in accordance with the present invention. Such a transmitter 10 can, for instance, be a Coded OFDM (COFDM) transmitter which may be used to transmit video, images and audio signals in accordance with the DVB-T2 (or an upcoming DVB-NGH) standard and in which the invention can be used. Said data to be transmitted by the transmitter 10 are generally provided as at least one transmitter input data stream I1, I2, . . . , In, which data streams are generally segmented into input data words. Said transmitter input data streams I1, I2, . . . , In may be one or more (e.g. MPEG-2) Transport Stream(s) and/or one or more Generic Stream(s), and the data may be carried therein in individual Physical Layer Pipes PLPs.

Figure 1:
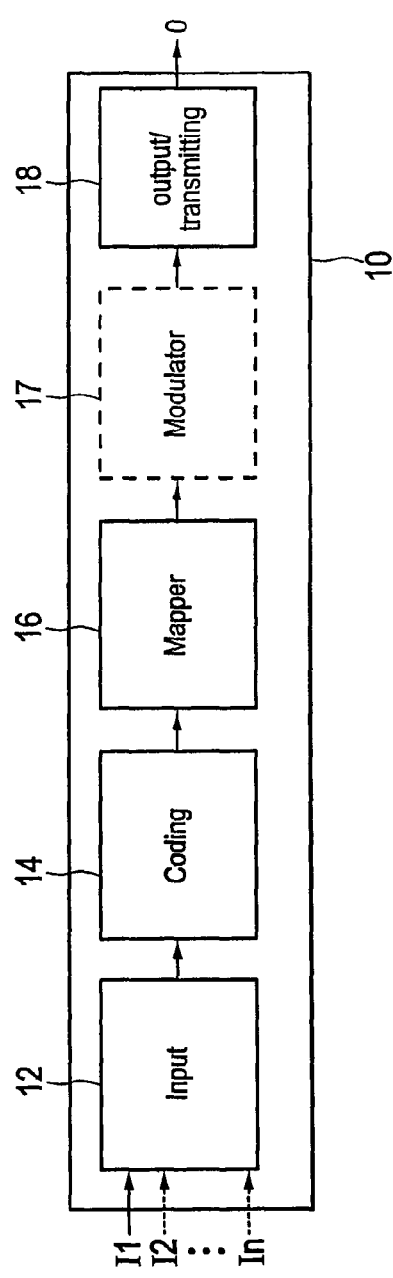
FIG. 1 shows a schematic block diagram of an embodiment of a transmitter in accordance with the present invention.

From the data input 12, in which some input processing may be performed on the transmitter input data streams I1, I2, . . . , In, such as CRC (Cyclic Redundancy Check) encoding, BB (BaseBand) header insertion, padding insertion and BB scrambling, the input data are provided to an encoder 14 in which the input data words of the transmitter input data streams I1, I2, . . . , In are encoded into codewords as will be explained in more detail below. From the encoder 14 the encoded data are then provided to a data mapper 16 for mapping the generated codewords onto frames of a transmitter output data stream O, which is then outputted by a transmitter unit 18. Generally (but not mandatorily), a modulator 17 is provided for modulating the data before output and transmission.

Figure 2:
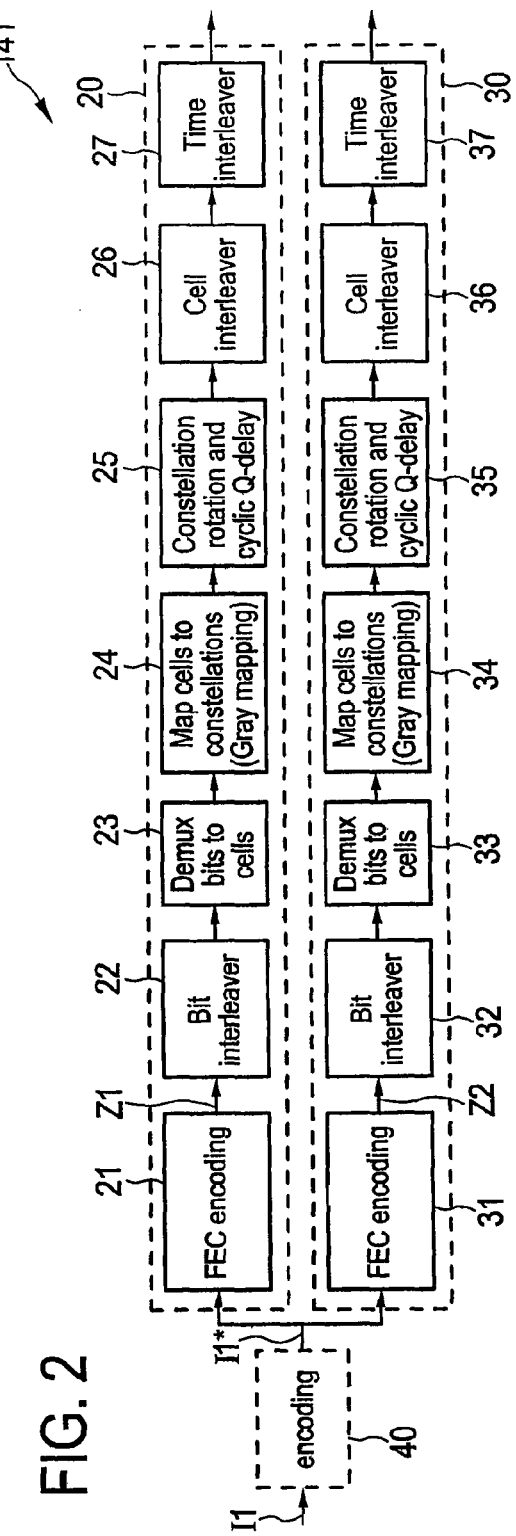
FIG. 2 shows a schematic block diagram of a first embodiment of an encoder used in the transmitter.

FIG. 2 depicts a first embodiment 141 of an encoder 14 according to the present invention. Said embodiment of the encoder 141 comprises two branches, i.e. two encoding units 20, 30 to which a transmitter input data stream I1, called Physical Layer Pipe (PLP) in the context of DVB, is fed. With the exception of the time interleavers 27, 37, the processing is preferably performed on a fixed frame level. An input frame of the transmitter input data stream I1, which shall be looked at in the following as an example, is denoted as a BBFrame in the context of DVB.

The first encoding unit 20, i.e. the upper branch, in this embodiment corresponds to the Bit Interleaved Coding and Modulation (BICM) chain as described in the DVB-T2 standard. Hence, it comprises an FEC encoding block 21 for subsequent LDPC encoding, a bit interleaver 22, a demultiplexer 23 for demultiplexing bits to cells, a constellation mapper 24 for mapping cells to constellations according to Gray mapping, a unit 25 for constellation rotation and cyclic Q-delay, a cell interleaver 26 and a time interleaver 27. The function and operation of these units 21 to 27 is generally known and, for instance, described in the DVB-T2 standard, which is herein incorporated by reference, so that no further explanations are provided here.

The second encoding unit 30, i.e. the lower branch, is also provided with the transmitter input data stream I1 in this embodiment. The FEC encoding block 31 is generally not identical to the FEC encoding block 21 of the first encoding unit 20. While said FEC encoding block 21 appends to the input data words parity bits of an LDPC codeword, said LDPC parity bits being generally referred to herein as basic parity portion of a first code, the FEC encoding block 31 generates additional redundancy to increase the robustness of the overall channel code, said overall channel code referring to the redundancy from both FEC encoding blocks 21 and FEC encoding blocks 31. In other words, the FEC encoding block 31 generates auxiliary parity bits that can, in addition to the basic parity bits, be used by a receiver to decode a received codeword as will be explained in more detail below.

The consecutive blocks 32 to 37 can generally be identical to the blocks 22 to 27 and can thus be adopted from the DVB-T2 standard, but can also be adjusted according to the specific circumstances and needs of the second encoding unit 30. The application of a time interleaver 37 is optional since applying time interleaving within just one frame of auxiliary parity bits is already covered within the cell interleaver 36. However, applying time interleaving over more than one auxiliary parity data frame allows for more time diversity.

In this embodiment, the input of the two FEC encoding blocks 21, 31 is identical, in particular an input data stream I1*, which substantially corresponds to the transmitter input data stream, but wherein to the input data words (BBFrames in the context of DVB) parity bits of a BCH codeword have been added by a BCH encoder 40 (as is generally known in the art of DVB). Hence, the input data stream I1 has already been encoded by a BCH code, before further encoding is performed in the FEC encoders 21 and 31. It should, however, be noted that the encoder 40 is generally not an essential element of the present invention. In certain application the encoder 40 can be completely omitted, can be replaced by a different encoder or this initial encoding can be part of the encoding performed in the encoders 21 and 31.

Further, it shall be noted that hereinafter it is generally referred to parity "bits" and input data "bits". The same idea is, however, also applicable using parity "bytes" and input data "bytes" or, generally, parity "symbols" and input data "symbols".

The outputs of the first and second encoding units 20, 30 are fed forward to a data mapper 16, generally including a frame builder, and, optionally, an OFDM generator. The data mapper 16 and the OFDM generator may generally operate according to the DVB-T2 standard which particularly shows embodiments of these blocks. For mapping the outputs of the first and second encoding units 20, 30, however, various embodiments exist which will also be explained below in more detail.

Figure 3A:
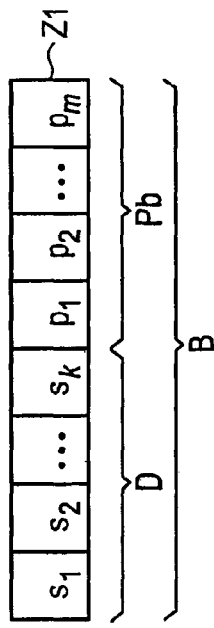
FIG. 3 shows the arrangement of a data portion, a basic parity portion and an auxiliary parity portion according to the present invention.

By way of FIG. 3 the encoding performed in the FEC encoding blocks 21 and 31 shall be explained in more detail. FIG. 3A shows a first codeword Z1 which is the output of the FEC encoding block 21. Said first codeword Z1 comprises a data portion D, which generally corresponds to the input data word of the FEC encoding block 21 and which, according to this embodiment, comprises k input data bits $s_1, s_2, \ldots, s_k$, and a basic parity portion Pb comprising, in this embodiment, m parity bits $p_1, p_2, \ldots, p_m$. This first codeword Z1 generally corresponds, in the context of DVB-T2, to the LDPC codeword belonging to a code $C_1$ with code rate $R_1=k/(k+m)$, where k is the amount of the systematic bits (input data bits) s and m is the amount of the basic parity bits p. By use of these codewords a receiver, in particular a stationary receiver and/or a mobile receiver that is not affected by too many disturbances, is able to decode the input data encoded therein.

Figure 3B:
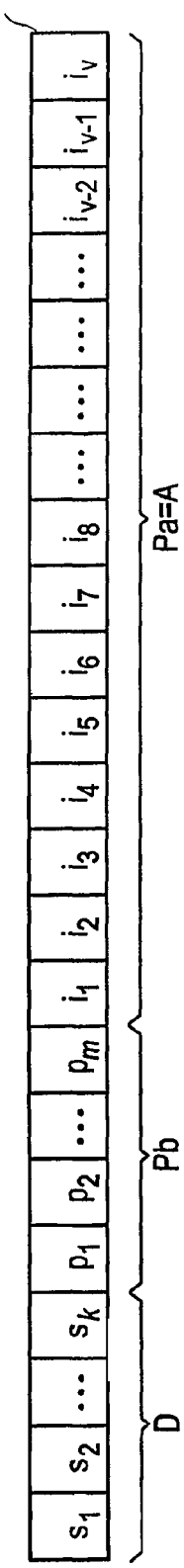

The second codeword Z2 shown in FIG. 3B belongs to a second code $C_2$ of a lower code rate $R_2=k/(k+m+v)<R_1$. Said second codeword Z2 comprises, in addition to the data portion D and the basic parity portion Pb, an auxiliary parity portion Pa of v auxiliary parity bits $i_1, i_2, \ldots, i_v$. Said auxiliary parity portion Pa may be used by a receiver, for instance in case of transmissions errors, decoding errors and/or an insufficient quality of the decoding, as incremental redundancy in addition to the codeword Z1 for decoding. Hence, if the first codeword Z1 cannot be decoded correctly at the receiver, some or all of the auxiliary parity bits $i_1, i_2, \ldots, i_v$ may be used for decoding, in addition to the first codeword Z1, to increase the probability of correct and error-free (or at least an increased quality of) decoding. For this purpose at least the auxiliary parity portion Pa will also be mapped onto the transmitter output data stream for eventual reception and use by the receiver. Said mapping will be explained below in more detail.

Hence, the combination of the codeword Z1 and the auxiliary parity portion Pa (of the second codeword Z2) can also be regarded as a "total" codeword of a "total" code having a lower code rate than the first code of the codeword Z1, i.e. the codeword Z1 can be regarded as a basic codeword portion B of this "total" codeword and the auxiliary parity portion Pa can be regarded as a auxiliary parity portion A of this "total" codeword. Here in this embodiment shown in FIG. 3 this "total" codeword is identical to the codeword Z2. This does, however, not hold for all embodiments as will be shown below.

Figure 4:
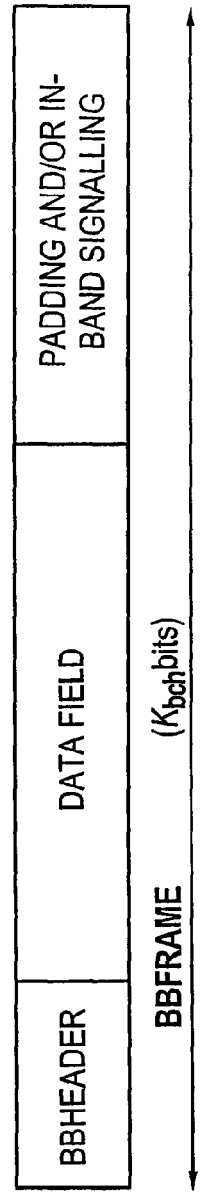
FIG. 4 shows the format of a BBFrame according to the DVB-T2 standard.

In the context of DVB-T2 the transmitter input data stream to the encoder 14 is generally segmented into frames referred to as BBFrames comprising $K_{bch}$ bits as exemplarily depicted in FIG. 4. A first codeword Z1 (in this context) generated therefrom by the BCH encoder 40 and the first encoding block 21, i.e. in accordance with the encoding as performed according to the DVB-T2 standard, is schematically depicted in FIG. 5. This codeword is a standard FEC codeword comprising the (systematic) input data portion, which itself consists of $K_{bch}$ bits, followed by $N_{bch}-K_{bch}$ parity bits of the BCH encoder, followed by $N_{ldpc}-K_{ldpc}$ parity bits of the LDPC encoder. In total, this codeword comprises $N_{ldpc}$ bits. Hence, the basic LDPC code has a code rate of $R_c=K_{ldpc}/N_{ldpc}$. Referring to the above explanations provided with reference to FIGS. 3 and 4 $K_{ldpc}$ corresponds to k (i.e. the portions BBFRAME and BCHFEC are regarded as the input data word D) and $N_{ldpc}$ corresponds to k+m (i.e. the portion LDPCFEC is regarded as the basic parity portion Pb).

The second encoding block 31 computes auxiliary parity bits for use as incremental redundancy, based on its input, which generally is the same as the input of the FEC encoding block 21. In general, these are v auxiliary parity bits which can be partitioned into q sub-portions (it should be noted that in the main aspect of the present invention only a single sub-portion is used). The k-th sub-portion is of length $v^{(k)}$. Thus, it holds $$\sum_{k=1}^{q} v^{(k)} = v.$$

If the bits from the first x sub-portions are then appended to the first basic codeword (Z1) generated by the first encoding unit 20 and generally received and evaluated by a receiver, an auxiliary codeword (Z3*) of the "total" code is generated which stems from an encoder with the overall code rate $R_c$* of $$R_c^* = \frac{k}{k + \sum_{k=1}^{x} v^{(k)}} < R_c$$

which is smaller than $R_c$, which means that this overall code is more powerful.

FIG. 6 shows such an embodiment of a codeword Z2 (in the context of DVT-T2) generated by the second FEC encoding block 31 which, according to this embodiment, also comprises BCH and LDPC encoding, but additionally generates v auxiliary parity bits for use as incremental redundancy at the receiver in case of need.

Figure 19:
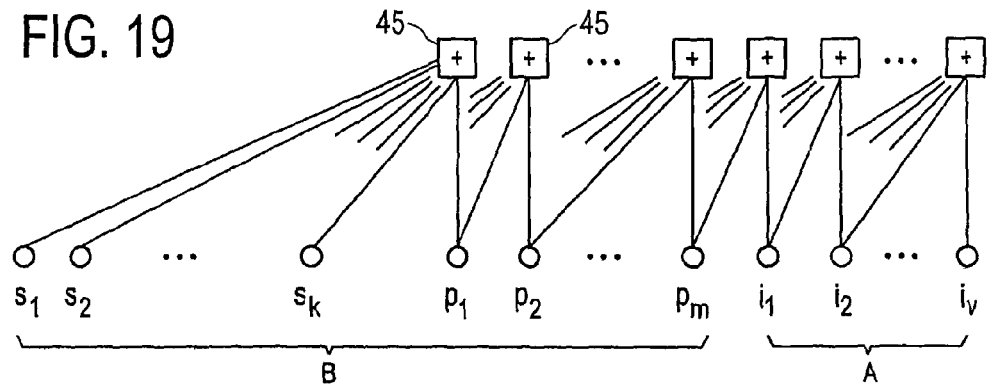
FIG. 19 shows a diagram illustrating the generation of the bits of a codeword according to the present invention.

The generation of additional LDPC parity bits, e.g. of a known LDPC code, and their use as incremental redundancy is generally known, e.g. from Kim J. et al. "Design of Rate-Compatible Irregular LDPC Codes for Incremental Redundancy Hybrid ARQ Systems", ISIT 2006, Seattle, USA, Jul. 9-14, 2006. A diagram illustrating such an "extended" code and its generation is shown in FIG. 19. Therein, it is shown how each of the bits of the basic codeword portion B and of the auxiliary parity portion A are generated from other, in particular all "previous" bits in the codeword by use of modulo-2 units 45. This way of generating the codeword ensures that a decoder can decode a codeword by use of only the basic codeword portion B or by additional use of one or more of the auxiliary parity bits of the auxiliary parity portion A. Below, particular ways of generating the LDPC parity bits according to preferred embodiments of the present invention will be explained in detail.

Next, an embodiment of the data mapper 16 shall be explained. Generally, it is sufficient if the first codeword (generally, the basic codeword portion B) generated by the first encoding unit 20 and the auxiliary parity portion (generally, the auxiliary codeword portion A) generated by the second encoding unit 30 for the same input data word are mapped in any way onto the frames of the transmitter output data stream O. In other words, using the terminology from FIG. 3, for each input data word the corresponding data portion D, the basic parity portion Pb and the auxiliary parity portion Pa are mapped onto the transmitter output data stream O according to the present invention. Preferably, however, the data mapper 16 is adapted such that the data portion D and the basic parity portion Pb are mapped onto a different portion, for instance onto a different frame, than the corresponding auxiliary parity portion Pa of the same codeword. This provides the advantage that regular channel disturbances do generally not affect both the data portion D and the basic parity portion Pb on the one hand and the auxiliary parity portion Pa on the other hand.

Figure 7:
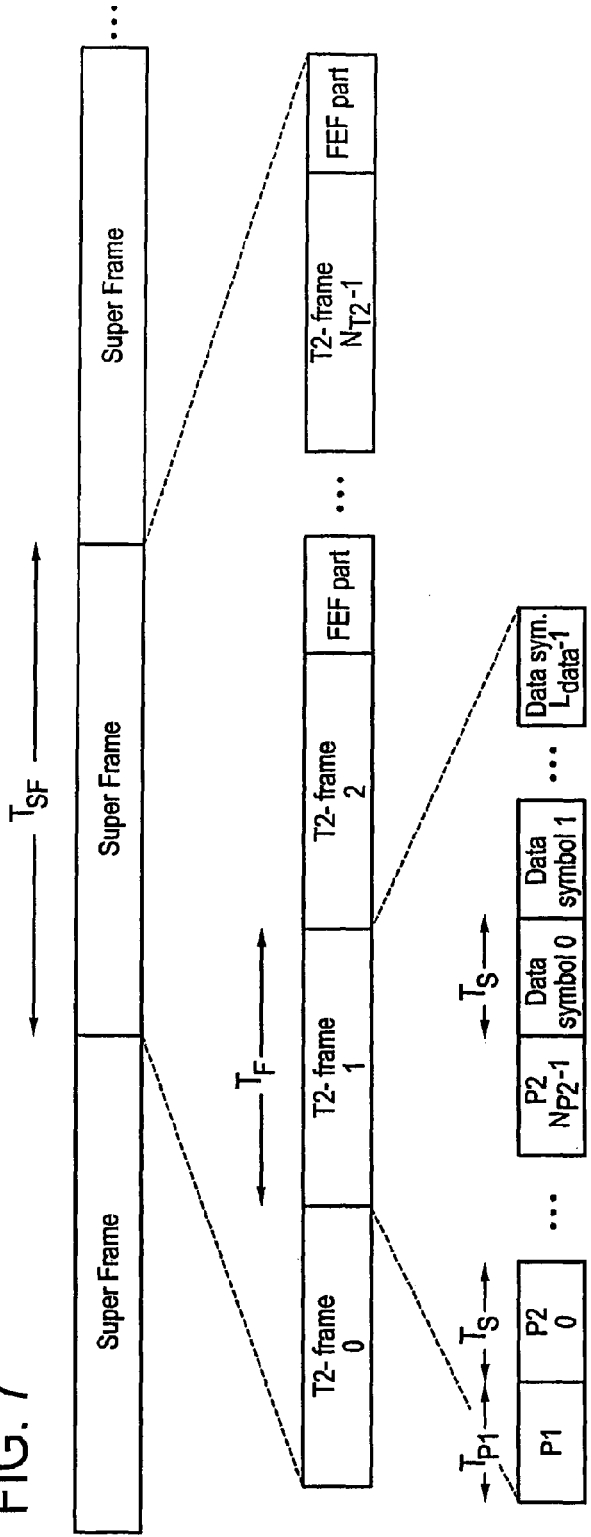
FIG. 7 shows a diagram illustrating the DVB-T2 framing structure.
Figure 8:
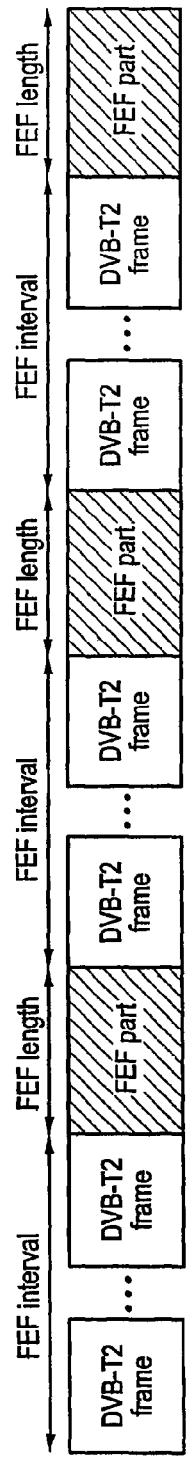
FIG. 8 shows a diagram illustrating the arrangement of T2 frames and FEF frames within a superframe in accordance with the DVB-T2 standard.

A particular embodiment for such a mapping structure shall be illustrated with reference to FIGS. 7 and 8. FIG. 7 illustrates the framing structure as applied according to the DVB-T2 standard. In particular, according to DVB-T2, a superframe structure is applied where each superframe is subdivided into a multitude of T2 frames. After each predetermined number of consecutive T2 frames an FEF part (Future Extension Frame part) is inserted for future use. This is also schematically illustrated in the data stream structure shown in FIG. 8. When applying such a framing structure in the transmitter 10 according to the present invention, the data mapper 16 is adapted in one embodiment such that the data portion and the basic parity portion of a codeword, which can also be regarded as the basic codeword portion B and, in this embodiment, the basic codeword Z1 (see FIG. 3A), are mapped onto the T2 frames and that the auxiliary parity portion Pa (generally the auxiliary codeword portion A) of the same codeword (taken from the auxiliary codeword Z2) is mapped onto the FEF part, preferably the FEF part following next to the T2 frame(s) into which the corresponding data portion D and basic parity portion Pb are mapped.

Such a mapping provides the advantage that a conventional receiver in accordance with the DVB-T2 standard simply ignores the data transmitted in the FEF parts and only evaluates the data transmitted in the T2 frames as usual. Mobile receivers, however, for instance in accordance with the upcoming DVB-NGH standard, whose decoding and reproduction capability may often be affected by disturbances, may also access the T2 frames and decode, in a first step, the codewords embedded therein. In addition, however, particularly in case of disturbances and decoding errors resulting therefrom, such mobile receivers access the FEF parts and use parts or all of the auxiliary parity data contained therein for decoding, in a second step, the codeword received in the corresponding T2 frame again, as will be explained in more detail below.

According to still another embodiment of the data mapper 16 all data required for decoding by a mobile receiver are transmitted in the FEF parts, i.e. a complete codeword comprising the data portion D, the basic parity portion Pb and the auxiliary parity portion Pa is mapped onto the FEF part. Such mobile receivers thus ignore the data contained in the T2 frames which are only accessed by stationary receivers, in particular receivers in accordance with the DVB-T2 standard.

In such a situation, however, the auxiliary parity portion Pa is preferably modulated in a different way than the data portion D and the basic parity portion Pb. Preferably, an auxiliary modulation code is applied for modulating the auxiliary parity portions, said auxiliary modulation code being orthogonal to a basic modulation code that is used for modulating the data portions and the basic parity portions, generally after the data mapping. For instance, an orthogonal time, frequency, space (MIMO) or a spreading code may be applied. Another possibility would be the application of hierarchical modulation.

Of course, there may be further embodiments of the data mapper 16. The framing structure applied by the transmitter 10 may also be completely different than the framing structure used according to the DVB-T2 standard as shown in FIGS. 7 and 8. Generally, any framing structure, e.g. a newly created framing structure, may be applied as long as the receiver is able to detect or know in advance where to find the data portions and the various parity portions. Further, in embodiments of the invention BCH and LDPC encoding is not required, but other codes (e.g. other FEC codes) can be applied.

Figure 9:
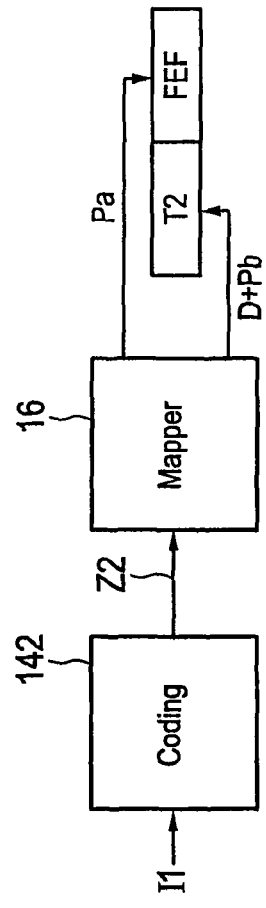
FIG. 9 shows a schematic block diagram of a second embodiment of an encoder.

A simplified block diagram of another embodiment of an encoder 142 and a data mapper 16 is shown in FIG. 9. According to this embodiment the encoder 142 comprises a single encoding unit by which the input data words are encoded, i.e. by which both the basic parity portions Pb and the auxiliary parity portions Pa are generated. In other words, in said single encoding unit of the encoder 142 the complete codeword Z2 (see FIG. 3B) is generated. These codewords Z2 are provided to the data mapper 16 which splits off the auxiliary parity portion Pa and maps it onto a different portion of the transmitter output data stream than the data portion D and the basic parity portion Pb. For the data mapper 16 generally the same embodiments exist as have been explained above.

As shown in FIG. 1 the data input 12 may be adapted for not only receiving a single transmitter input data stream, but may generally receive a number n of transmitter input data streams, for instance a number n of physical layer pipes. The encoder 14 may, in such a case, however be adapted to select if a transmitter input data stream is encoded as usual, i.e. according to the basic code and without the generation of any auxiliary parity data, or if another code having a lower code rate shall be applied and auxiliary parity data for use as incremental redundancies by the receiver shall be generated. It may also be possible that various codes with different (e.g. decreasing) code rates may be available for application by the encoder so that even more than two possibilities exist. Which code and which code rate to apply may be prescribed, e.g. by the operator of the transmitter or the owner of the broadcast channel. But the choice of the code may also depend on the kind of data to be transmitted. For instance, audio data may be encoded with a code having a higher code rate than video data so that only for video data such auxiliary parity data are generated or vice versa. As another example, any decoding errors may be acceptable when watching news, but may not be acceptable when watching a movie for which auxiliary parity data may thus be generated and transmitted.

Figure 10:
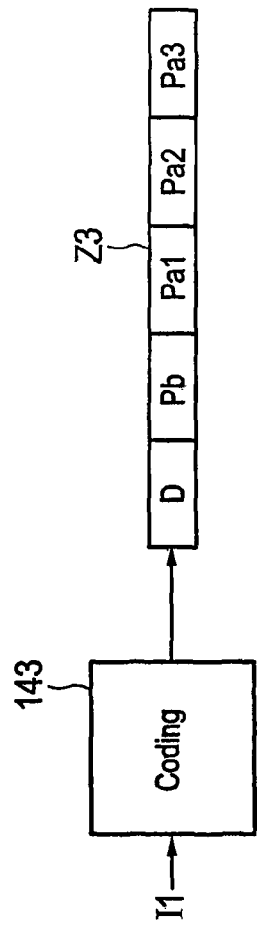
FIG. 10 shows a schematic block diagram of a third embodiment of an encoder.

A still further embodiment of an encoder 143 is illustrated in FIG. 10. Said encoder 143 is adapted such that it generates two or more auxiliary parity sub-portions Pa1, Pa2, Pa3 in addition to the data portion D and the basic parity portion Pb thus forming a codeword Z3. Hence, comparing the codewords Z2 and Z3, the auxiliary parity sub-portions Pa1, Pa2, Pa3 of the codeword Z3 can be seen as segments of the auxiliary parity portion Pa of the codeword Z2, having in total the identical content, although generally the auxiliary parity sub-portions Pa2 and Pa3 can also be additional auxiliary parity portions in addition to the auxiliary parity portion Pa1 that (alone) corresponds to the auxiliary parity portion Pa.

These auxiliary parity sub-portions Pa1, Pa2, Pa3 are generated such that they can be stepwise used by a decoder as incremental redundancies. In other words, generally it is possible to decode the codeword by use of only the data portion D and the basic parity portion Pb (i.e. the basic codeword portion). If such decoding fails, the first auxiliary parity sub-portion Pa1 (i.e. a part of the auxiliary codeword portion) may be used in addition for decoding. If this again fails (or provides insufficient quality) the second auxiliary parity sub-portion Pa2 may be added and so on.

All the auxiliary parity sub-portions Pa1, Pa2, Pa3 may be grouped together and mapped onto a single portion of the transmitter output data stream. However, it is also possible and advantageous to distribute the various auxiliary parity sub-portions of a single codeword Z3, preferably such that the first auxiliary parity sub-portion Pa1 is received before the second auxiliary parity sub-portion Pa2, which again is received before the third auxiliary parity sub-portion Pa3. This provides the advantage that a receiver which, after using the first auxiliary parity sub-portion, can decode the codeword with sufficient quality, can fall into sleeping mode for the time period during which other auxiliary parity sub-portions are transmitted that are no longer needed and/or from other data streams that shall currently not be decoded. This provides some power saving and less calculation efforts at the receiver.

Figure 11:
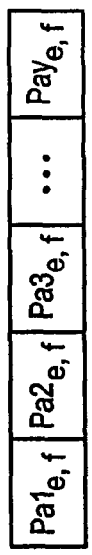
FIG. 11 illustrates the arrangement of auxiliary parity portions according to the present invention.

An embodiment of the arrangement of auxiliary parity sub-portions of various input frames (BBFrames, generally referred to as input data words) is shown in FIG. 11. The input frames are enumerated in this embodiment by two indices (e, f), where the index e corresponds to the PLP_ID (PLP number, also referred to here as the number of the transmitter input data stream), and where f relates to the input frame (input data word). The index e is part of a set $S_2$, i.e., the set of PLPs that are protected by additional incremental redundancy. Assuming that n different PLPs are transmitted, i.e. $e \in S_1 = \{1, \ldots, n\}$, $S_2$ is a subset of $S_1$ of PLPs that are protected by additional incremental redundancy according to the present invention since, as mentioned above, not all PLPs need necessarily use this idea.

Thus, the f-th input frame of the e-th PLP is denoted as $I_{e,f}$. The index $f \in \{1, \ldots, F_e\}$, where $F_e$ is the number of input frames of the e-th PLP, which precede the FEF, starting from the end of the previous FEF. Hence, in one embodiment, the auxiliary parity sub-portions $Pa1_{e,f}$ up to $Pay_{e,f}$ may be mapped onto an FEF frame in the sequence as shown in FIG. 11 and may belong to codewords mapped onto preceding T2 frames.

Figures 12, 13:
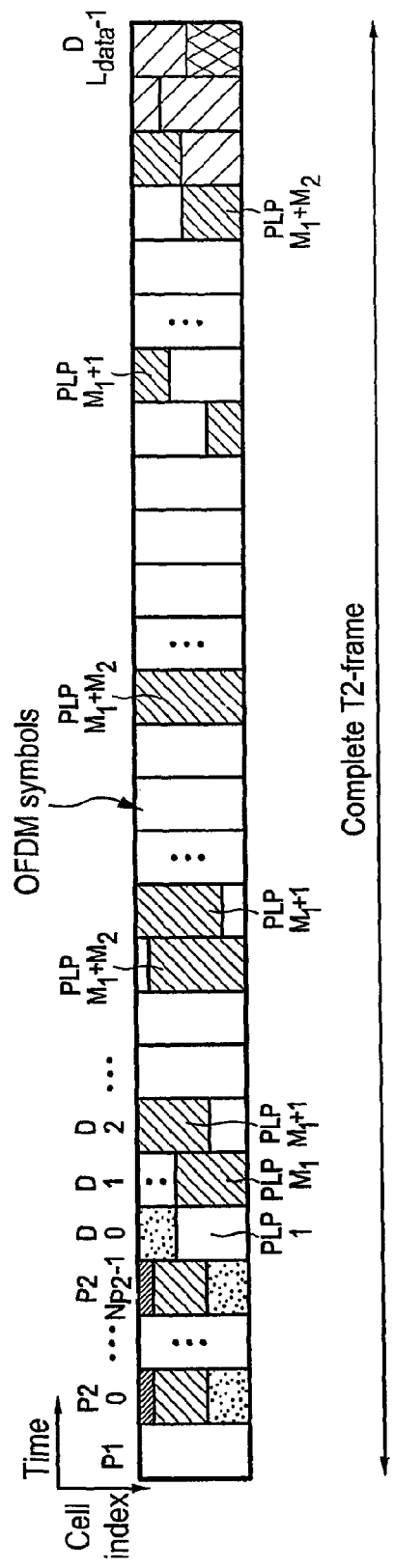
FIG. 12 shows the mapping of data PLPs onto a T2 frame according to the DVB-T2 standard.
FIG. 13 shows the mapping of segmented auxiliary parity portions onto an FEF frame.

FIG. 12 illustrates more details of the arrangement of data within a T2 frame in accordance with the DVB-T2 standard. The PLPs in a T2 frame underlie a certain order. After the preambles P1, P2 and after common PLPs the PLPs of type 1 are transmitted without subslicing, then PLPs of type 2 are transmitted with subslicing. Both type 1 and type 2 PLPs have a fixed order which is signalled in the P2 preamble. This is also illustrated and explained in detail in the DVB-T2 standard, which explanation is herein incorporated by reference.

FIG. 13 shows a proposal for arranging the auxiliary parity sub-portions in an FEF frame that is made similar to the arrangement of the PLPs in the T2 frame. In this embodiment the FEF also starts with a P1 preamble, i.e. an OFDM symbol, which is made to be used for (time, frequency) synchronization purposes, for channel estimation and for signalling the most important transmission parameters. The subsequent (one or more) P2 preamble(s) contain(s) more detailed information about the content of the FEF. Using the notation explained with reference to FIG. 11 and assuming that there are two PLPs of three input frames each, the arrangement of the auxiliary parity sub-portions in the FEF in this embodiment is such that the order of the partitioned auxiliary parity sub-portions is derived from the slicing/ordering of the T2 frames, even if not all PLPs from T2 frames have auxiliary parity sub-portions to be mapped onto the FEFs. Thus, the order of the auxiliary parity sub-portions does not have to be signalled explicitly.

The auxiliary parity portions are sorted in the time domain, in particular such that the first portion $Pa1_{e,f}$ for instance the more robust portion, of all PLPs having auxiliary parity portions is inserted at the beginning of the FEF, i.e. right after the preambles P1, P2. The second portion Pa2 of all PLPs with auxiliary parity portions follows afterwards etc. As mentioned above, if basic codewords are not decodable the related first portion Pa1 of the FEF is evaluated. If the receiver can now correctly decode the overall codeword without error it falls into sleeping mode to save power. Otherwise it will additionally include the second auxiliary parity portion Pa2 etc.

It shall be noted also that the FEFs may contain signalling information, e.g. in the preamble or in a ModCod header, regarding the link of the auxiliary parity portions used in the FEFs and the PLPs mapped onto the T2 frames (which itself remain unchanged in this embodiment). Further, other data may be contained in the FEFs as well, for instance low-bitrate information for use by a mobile receiver.

Figure 14:
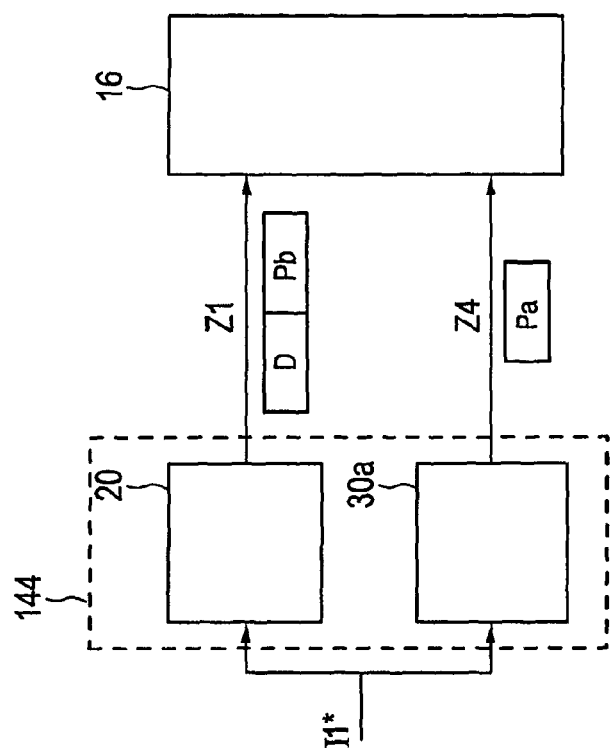
FIG. 14 shows a schematic block diagram of a fourth embodiment of an encoder.

FIG. 14 shows still another embodiment 144 of an encoder according to the present invention. Similar to the embodiment shown in FIG. 2 the encoder 144 comprises a first encoding unit 20 for encoding, according to said first code, the input data word into said basic codeword Z1 as explained above. Further, a second encoding unit 30*a* is provided for encoding, according to said second code, the input data word into an auxiliary codeword portion (which can be regarded as an auxiliary codeword Z4) comprising only said auxiliary parity portion Pa. Hence, the second encoding unit 30a only generates the data ultimately necessary for improving decoding at the decoder, if required, but does not generate other codeword portions that are already generated by the first encoding unit 20.

Figure 15:
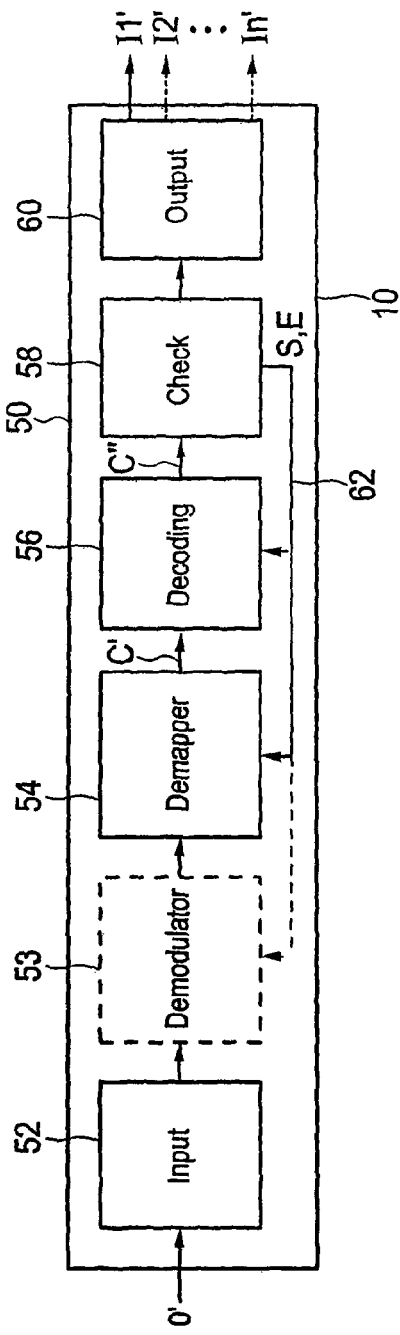
FIG. 15 shows a schematic block diagram of a receiver.

FIG. 15 shows a schematic block diagram of a receiver 50 for use in a broadcasting system comprising a transmitter 10 as illustrated above. The receiver 50 is particularly adapted for making use of the auxiliary parity portion (generally, the auxiliary codeword portion) as incremental redundancy in case of erroneous or low quality decoding.

The receiver 50 comprises a data input 52 for receiving a receiver input data stream O' which generally corresponds to a transmitter output data stream O that has been transmitted over a broadcast channel of the broadcasting system by a transmitter and which may thus be affected by disturbances that may appear in such a broadcasting system, particularly in case of using mobile receivers which are the main application of the present invention on the receiver side.

Optionally, a demodulator 53 is provided that is interrelated with the (optional) modulator 17 of the transmitter 10 for demodulating the received receiver data input stream O'. A demapper 54 demaps the (optionally demodulated) receiver data input stream O', particularly at least the data portions and the basic parity portions (i.e. the basic codeword portions) of the codewords mapped into the receiver data input stream O' as will be explained below in more detail. A decoder 56 then decodes these codewords by use of the basic codeword portions according to the same code as applied by the encoder 14 of the transmitter 10. As particularly in case of mobile receivers severe disturbances, for instance due to the high velocity of the moving receiver, might appear a check unit 58 is provided in the receiver 50 by which it is checked if decoding has been made correctly and/or with sufficient quality and/or below a tolerable error level as will be explained below. If the decoding is made without errors or with sufficient quality the decoded data are provided to an output unit 60. The output thereof might be one or more receiver output data streams I1' I2', . . . , In' which should as much as possible correspond to the transmitter input data streams I1, I2, . . . , In.

If, however, the check by check unit 58 shows that a decoding is erroneous or that the decoded data have an insufficient quality and would, for instance, result in a noisy receiver output signal (e.g. insufficient picture quality of a movie), a feedback loop 62 is provided from the check unit 58 to the demapper 54 and/or the decoder 56 in order to make use of the auxiliary parity portion (generally, the auxiliary codeword portion) (completely or in part) for improving the quality of decoding. Hence, in such a situation the demapper 54 then also demaps the auxiliary parity portion (completely or in part) from the (optionally demodulated) receiver input data stream O'. By use of this additional redundancy the decoder 56 will then again decode the received codewords, but now applies a code having a lower code rate which thus has a higher robustness against the disturbances. Hence, there is a high likelihood that the decoding quality will be better than before. In some embodiments, a feedback loop 62 is also provided from the check unit 58 to the demodulator 53, e.g. if auxiliary parity portions are required by the decoder 56 from another receiver input data stream, e.g. from data received at a different antenna in a MIMO receiver or from another channel (e.g. using another frequency).

Thereafter, again a check can be made by the check unit 58 if the decoding has now been made error-free or with sufficient quality, and, if not, a still further part of the auxiliary parity portion can be used in another iteration of demapping and decoding. If, on the other hand, the complete auxiliary parity portion of a codeword has already been completely used for decoding the check can also be omitted and the decoded data can be outputted directly.

Figure 16:
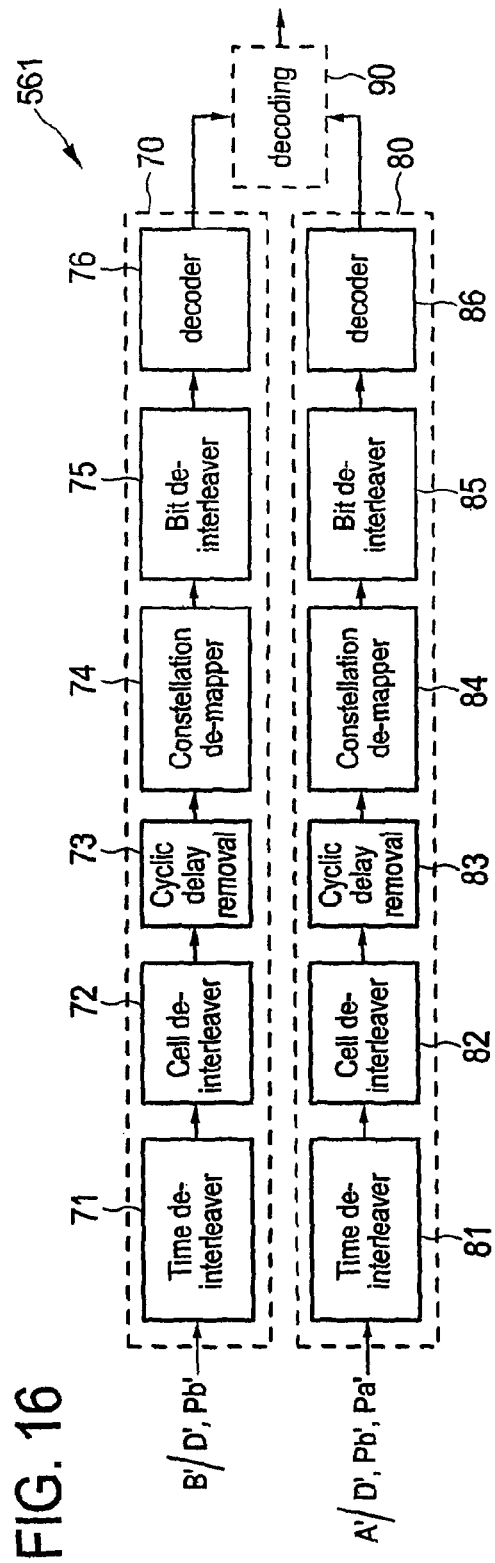
FIG. 16 shows a schematic block diagram of a first embodiment of a decoder used in the receiver.

Similarly as for the encoder 14 of the transmitter 10 there exist various embodiments of the decoder 56 of the receiver 50. A first embodiment 561 of the decoder 56 is schematically depicted in FIG. 16. According to this embodiment the decoder 561 comprises a first decoding unit 70 and a second decoding unit 80, similarly as the embodiment of the encoder 141 depicted in FIG. 2. Further, an additional decoder 90 (e.g. a BCH decoder) is provided for BCH decoding the output of the decoder 561, if the corresponding transmitter used in the broadcasting system applies a step of BCH encoding. The first decoding unit 70 generally corresponds to the decoding unit as used in receivers in accordance with the DVB-T2 standard. It comprises a time deinterleaver 71, a cell deinterleaver 72, a cyclic delay remover 73, a constellation demapper 74, a bit deinterleaver 75 and a first LDPC decoding block 76. Such a decoder is, for instance, explained in more detail in the DVB document A133, February 2009 "Implementation Guidelines for a Second Generation Digital Terrestrial Television Broadcasting System (DVB-T2)" which is herein incorporated by reference. This first decoding unit 70 thus is provided with the data portions D' and the basic parity portions Pb' (generally the basic codeword portion B') as demapped by the demapper 54 from a received receiver input data stream O' and decodes, as usual, these codewords.

In addition, in this embodiment of the decoder 561a second decoding unit 80 is provided which basically comprises the same elements, in particular a time deinterleaver 81, a cell deinterleaver 82, a cyclic delay remover 83, a constellation demapper 84, a bit deinterleaver 85 and a second decoding block 86, whose function is identical to the function of the respective elements of the first decoding unit 70. However, the parameters of those blocks may differ, if different parameters are applied in the encoder, e.g. in the second encoding unit 30 (see FIG. 2). The second decoding unit 80 is, however, provided, in addition to the data portions D' and the basic parity portions Pb', with the additional auxiliary parity portion Pa' (generally the auxiliary codeword portion A') (completely or in part) for decoding the codewords with high reliability using said auxiliary parity portion Pa' as redundancy information. Hence, the second decoding unit 80 only becomes active in case of need, i.e. if "instructed" by the check unit 58 through feedback loop 62. Alternatively, the second decoding unit 80 is provided with only the auxiliary codeword portion A'.

Figure 17:
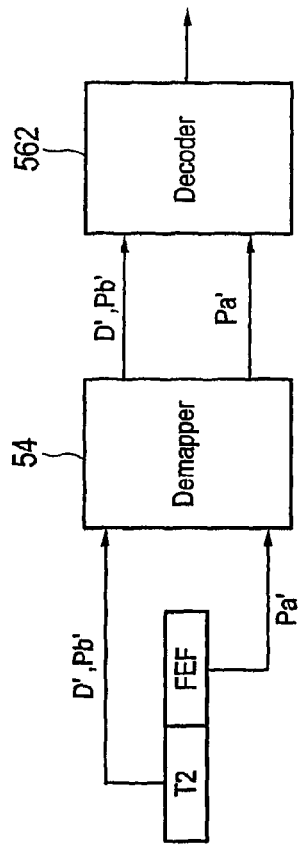
FIG. 17 shows a schematic block diagram of a second embodiment of a decoder.

An alternative embodiment 562 of a decoder is depicted in FIG. 17. According to this embodiment the demapper 54 accesses the T2 frames of a received receiver data input stream O' to demap the data portions D' and the basic parity portions Pb' therefrom and accesses FEF frames to demap the auxiliary parity portions Pa' therefrom, i.e. the demapper 54 is adapted to interrelate with the mapper 16 as illustrated in FIG. 9. The decoder 562, however, only comprises a single decoding unit which is both able to decode the codewords according to the first code (with a higher code rate) based on only the data portion D' and the basic parity portion Pb' and according to the second code (with a lower code rate) using as redundancy information (part of or all of) the auxiliary parity portion Pa', if needed.

A standard LDPC decoder as, for instance, provided in a DVB-T2, DVB-S2, combined DVB-T2/S2, DVB-C2 or DVB-NGH receiver accepts at its input a (channel disturbed) codeword, as well as signalling information about the code rate and the length of the codewords (either 16200 or 64800 bits). Based on the signalling information, it applies an appropriate decoding algorithm (typically so called iterative message passing) based on that particular code realization and outputs an estimate of the data portion.

The same applies for an extended LDPC decoder included in the decoder 56, in particular the extended LDPC decoder 76 and 86, which receive in addition auxiliary codeword portion, in particular auxiliary parity bits. The number of auxiliary bits is generally signalled in addition to the applied code rate and the length of the basic codeword portion to the decoder. Given these parameters, the decoder 56 applies an appropriate decoding algorithm based on this extended (or "total") code.

As mentioned above, in a preferred embodiment the demapper and the decoder are preferably adapted to stepwise add more parts ("sub-portion") of an auxiliary parity portion to improve the decoding. Preferably, once a sufficient decoding quality has been reached the demapper and the decoder are adapted for going into a sleeping mode while other parts of the (segmented; see for instance FIG. 13) auxiliary sub-portions are provided in a received receiver input data stream, i.e. those additional segments of an auxiliary parity sub-portion are preferably not demapped and used for decoding. This particularly saves power in the receiver which is especially advantageous in case of mobile receivers using a battery as power source.

A generic LDPC decoder has as input a received codeword (with or without additional parity bits) as well as signalling information about the code rate and the codeword length. The latter is in addition implicitly updated by the feedback loop 62, which signals, if (and how many) auxiliary parity bits are appended. In contrast to such a generic decoder, the LDPC decoder in the decoder 56 according to the present invention outputs its estimates on each code bit of the (received) codeword C', i.e. an estimate C" on the codeword C'. Preferably, the bitwise estimates are expressed in terms of log likelihood ratios (LLRs), whose magnitude reflects the reliability of the estimate.

If the check unit 58 decides that the estimate C" is probably the transmitted codeword C, it outputs the (hard decided) estimates of the data portion D' and sets a flag S to 1, which corresponds to a decoding success. Otherwise, S=0, which is signalled within the feedback loop 62 to initiate the suffixing of auxiliary parity bits (if still available). The indicator E from the check unit 58 is optional and gives an estimate of how many additional auxiliary parity sub-portions are still needed. In case of E>1, the LDPC decoder 56 does not even have to try to decode the next larger codeword, but has to wait for E additional auxiliary parity sub-portions to restart decoding.

The criteria for decoding success (S=1) are:

a) Within a maximum number of allowed decoder processing steps (typically a maximum number of iterations is imposed), a valid codeword C" (after hard decision) is found.

b) The estimate of the data portion D' (can be derived from the estimate C", or is even included in C", in case of a systematic code (as in DVB-T2)) can be decoded by a BCH decoder. Note that the BCH decoder has also some error detection capabilities.

c) After BCH decoding, the stream I1' should correspond to a BBFrame, whose header (BBHeader) is protected by a CRC. If this check is successful, the likelihood that the whole BBFrame is correct, is increased.

d) Preferably, the reliabilities of all LLRs (log-likelihood ratios) are checked by check unit 58. This could be done by averaging the magnitudes of all LLRs belonging to the codeword. If this average is larger than a certain threshold (which depends on the code and has to be defined), a decoding success is very likely.

If S=0, the last criterion (d) can also offer an estimate of how unreliable the codeword (after decoding) is. Assuming that the following auxiliary code portions have a similar quality than the previous codeword, an estimate E can be made about how many additional portions are needed for successful decoding.

It should be noted that there a two ways of combining the previous codeword (which the decoder wasn't table to decode correctly) with the auxiliary code word portions:

1) store the previous codeword, which entered the decoder, and append the auxiliary codeword portion at its end or
2) store the final estimate C" of the LDPC decoder 56 (e.g. after the maximum number of iterations has passed) and append the auxiliary codeword portion at its end.

In addition to the embodiments explained above the encoder of the transmitter may also be adapted such that the auxiliary parity portion (generally, the auxiliary codeword portion) may not (only) comprise "real" parity information, but that it may also comprise a repetition of (part of or all) of the information of the "basic" codeword, i.e. (some or all) bits of the data portion D and/or the basic parity portion Pb (i.e. of the basic codeword portion). Hence, in a very simple embodiment, the auxiliary parity portion Pa simply comprises a copy of the data portion D and/or the basic parity portion Pb. This will also improve decoding if the basic codeword is disturbed but the auxiliary parity portion is not (or less) disturbed. Further, even if both the basic codeword portion and the auxiliary codeword portion are disturbed, by use of both portions for decoding the result of the decoding may be improved, e.g. by applying the principle of soft combining, e.g. by improving the soft values obtained in a first decoding step using only the basic codeword portion in a second decoding step using in addition the auxiliary codeword portion.

Figure 18:
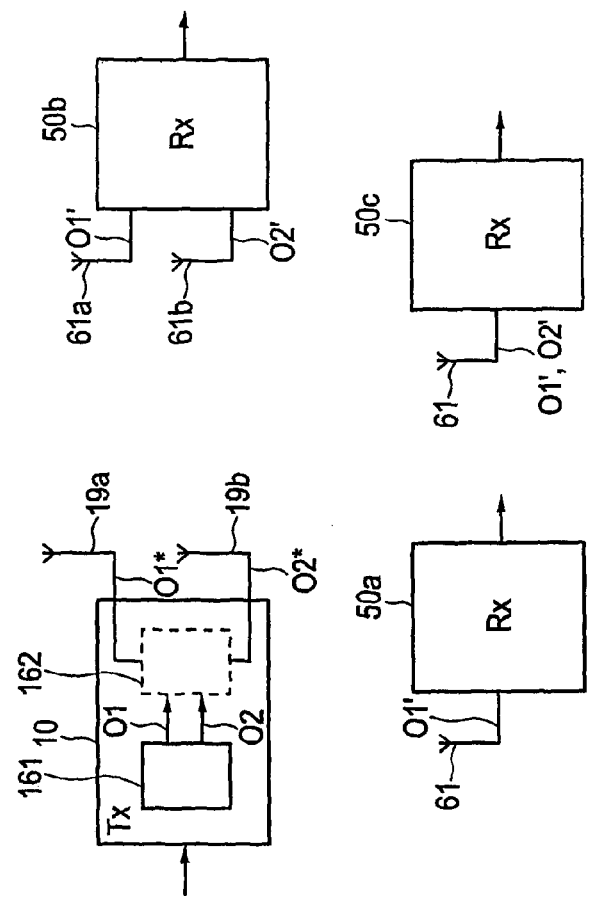
FIG. 18 shows a schematic block diagram of a broadcasting system in accordance with the present invention.

An embodiment of a broadcasting system in accordance with the present invention is schematically depicted in FIG. 18. The broadcasting system generally comprises a transmitter (Tx) 10 and one or more receivers (Rx) 50a, 50b, 50c. While it is generally sufficient that the transmitter 10 has a single antenna for transmitting the transmitter output data stream O, here in this embodiment the transmitter 10 is provided with two antennas 19a, 19b.

In a first mode both antennas can be used for simultaneously transmitting the identical transmitter output data stream O (or a modified stream thereof, e.g. in accordance with the Alamouti scheme of the DVB-T2 standard), for instance to increase coverage.

In another mode, that is specifically depicted in FIG. 18, the data mapper 161 provided in this embodiment of the transmitter 10 is adapted for generating two transmitter output data stream O1 and O2, wherein the data portions D and the basic parity portions Pb of codewords (i.e. the basic codeword portions) are mapped onto the first transmitter output data stream O1 and wherein the auxiliary parity portions Pa of codewords (i.e. the auxiliary codeword portions) are mapped onto the second transmitter output data stream O2. In this embodiment the first antenna 19a can then be provided with the first transmitter output data stream O1 for transmission and the second antenna 19b can be provided with the second transmitter output data stream O2 for transmission. For instance, during the transmission of T2 frames only the first transmitter output data stream O1 is transmitted, while during the transmission of FEFs both transmitter output data streams O1 and O2 are transmitted.

In still another mode, the first transmitter output data stream O1 may be transmitted by a horizontally polarized antenna, whereas the second transmitter output data stream O2 my be transmitted by a vertically polarized antenna, or vice versa.

Optionally, a MIMO precoder 162 is provided to which said first and second transmitter output data streams O1, O2 are provided from the data mapper 161 for precoding them according to any MIMO precoding scheme. For instance, the first and second transmitter output data streams O1, O2 can be spatially multiplexed onto the precoded transmitter output data streams O1*, O2* which are then transmitted by the antennas 19a, 19b, or Alamouti precoding can be applied to the first and second transmitter output data streams O1, O2. The precoded transmitter output data streams O1*, O2* may then both contain a mix of data from the first and second transmitter output data streams O1, O2.

In this embodiment illustrated in FIG. 18 the transmitter 10 is provided with two antennas 19a, 19b. It should be noted, however, that the transmitter, in particular a MIMO transmitter, comprises more than two antennas to which said precoded transmitter output data streams O1*, O2* are provided for transmission.

A first receiver 50a having a single antenna 61 may be adapted for receiving only the first transmitter output data stream O1 (as first receiver input data stream O1'), but not the second transmitter output data stream O2. Such a receiver 50a might be an existing, e.g. legacy or stationary, receiver that is not adapted for using any auxiliary parity portions at all. For instance, if the transmitter 10, particularly the second transmitter output data stream O2, is directed to reception by mobile receivers in accordance with a new standard, e.g. the DVB-NGH standard, the receiver 50a could be a stationary receiver in accordance with the DVB-T2 standard.

Another embodiment of the receiver 50b comprises two antennas 61a, 61b. In this embodiment the first antenna 61a is adapted for reception of the first transmitter output data stream O1 (as first receiver input data stream O1'), and the second antenna 61b is adapted for reception of the second transmitter output data stream O2 (as second receiver input data stream O2'). For instance, if the two antennas 19a, 19b of the transmitter 10 make use of different transmission channels, e.g. transmission frequencies, the two antennas 61a, 61b of the receiver 50b can be adapted for reception on the same respective transmission channel.

A third embodiment of a receiver 50c again has a single antenna 61, but is adapted for reception of the signals from both antennas 19a, 19b. The receiver 50c comprises means for internally splitting up or decomposing the two received input data streams O1', O2' accordingly.

The embodiment of the receiver 50b, having two separate antennas 61a, 61b for receiving the different transmitter output data streams O1, O2 separately, provides the advantage that the second antenna 61b and the subsequent processing means within the receiver 50b need only be activated if any auxiliary parity portions are required as incremental redundancies for improvement of the decoding. This holds also for an embodiment of a transmitter, where the second transmitter output data stream O2 does not only carry the auxiliary parity portions, but also the data portions and the basic parity portions of the codewords. In the latter case the transmission can be even made more stable. For instance, if the transmission channel between the transmitter antenna 19a and the receiver antenna 61a is disturbed, it can be switched to the other transmission channel between transmitter antenna 19b and the receiver antenna 61b. The advantage of a more stable transmission is also achieved with the receiver 50c which, in the latter case, can switch between reception of the first or second transmitter output data streams O1, O2 or which continuously receives both transmitter output data streams O1, O2. Further, such an embodiment generally also provides an increased spectral density.

In the above, particularly with respect to the transmitter 10, various embodiments have been illustrated, particularly how the data portions, the parity portions and the auxiliary parity portions are mapped onto the transmitter output data stream. Further, various examples have been given regarding the framing structure of the transmitter output data stream. It shall be understood that the data demapper 54 of the receiver 50 is, of course, adapted appropriately for demapping the required data from the receiver data input stream, i.e. the demapper 54 is aware of the particular framing structure and/or the locations at which the respective data are placed in the receiver data input stream. Known measures for signalling this information to the receiver from the transmitter and/or for prescribing this information, for instance in a standard, and for enabling the transmitters and receivers accordingly are generally applied to ensure this.

The framing structure applied according to the present invention may generally be adapted to be in consistence with the framing structure according to an existing standard, e.g. the DVB-T2 standard, so that existing receivers in accordance with this standard may also receive and process such data streams, even if they do not make use of the auxiliary parity information contained therein as incremental redundancy. However, the framing structure may be freely selected and newly created according to specific needs of the broadcasting system.

Generally, the present invention can be applied in all broadcasting systems, by which data are transmitted over a channel. For instance, the invention can be applied in a DAB system which shall be explained with reference to FIG. 20.

Figure 20:
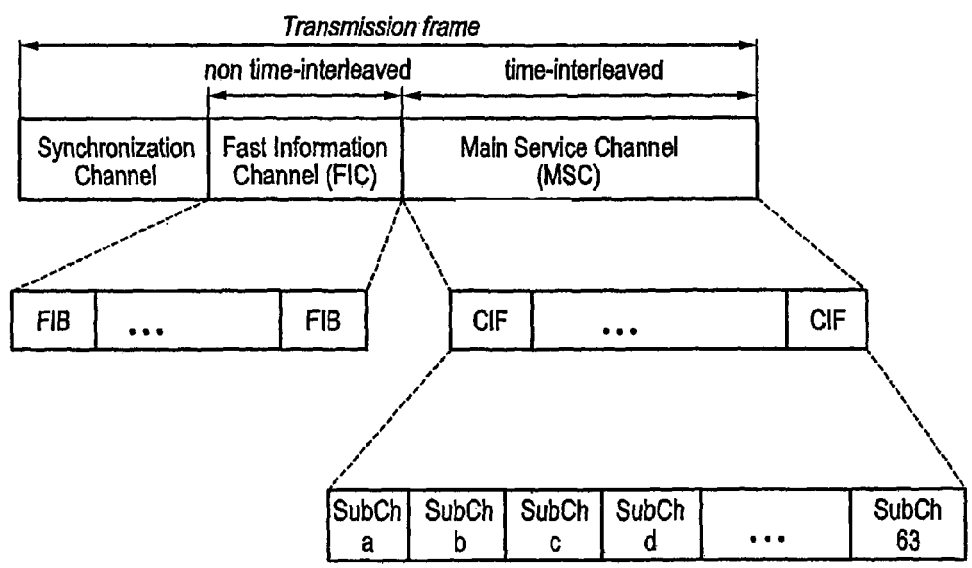
FIG. 20 shows the structure of a transmission frame as used according to DAB.

FIG. 20 shows the structure of a transmission frame as described in the DAB standard (ETS 300 401 "Radio broadcasting systems; Digital Audio Broadcasting (DAB) to mobile, portable and fixed receivers", May 1997, RE/JPT-00DAB-4). The DAB transmission system combines three channels, in particular a Synchronization Channel which is used internally with the transmission system for basic demodulator functions (e.g. transmission frame synchronization), a Fast Information Channel (FIC) which is used for rapid access of information by a receiver, which is a non-time-interleaved data channel and which can be sub-divided into Fast Information Blocks (FIBs), and a Main Service Channel (MSC) which is used to carry audio and data service components and which is a time-interleaved data channel divided into a number of sub-channels, which are individually convolutionally coded.

The MSC can also be seen as being made up of Common Interleaved Frames (CIEs), comprising Capacity Units (CU) as smallest addressable units. Each sub-channel of the MSC occupies an integral number of consecutive CUs and is individually convolutionally encoded. More details regarding the structure of the transmission frame and its content can be found in the above cited DAB standards, which explanations are herein incorporated by reference.

According to the present invention one of the sub-channels, e.g. SubCh a could comprise the basic codeword version, whereas one or more of the subsequent sub-channels, e.g. SubCh b, comprises the auxiliary codeword portion. A receiver can now process SubCh a and, if necessary, SubCh b for improving the decoding. As illustrated in an embodiment shown above the auxiliary codeword portion can be further segmented into sub-portions all carried in the same sub-channel or carried in various sub-channels. This again has the advantage that the receiver can fall into sleeping mode after successful decoding until the next basic codeword portion is transmitted.

If and for which sub-channels auxiliary parity bits are provided, could be signaled in the Fast Information Channel (FIC). Since this channel is, however, fixed and predefined, the signalling should preferably be done in another sub-channel which comprises the basic codeword portion, for instance in a newly defined header. Hence, receivers modified in accordance with the present invention can make use of this additional information. In addition, the FIC could signal, which sub-channel is adapted for reception by all DAB receivers (legacy receivers and receivers according to the present invention) and which sub-channels are decoded for reception by receivers according to the present invention (only).

The error correction code applied in DAB is a convolution code. Different code rates are generally achieved according to DAB by puncturing of a mother code. This mother code generally has a code rate of 1/4, and by puncturing of certain parity bits higher code rates are obtained. These punctured parity bits could be used as auxiliary parity bits for providing incremental redundancy in accordance with the present invention. Alternatively, a completely new mother code is also applicable, from which all the DAB code rates can be obtained by puncturing and where the punctured bits are used as auxiliary parity bits in accordance with the present invention.

Figure 21:
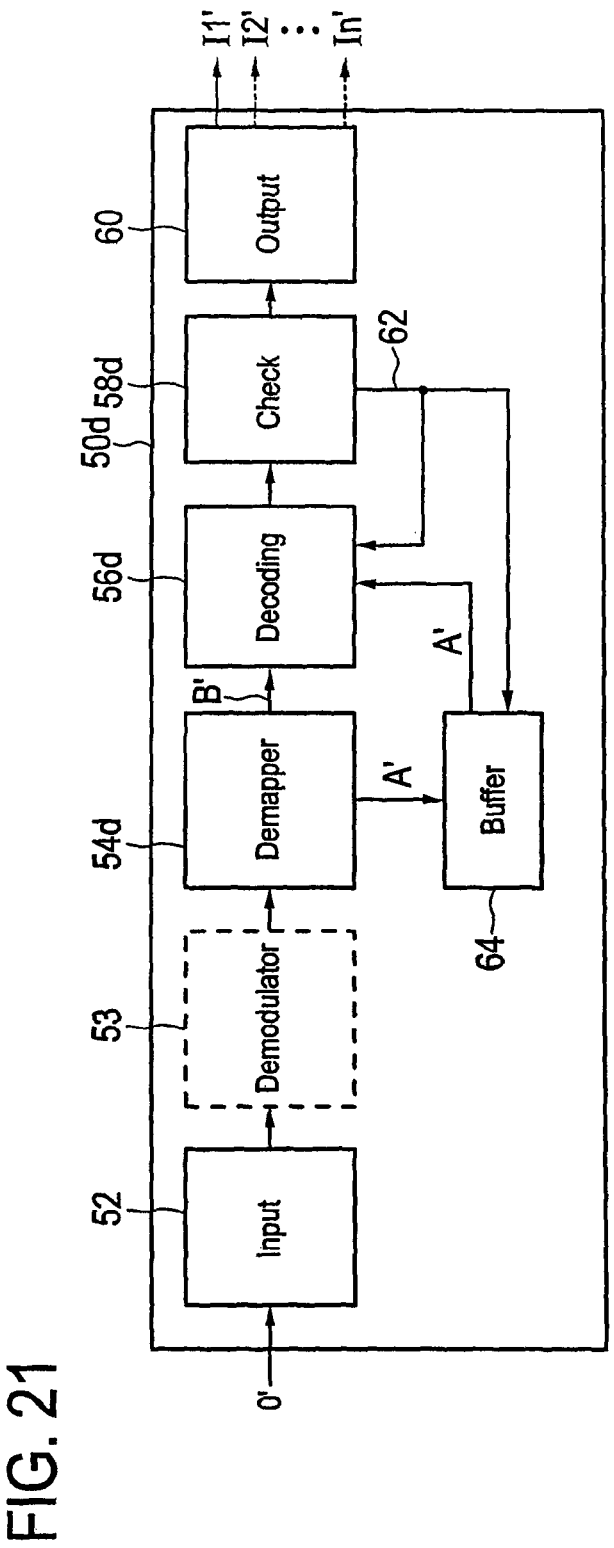
FIG. 21 shows a block diagram of another embodiment of a receiver.

FIG. 21 shows a block diagram of another embodiment of a receiver 50d. Generally, the basic codeword portions B and the auxiliary codeword portions A are mapped by the transmitter onto the transmitter output data stream O such that a basic codeword portion of a codeword is received by a receiver before the corresponding auxiliary codeword portion is received. Alternatively, however, the data mapper can also be adapted for mapping the basic codeword portions B and the auxiliary codeword portions A onto frames of a transmitter output data stream such that the auxiliary codeword portion of a codeword is received by a receiver before the corresponding basic codeword portion is received. For the embodiment of the receiver 50d shown in FIG. 21 it shall be assumed that the transmitter is adapted in this way.

In such a receiver 50d the data demapper 54d is thus adapted to demap the (first received) auxiliary codeword portions A' from the receiver input data stream O' and forward them to a buffer 64. Thereafter (whenever received) the corresponding basic codeword portions B' are demapped and forwarded to the decoder 56d for decoding them. If the check in the check unit 58d shows that additional redundancies shall be used for improved decoding the buffer 64 is informed via the feedback loop 62 to provide the buffered auxiliary codeword portion A' to the decoder 56d and the decoder is informed to then decode the codeword (now by additional use of the (complete or partial) auxiliary codeword portion again. If it is clear that the decoding of the corresponding codeword is correct the buffered auxiliary codeword portion (if any) is deleted from the buffer.

This embodiment provides the advantage that no waiting times (for waiting for the auxiliary parity portion, if the decoding was erroneous based on the basic codeword portion) occur, which is particularly important for reducing zapping times or for mobile receivers. Hence, this embodiment also provides the advantage that no interruption of the service occurs (due to waiting for reception of auxiliary codeword portions) in case of (e.g. sudden) bad reception conditions of the basic codeword portions.

Now, with reference to FIGS. 5, 6, 19 and 22 preferred embodiments of an encoder according to the present invention shall be explained.

As explained above, by the application of incremental redundancy (IR) certain existing LDPC codes of FEC-FRAME length $N_{ldpc}$ (e.g. =16 200) are extended, such that the new codeword consists of the original codeword (basic FEC) and $M_{IR}$ (also called v above) additional (auxiliary) parity bits to be used as IR. The new codeword length is thus $N_{ldpc,1}=N_{ldpc}+M_{IR}$. The LDPC encoding with IR can be thought of as one encoder of code rate $R_1=K_{ldpc}/N_{ldpc,1}$, where the output is split into a basic FEC ("basic codeword portion Pb") and an IR part ("auxiliary codeword portion Pa"). Both parts can be treated as two associated PLPs.

The relationship between original codeword and extended codeword can be seen in FIGS. 5 and 6. FIG. 5 depicts conventional FEC encoding according to, e.g., DVB-T2, where the input to the LDPC encoder of code rate $R_0=K_{ldpc}/N_{ldpc}$ are the $K_{ldpc}$ output bits of the BCH encoder, while its output is a systematic codeword of length $N_{ldpc}$. The last $N_{ldpc}-K_{ldpc}$ bits of this codeword are the LDPC parity bits. If a PLP applies IR, then an extended LDPC encoder of code rate $R_1=K_{ldpc}/N_{ldpc,1}<R_0$ is used, which has the same input as for conventional encoding, but outputs $N_{ldpc,1}=N_{ldpc}+M_{IR}$ bits, i.e., that amount of LDPC parity bits is increased to $N_{ldpc}-K_{ldpc}+M_{IR}$. However, the first $N_{ldpc}-K_{ldpc}$ parity bits thereof are identical to the parity bits of the original LDPC encoder of rate $R_0$. The codeword is split into two parts: the first $N_{ldpc}$ bits are the basic FEC part (i.e. the basic parity portion), while the remaining $M_{IR}$ bits are the IR part (i.e. the auxiliary parity portion) to be used as IR at the receiver, if necessary.

Thus, it is ensured that decoding of the received codeword is possible (for good channel conditions) with a rate $R_0$ decoder, which considers just the basic FEC part, while the extended codeword—consisting of both basic FEC and IR part, allows for decoding with a rate $R_1$ decoder.

Figure 22:
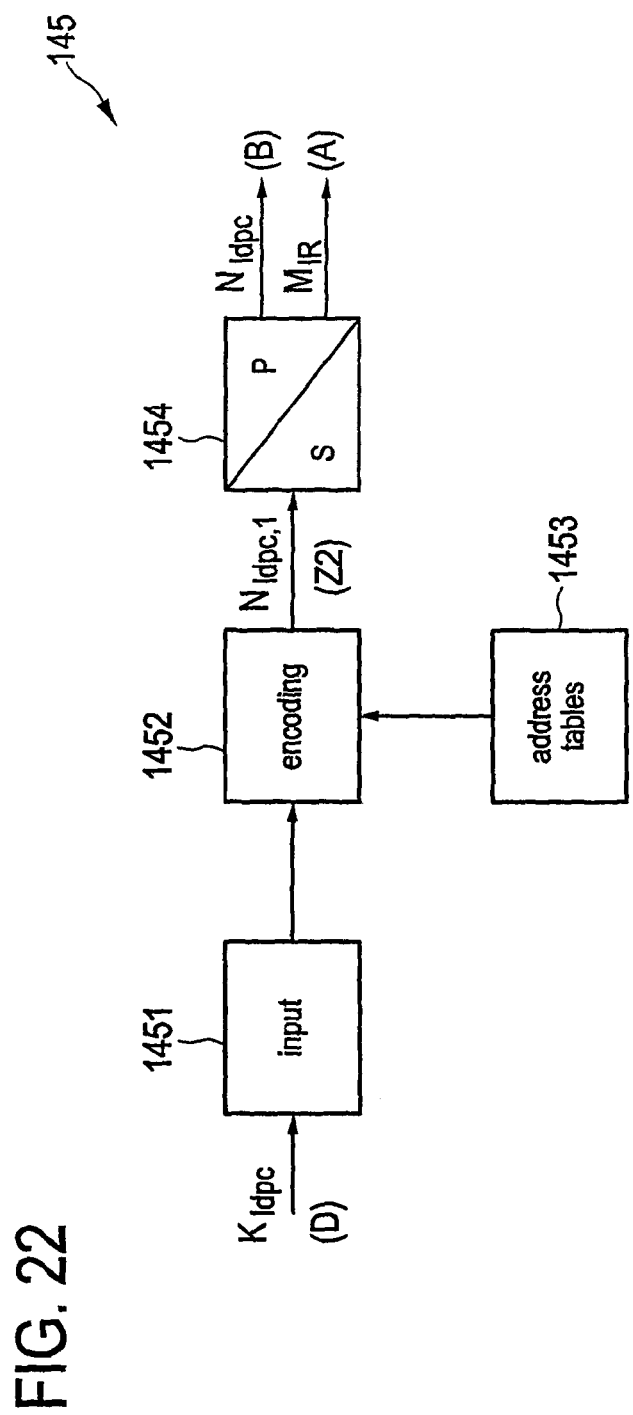
FIG. 22 shows a block diagram of another embodiment of an encoder according to the present invention.

The separation of one FECFRAME, which uses IR, into a basic FEC and an IR part is shown in FIG. 22 showing only the essential elements of an embodiment 145 of an encoder 14 according to this aspect of the present invention. This encoder 145 comprises an encoder input 1451 for receiving input data words D each comprising a first number $K_{ldpc}$ of information symbols $i_0, i_1, \ldots, i_{K_{ldpc}-1}$ (above also called $s_1, s_2, \ldots, s_k$, e.g. in FIG. 3).

Further, an encoding block 1452 is provided for encoding an input data word) into a codeword Z2 such that a codeword comprises a basic codeword portion B including a data portion D and a basic parity portion Pb of a second number $N_{ldpc}-K_{ldpc}$ of basic parity symbols $p_0, p_1, \ldots, p_{N_{ldpc}-K_{ldpc}-1}$, and an auxiliary codeword portion A including an auxiliary parity portion Pa of a third number $M_{IR}$ of auxiliary parity symbols ($p_{N_{ldpc}-K_{ldpc}}, \ldots, p_{N_{ldpc,1}-K_{ldpc}-1}$). Said encoding unit 1451 is adapted i) for generating said basic codeword portion B from an input data word D according to a first code, wherein a basic parity symbol is generated by accumulating an information symbol at a parity symbol address determined according to a first address generation rule, and ii) for generating said auxiliary codeword portion A from an input data word D according to a second code, wherein an auxiliary parity symbol is generated by accumulating an information symbol at a parity symbol address determined according to a second address generation rule. For these generations address tables are preferably used that are stored in an address table storage 1453.

Further, the encoder 145 comprises an encoder output 1454 for outputting said codewords, which is implemented here as a series-to-parallel converter for separating the basic codeword portion B and the auxiliary codeword portion A for subsequent independent processing. Of course, the output unit may be a simple serial output for outputting the complete codeword Z2 as it is.

The encoded bits of both streams are further processed by independent instances of bit interleavers, demultiplexer parts, and so on, as depicted in FIG. 2 for a particular PLP. Thus, it is possible to increase the robustness of the basic FEC part by applying, e.g., low order QAM constellations for this part. It shall be noted here that according to this embodiment of the present invention preferably only a single encoding unit (e.g. like the encoding unit 20 shown in FIG. 2) is provided. For instance the encoding block 1452 can implement both the FEC encoding blocks 21 and 31, whereafter a single common path with subsequent processing elements or two separate paths of subsequent processing elements (as shown in FIG. 2) follow.

A scheduler will allocate the bursts of the basic FEC part at earlier time instances than the bursts of the corresponding IR part. If the receiver wants to decode a PLP that uses IR, it has to demodulate at least the basic FEC part, which corresponds to the output of the original encoder of rate $R_0 = K_{ldpc}/N_{ldpc} > R_1$. If decoding fails, due to inappropriate channel conditions (SNR falls below threshold of the original code), it can, in addition, demodulate the IR part, which—together with the basic FEC part, builds the codeword of length $N_{ldpc,1}$. However, the decoder then switches to a new parity check matrix according to the code of (smaller) code rate $R_1$, where successful decoding is more likely, as the decoding threshold of the extended code is much smaller than that of the original code.

It should be noted that the main advantage of IR (compared to applying a low code rate $R_1$ without IR in the first place) is that the IR part can be ignored by the receiver unless it is needed. If, e.g., $R_1 = \frac{1}{2} * R_0$, a conventional approach would apply the rate $R_1$ code, which limits the throughput of the data by a factor of 2. So, twice as many bursts have to be detected by a receiver for a given data rate, compared to the case, when, due to favourable channel conditions, transmission would be possible with a rate $R_0$ code. Applying IR, however, allows the receiver to fall into sleep-mode, whenever IR bursts are transmitted, if decoding of the basic FEC part is possible and/or was successful.

The amount of IR bits shall be as large as the FECFRAME length itself, thus: $M_{IR} = N_{ldpc}$, which results in halving of the original code rate, $R_1 = \frac{1}{2} * R_0$. In a practical implementation, e.g. for use in mobile receivers according to the upcoming DVB-NGH standard, IR is used for mini codes ($N_{ldpc} = 4\,320$) for the following code identifiers: $R_0 \in \{1/2, 7/12, 2/3, 3/4\}$. In the following the principle of the invention is explained using the short code ($N_{ldpc} = 16\,200$), but the same principle and the same address generation rules can be applied for the mini codes, but other address tables are used then.

For each LDPC code of length $N_{ldpc} = 16\,200$, in the following denoted as original code of rate $R_0$, an extended code of rate $R_1 = \frac{1}{2} * R_0$ is derived in the following. The extended LDPC encoder treats the output of the outer BCH encoding, $I = (i_0, i_1, \ldots, i_{K_{ldpc}-1})$, as an information block of size $K_{ldpc} = N_{BCH}$, and systematically encodes it onto a codeword of size $N_{ldpc,1} = N_{ldpc} + M_{IR}$, where:

$$\Lambda = (\lambda_0, \lambda_1, \lambda_2, \ldots, \lambda_{N_{ldpc,1}-1}) = (i_0, i_1, \ldots, i_{K_{ldpc}-1}, p_0, p_1, \ldots, p_{N_{ldpc,1}-K_{ldpc}-1}).$$

The following encoding procedure ensures that the first bits of the extended codeword $\lambda_i$, for $i \in \{0, \ldots, N_{ldpc}-K_{ldpc}-1\}$ are the same as if the original LDPC code would have been used.

The task of the encoder is to determine $N_{ldpc}-K_{ldpc}$ parity bits $(p_0, p_1, \ldots, p_{N_{ldpc,1}-K_{ldpc}-1})$ for every block of $K_{ldpc}$ information bits, $(i_0, i_1, \ldots, i_{K_{ldpc}-1})$. In other word, the connections shown in FIG. 19 are determined by the encoder. The procedure is as follows:

Initialize $p_0 = p_1 = p_2 = \ldots = p_{N_{ldpc,1}-K_{ldpc}-1} = 0$

Accumulate the first information bit, $i_0$, at parity bit addresses specified in the first row in FIGS. 23 to 26 showing the address tables for the proposed mini code for various code rates. The principle shall be explained using as an example the address table shown in FIG. 30 for a short code using the values $Q_{IR} = 45$, $M_{IR} = 16200$, $N_{ldpc} = 16200$, $Q_{ldpc} = 10$ and a code rate identifier of 4/5, (all additions are in GF(2)):

$$p_5 = p_5 \oplus i_0$$
$$p_{896} = p_{896} \oplus i_0$$
$$p_{1565} = p_{1565} \oplus i_0$$
$$p_{3976} = p_{3976} \oplus i_0$$
$$p_{5177} = p_{5177} \oplus i_0$$
$$p_{5570} = p_{5570} \oplus i_0$$
$$p_{6450} = p_{6450} \oplus i_0$$
$$p_{7092} = p_{7092} \oplus i_0$$
$$p_{7119} = p_{7119} \oplus i_0$$
$$p_{7737} = p_{7737} \oplus i_0$$
$$p_{9989} = p_{9989} \oplus i_0$$
$$p_{10690} = p_{10690} \oplus i_0$$
$$p_{11608} = p_{11608} \oplus i_0$$
$$p_{12337} = p_{12337} \oplus i_0$$
$$p_{13423} = p_{13423} \oplus i_0$$
$$p_{15147} = p_{15147} \oplus i_0$$
$$p_{15236} = p_{15236} \oplus i_0$$
$$p_{18042} = p_{18042} \oplus i_0$$
$$p_{18646} = p_{18646} \oplus i_0$$
$$p_{18943} = p_{18943} \oplus i_0$$

It should be noted that the first three parity addresses (all smaller than $N_{ldpc} - K_{ldpc} = 3240$) are the same as defined in DVB-S2 for the 16 k code of rate 4/5, while the remaining addresses are according to the extended LDPC code and are written in bold numbers in the address tables depicted in FIGS. 23 to 26.

For the next 359 information bits, $i_m$, $m = 1, 2, \ldots, 359$ accumulate $i_m$ at parity bit addresses $$\{x + m \bmod 360 \times Q_{ldpc}\} \bmod (N_{ldpc} - K_{ldpc}) \text{ if } x < N_{ldpc} - K_{ldpc}$$

(which is the first address generation rule)

or $$N_{ldpc} - K_{ldpc} + \{x + m \bmod 360 \times Q_{IR}\} \bmod M_{IR} \text{ if } x \geq N_{ldpc} - K_{ldpc}$$

(which is the second address generation rule), where x denotes the address of the parity bit accumulator corresponding to the first bit $i_0$, $Q_{ldpc}$ is a code rate dependent constant specified for the original LDPC codes in the DVB-T2 and DVB-C2 standards and $Q_{IR} = M_{IR}/360 = 45$.

It should be noted that the size (also called $G_a$) of the group of information bits that are dealt with blockwise, can also be different from 360 and can also be different for the first and second address generation rules, but $K_{ldpc}$ should always be a multiple of G. The code rate dependent parameter $Q_{ldpc}$ is preferably selected from the following table

| Code Rate Identifier | $Q_{ldpc}$ |
|---|---|
| 1/2 | 6 |
| 7/12 | 5 |
| 2/3 | 4 |
| 3/4 | 3. |

The relation between $G_b$ and $Q_{ldpc}$ is as follows: $Q_{ldpc}=(N_{ldpc}-K_{ldpc})/G_b$ and the relation between $G_a$ and $Q_{IR}$ is: $Q_{IR}=M_{IR}/G_a$. If $M_{IR}=N_{ldpc}=4\,320$ and $G_a=360$, then $Q_{IR}=12$.

The positions x, which are larger than or equal to $N_{ldpc}-K_{ldpc}$ are written in bold numbers in the address tables shown in FIGS. 23 to 26. Each of said address tables is designed for a particular code rate, the corresponding value for $Q_{ldpc}$ selected from the above table and the values of $Q_{IR}=12$, $M_{IR}=4\,320$, $N_{ldpc}=4\,320$.

It should be noted that this approach leaves the basic FEC as the original code, adds $M_{IR}$ more parity checks, and maintains the quasi-cyclic LDPC structure for both basic and IR part. However, the quasi-cyclic structure is interrupted after the first $N_{ldpc}-K_{ldpc}$ rows of the parity check matrix. But as this is a multiple of 360 (namely $Q_{ldpc}$), blockwise decoding based on 360 bit groups can still be applied.

In a similar manner, for every group of 360 new information bits, a new row from one of the above address tables (i.e. the address table of the desired data rated) are used to find the addresses of the parity bit accumulators.

After all of the information bits are exhausted, the final parity bits are obtained as follows:

Sequentially perform the following operations starting with i=1.

$p_i = p_i \oplus p_{i-1}$, $i=1, 2, \ldots, N_{ldpc,1}-K_{ldpc}-1$.

Final content of $p_i$, $i=0, 1, \ldots, N_{ldpc,1}-K_{ldpc}-1$ is equal to the parity bit $p_i$.

Figure 27:
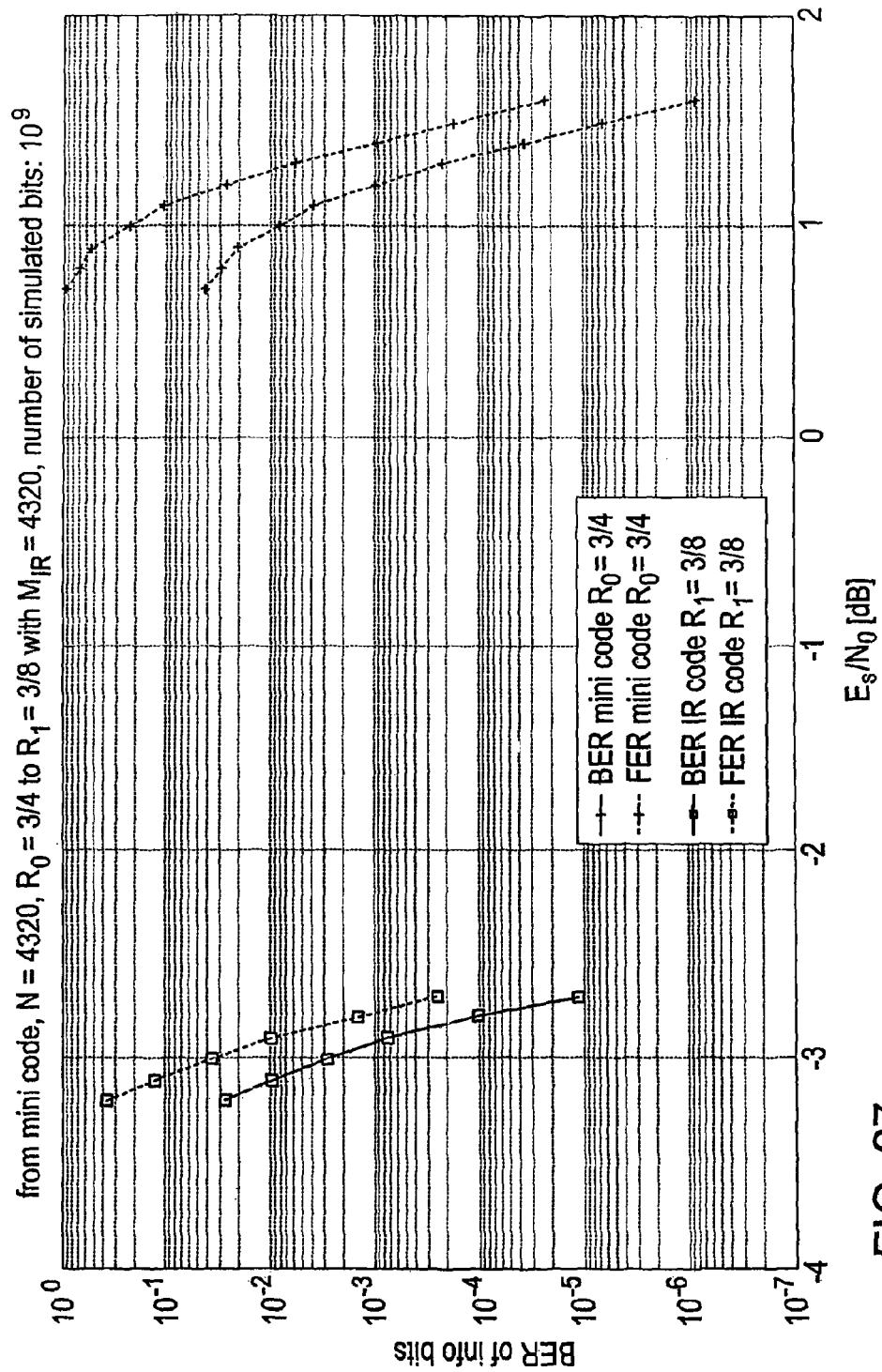
FIG. 27 shows a diagram illustrating the performance of the mini code proposed according to the present invention.

An example of the extended LDPC code shall now be briefly explained. The bit and frame error rates (BER and FER) over SNR performance of an extended LDPC code over the (non-fading) AWGN channel is depicted in FIG. 27. The original code is a mini code of rate $R_0=3/4$ and of length $N_{ldpc}=4320$, the extended code has code rate $R_1=3/8$. The decoding threshold (or pinch-off limit) of the original (mini) 3/4 code is at about 1.5 dB. The extended LDPC code of code rate $R_1=3/8$ has its threshold at −2.7 dB. The number of simulated information bits was $10^9$.

If the SNR at the receiver exceeds 1.5 dB, it can decode the original rate 3/4 mini code, which also corresponds to the basic FEC part of the extended LDPC code. In this case, the IR part could be neglected, which yields a reduction in processing power by a factor of 2 (as half of the bursts belonging to this PLP are from the IR part). If the SNR decreases, the receiver can demodulate the IR part and thus has a margin of additional 4.2 dB. In terms of coding gain (difference in $E_b/N_0$) this corresponds to 1.2 dB gain, as the code rate is halved.

It shall be noted that it is also possible to design new LDPC codes, which can be partitioned into a basic FEC and an IR part. As the FEC part of these newly designed codes does not have to match the existing (standardized) LDPC codes of the DVB family, the resulting coding gains of the IR part will be even larger than those codes proposed according to the present invention. Furthermore, it is also possible to extend LDPC codes with a different amount of additional parity bits, $M_{IR}$, or to allow for more than one IR part. The partitioning into several IR parts would enable the receiver to estimate the amount of additional parity portions, which are required for successful decoding.

The additional redundancies generated according to the present invention can also be used in another scenario to enable a mobile receiver, for instance an in-car receiver or a handheld receiver (e.g. in a mobile phone or a PDA) in a broadcast system to decode broadcast data even under severe transmission channel conditions by improving the provided error correction measures. In particular, it is proposed to provide a sufficient amount of redundancy on request of the receiver to increase the robustness of the code. Said additional redundancy is provided by the data transmission system after a feedback from the receiver is received requesting additional redundancy. Said additional redundancy is, however, not broadcasted over the broadcast system, but is transmitted over a unicast system to the requesting receiver only. This receiver can use the additional redundancy to perform another decoding of previously (through the broadcast system) received codeword. Hence, if reception or reconstruction (decoding) of received broadcast data is erroneous or could only be made with insufficient quality, the receiver can repeat decoding using, in addition to the previously received codeword, the requested additional redundancy.

Such a receiver, e.g. in accordance with the upcoming DVB-NGH standard, can, for instance, be included in a mobile phone, which is also capable of receiving data from unicasting networks, like mobile communications systems, e.g. a 3G (UMTS) or 4G (LTE) communications system, as well as WLAN (wireless local area network), if access points are in nearby range. Additional redundancy for erroneously received or decoded codewords (the term "erroneously" being not only understood as meaning completely erroneously, but also "with insufficient quality") can be retrieved from a different architecture (vertical handover) according to the present invention, e.g. via the 3G, 4G or WLAN network.

Thus, generally it is not essential for such a scenario in accordance with which particular unicast system the unicast request unit and the unicast receiving unit are implemented. Generally, any unicast system may be used, e.g. any (tele) communications system for wireless communication, and it is also possible that the receiver may be implemented to use several unicast systems for the proposed request and reception of additional redundancy, e.g. through the unicast system that is currently available in the respective situation. Further, the request and the reception of the additional redundancy can generally also be performed through different unicast systems, but preferably the same unicast system will be used. Since, generally, unicasting systems provide sufficient means for error correction and detection, it can be assumed that the transmission of the auxiliary codeword portion is error-free.

Figure 28:
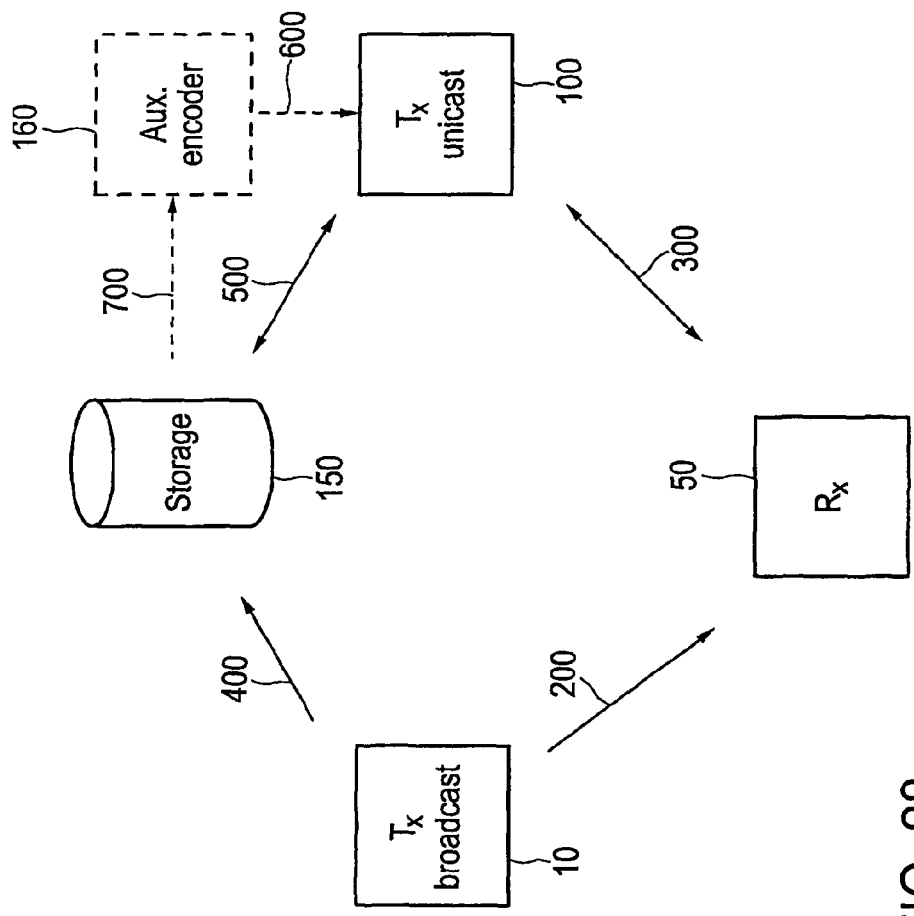
FIG. 28 shows a block diagram of another data transmission system.

FIG. 28 shows a schematic block diagram of a data transmission system in accordance with such a scenario. The system comprises a broadcast transmitter 10 for broadcasting data, a receiver 50 for receiving data broadcast by said broadcast transmitter 10, a unicast transmitter 100 for transmitting data in a unicast system, and a data storage 150 for storing data received from the broadcast transmitter 10. As will be explained in more details below, the receiver 50 is not only able to receive data broadcast by said broadcast transmitter 10, but is—to a certain extent—also able to communicate with the unicast transmitter 100 to have a bidirectional communication, and also the unicast transmitter 100 is able to have a bidirectional communication with the data storage 150. In particular embodiments, an additional auxiliary encoder 160 is further provided for encoding data before transmission to the unicast transmitter 100. In the following the various elements of the data transmission system will be explained separately to illustrate their functionalities and interrelations as proposed according to the present invention.

In this data transmission system the broadcast transmitter 10 and the receiver 50 as well the link 200 in between are part of a broadcast system, such as a video broadcast system in accordance with any DVB standard, particularly a wireless broadcast system. The unicast transmitter 100 and the receiver 50 as well as the link 300 in between are part of a unicast system, such as a communications system in accordance with any communications system standard, particularly a wireless communications system.

The link 400 between the broadcast transmitter 10 and the data storage 150 can be part of the broadcast system so that the data to be stored in the data storage 150 are obtained by the data storage 150 from the broadcast signal. Alternatively, this link 400 can also be established by a separate transmission channel, e.g. a wired or wireless transmission link, from the broadcast transmitter 10 to the data storage 150, which can, for instance, be a server arranged next to the broadcast transmitter 10.

The link 500 between the unicast transmitter 100 and the data storage 150 as well as the link 600 between the auxiliary encoder 160 and the unicast transmitter 100 can be part of the unicast system so that the unicast transmitter 100 communicates with the data storage 150 and the auxiliary encoder 160 via the same unicast system as is used for communicating with the receiver 50. The links 500, 600 and/or 700 between the data storage 150, the auxiliary encoder 160 and/or the unicast transmitter 100 can be established by any transmission means. Preferably, the auxiliary encoder 160 is arranged in close proximity to the data storage 150 so that a wired transmission line is the advantageous solution. The auxiliary encoder 160 might, however, also be part of the unicast system or even part of the unicast transmitter 100.

Figure 29:
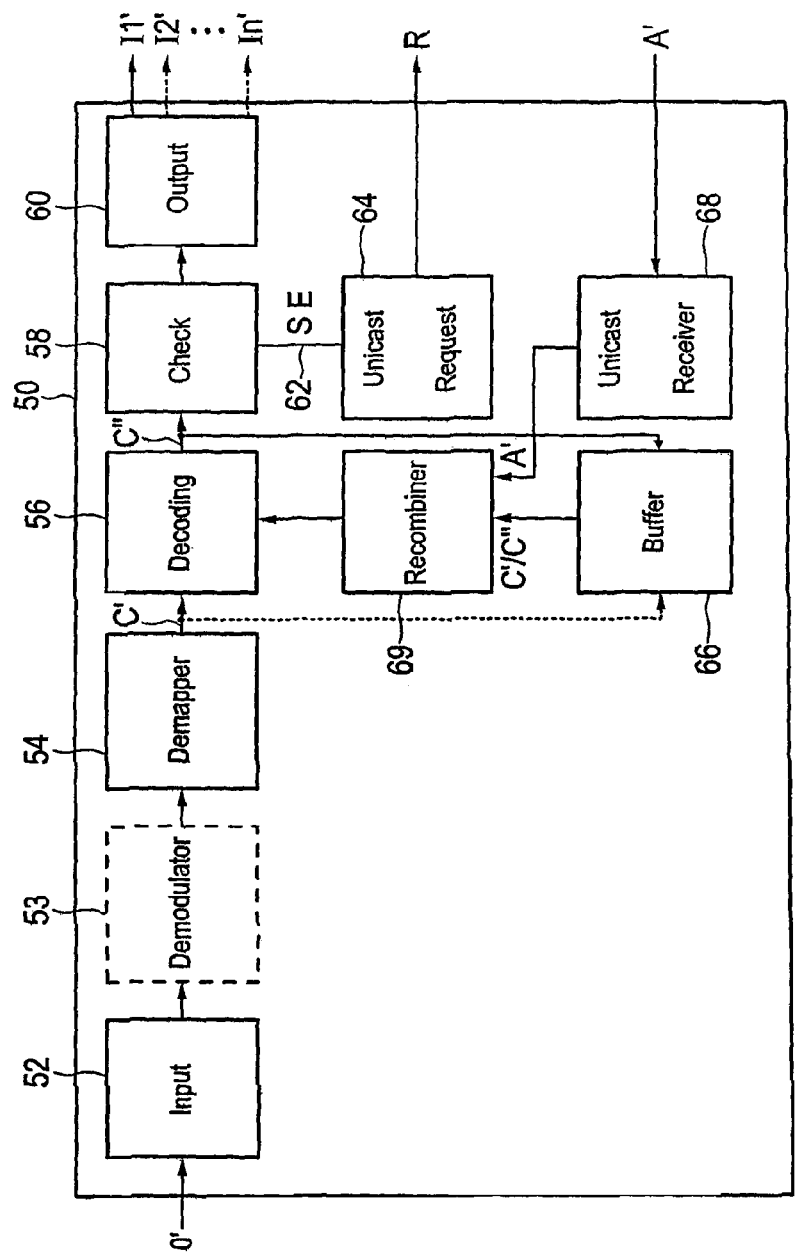
FIG. 29 shows a block diagram of a receiver used in such a data transmission system.

FIG. 29 shows a schematic block diagram of a receiver 50 for use in a data transmission system as illustrated in FIG. 28. The receiver 50 is particularly adapted for requesting an auxiliary parity portion (generally, the auxiliary codeword portion) as incremental redundancy in case of erroneous or low quality decoding.

The receiver 50 comprises a data input 52 for receiving a receiver input data stream O' which generally corresponds to a transmitter output data stream O that has been transmitted over a broadcast channel of the broadcast system by a transmitter 10 and which may thus be affected by disturbances that may appear in such a broadcast system, particularly in case of using mobile receivers which are the main application of the present invention on the receiver side.

Optionally, a demodulator 53 is provided that is interrelated with an (optional) modulator of the transmitter 10 for demodulating the received receiver data input stream O'. A demapper 54 demaps the (optionally demodulated) receiver data input stream O', particularly at least the data portions and the basic parity portions (i.e. the basic codeword portions) of the codewords mapped into the receiver data input stream O' as will be explained below in more detail. A decoder 56 then decodes these codewords by use of the basic codeword portions according to the same code as applied by the encoder of the transmitter 10. As particularly in case of mobile receivers severe disturbances, for instance due to the high velocity of the moving receiver, might appear a check unit 58 is provided in the receiver 50 by which it is checked if decoding has been made correctly and/or with sufficient quality and/or below a tolerable error level as will be explained below. If the decoding is made without errors or with sufficient quality the decoded data are provided to an output unit 60. The output thereof might be one or more receiver output data streams I1' I2', ..., In' which should as much as possible correspond to the transmitter input data streams I1, I2, ..., In. If, however, the check by check unit 58 shows that a decoding is erroneous or that the decoded data have an insufficient quality and would, for instance, result in a noisy receiver output signal (e.g. insufficient picture quality of a movie), a side loop 62 is provided from the check unit 58 to a unicast request unit 64 in order to request the auxiliary parity portion (generally, the auxiliary codeword portion) (completely or in part) for improving the quality of decoding.

Hence, in such a situation the unicast request unit 64 transmits a request R via the unicast system, i.e. via the unicast transmitter 100 of the data transmission system, to obtain the corresponding auxiliary parity portion (completely or in part) for the erroneously decoded codeword from the data storage 150. The request R includes at least the identification information of the erroneous codeword. In the meantime the decoding result C" of decoding the codeword (or the codeword C' itself) is stored in a buffer (generally, a data memory unit) 66. The requested auxiliary codeword portion A' (or at least a portion thereof or another auxiliary parity data that can be used as incremental redundancy in an additional decoding step, i.e. which have been generated by use of the same code) is received by a unicast receiver 68. By use of this additional redundancy and the data stored in the buffer 66, a recombiner 69 will recombine these data so that the decoder 56 will then again decode the received codewords, but now applies a code having a lower code rate which thus has a higher robustness against the disturbances. Hence, there is a high likelihood that the decoding quality will be better than before.

Thereafter, again a check can be made by the check unit 58 if the decoding has now been made error-free or with sufficient quality, and, if not, a still further part of the auxiliary parity portion can be requested and used in another iteration of decoding. If, on the other hand, the complete auxiliary parity portion of a codeword has already been completely used for decoding the check can also be omitted and the decoded data can be outputted directly.

Preferably, the request R transmitted from the unicast request unit 64 comprises only an indication which auxiliary codeword portion is requested. However, an estimate E from the check unit 58 may also be included in the request R indicating the amount of incremental redundancy that is required for enabling better decoding of the codeword. Hence, based on said estimate E, the complete auxiliary codeword portion needs not necessarily to be retrieved and transmitted via the unicast system, but only the amount as signalled by said estimate E needs to be transmitted, thus saving bandwidth and transmission time (and, if the auxiliary parity portion must be generated on the fly in an auxiliary encoder 160, saving also some time needed for encoding).

The present invention thus provides an effective and easily implementable measure for improving the reliability of decoding, particularly for mobile receivers in a broadcasting system, without any feedback from a receiver to the transmitter. If the DVB-T2 framing structure is kept unchanged and the FEFs contain the additional redundancy, i.e. the auxiliary codeword portion, there are basically two aspects that make a (mobile) receiver, or generally any receiver exploiting the present invention, more robust for mobile reception: i) The incremental redundancy as described and ii) the FEFs themselves with the embedded incremental redundancy, which can (and typically will) select transmission (e.g. OFDM) parameters that have a better behaviour in mobile channels. The most important ones are lower FFT sizes and higher pilot pattern densities (being related to the FFT and guard interval sizes). Of course the incremental redundancy data in the FEFs can additionally be protected by using lower modulation schemes, other interleaving depths etc.

The time interleaver depth chosen in the FEFs could, for example, complement the time interleaver depth of the T2 frames. If the T2 frame time interleaver fails (e.g. signal interrupted for a dedicated time (e.g. due to a tunnel etc.)), the other settings in the FEF time interleaver might be better suited and allow overall correct decoding. Different time interleaver settings of the T2 frame and the FEF frame overall improve the system performance.

The receiver in accordance with the present invention benefits therefore from the fact that in addition to the basic T2 reception the data in the FEFs (i.e. additional incremental redundancy) is more robust in mobile channels. Another main advantage of preferred embodiments of the present invention is that broadcasters do not have to transmit the data for mobile, (e.g. NGH) receivers, but only incremental redundancy is transmitted to enable a more robust reception of T2 data even with a mobile receiver. Thus, transmission bandwidth is utilized most efficiently.

This following description provides details of an exemplary implementation of the present invention in future broadcast systems, e.g. in the upcoming DVB-NGH system.

3 Executive Summary

The following description comprises an overall system proposal that is largely based on the existing DVB-T2 standard [2]. It is asserted that T2 already provides many adequate functional blocks that would allow good performance in a mobile environment. The proposal includes additional technologies to extend and improve upon this base in terms of mobile performance, reduced latency and faster zapping (adjusted to the typically lower bit rates per service compared to T2) with particular emphasis on reduced receiver complexity and power consumption. The new technologies in the proposal that make these gains possible are:

- FEC o Mini codes: 4k LDPC codes are proposed for NGH to reduce latency and decoding complexity (compared to the T2 LDPC blocksizes of 16k and 64k)

o Low code rates: Code rates less than R=1/2 are proposed for NGH in order to cope with the stronger channel impairments encountered in a mobile environment.

o Incremental redundancy: Both the new 4k LDPC code as well as the existing 16k T2 LDPC codes are extended with additional parity bits to provide additional robustness if decoding of the base LDPC code fails. If the decoder is able to decode the codeword with the base parity bits the incremental redundancy part is discarded to save power.

- Framing Structure o Data Slices: This proposal reuses the concept of Data Slices from DVB-C2, the latest member of the DVB $2^{nd}$ generation family of standards. A wide transmission bandwidth (e.g.8 MHz) is divided in the frequency dimension into narrower Data Slices, which have a maximum bandwidth of 1.7 MHz. Only one front-end transmitter is needed to cover all necessary transmission bandwidths, ranging from 1.7 MHz to 20 MHz. The proposed NGH receiver only needs to decode a single Data Slice out of the overall transmitted bandwidth. By limiting the bandwidth of the signal to be received, a low power receiver architecture is achieved.

o Mixed mode: Additional flexibility is ensured with SISO/MISO/MIMO operation specified per PLP and mixed operation within one NGH frame is possible.

- Signalling: Decoding the P2 symbol in T2 is likely to be unreliable within a mobile receiver environment. In order to improve reliability a new signalling concept is proposed which consists of three levels.

o Preamble Symbol: A preamble symbol at the beginning of the NGH frame signals the overall OFDM signal bandwidth, information about the Data Slice partitioning and MIMO/MISO operation of each Data Slice. In mixed T2/NGH operation, a postamble at the end of the NGH frame is transmitted, which contains the same information for the next NGH frame.

o Signalling PLP: A signalling PLP contains all information about the setup and location of PLP bursts within the NGH frame. The signalling PLP is required for initial service acquisition and corresponds to the P2 symbol(s) in T2. However, it is transmitted as a normal PLP and therefore allows for greater time diversity and improved reliability.

o In-Band Signalling: Finally, in-band signalling within the PLP packets allows for further tracking the desired PLP as well as the location of other PLPs and minimizes zapping times. The number of signalled PLPs in the in-band signalling is adjustable to reduce overhead.

- New Sub-slice Structure: Based on the Helsinki measurements it was shown that there are regular time fades in the captured channel transfer functions. Furthermore Doppler shifts may also cause regular fading in the time domain. Unfortunately T2 has a regular structure for the PLP sub-slicing since subslices of different (type 2) PLPs are arranged in a fixed pattern. If the time fading frequency matches the repetition rate of the sub-slices, decoding performance will suffer significantly. The proposed scheduler allows algorithms to be defined which avoid any regular structure of the sub-slices to mitigate the problem.

- Local Service Insertion: The document proposes a method to achieve local service insertion in an SFN cell without severely breaking the SFN by using hierarchical modulation. In areas with local service insertion, the local content is overlaid as 'low priority bits' on to a SFN operating with a lower constellation size (e.g. 16-QAM).

- OFDM: The basic T2 8k FFT mode for an 8 MHz channel is proposed for operation in bands III-V. The subcarrier spacing of the 8k FFT size (i.e. 1.1 kHz) is kept constant; other bandwidths are realized by concatenation of a different number of Data Slices. In order to cope with the higher Doppler frequencies in L-Band and S-Band, the application of 4.4 kHz subcarrier spacing (i.e. 2k FFT mode) is proposed.

- MIMO: Alamouti encoding as included in T2 is proposed as a basic MIMO scheme for NGH. Furthermore a standard spatial multiplexing scheme is proposed for cross-polarized transmission scenarios to increase the data rate.

- IP Encapsulation: The proposed system can be used to transmit GSE, IP or MPEG Transport streams. Input pre-processing breaks multiple programme transport streams (MPTS) into many constituent single programme transport streams (SPTS). All SPTS streams are then encapsulated though RTP to IP. This may optionally be followed by GSE encapsulation. This means that a single mode adaptation function can be adopted for the system based on either GSE or IP to segment each IP/GSE stream into Baseband frames for each physical layer pipe (PLP). There is also provision for a common PLP to carry the meta-data either for IP streams or resulting from the SI information from MPTS pre-processing. This approach of transmitting SPTS per PLP means that there is no need to recombine data and common PLPs within the demodulator at the receiver.

The proposed system for the next generation handheld mobile is suitable for standalone operation but also adapted to work inside Future Extension Frames (FEFs) of the DVB-T2 superframe structure. A mixed and flexible NGH / T2 operation within one RF channel will significantly increase the chance of NGH becoming a commercial success.

A proper parameter selection as well as the removal of unnecessary features from DVB-T2 in the mobile receiver environment is proposed to limit the overall complexity of a NGH receiver. Combined with the other described features (e.g. segmented low bandwidth reception) a low cost NGH receiver solution will be possible, which is an essential precondition for a successful and wide NGH acceptance in mobile platforms.

It should be understood that although the document provides an overall system architecture reflecting the companies' understanding of the NGH system, the different building blocks can also be taken standalone and merged with other proposals.

This description focuses on the physical layer. However, the transparent behaviour of the proposed architecture allows the seamless adaptation of upper layer solutions such as OMA BCAST or IP Datacast. Cross layer optimizations can be added wherever needed and useful.

5 Functional Areas Addressed

This document is a complete system proposal and addresses all aspects of the commercial requirements. A detailed comparison to the NGH related commercial requirements is given together with the description of technology in the Annex.

6 System Overview

The proposed system aims to provide best possible performance for the upcoming NGH standard in a mobile and handheld environment, based on the Commercial Requirements provided by the DVB Commercial Module (The Annex includes a comparison to the Commercial Requirements). One main goal of the proposal is to keep the maximum possible commonality and reasonable re-usage of building blocks between the other DVB 2$^{nd}$ generation standards, according to the DVB 'Family of Standards' approach.

While many elements from DVB-T2 have been directly adopted in the described system, the proposed framing structure has been derived from DVB-C2. This approach is seen as very straightforward since DVB-C2 itself has a large overlap with DVB-T2, even the OFDM modulation parameters are reused from the terrestrial broadcast system. The reason for adopting the segmented OFDM reception approach from DVB-C2 with the concept of Data Slices is mainly to allow a flexible mobile broadcast system with very low power consumption on receiver side. The framing structure allows for an efficient T2-like time slicing approach within or even across different Data Slices. Consequently the proven energy saving advantages from time slicing as well as from lower reception bandwidths are deployed. All proposed Data Slice bandwidths can be decoded with a standard 1.7 MHz tuner. On the transmission side, all required NGH bandwidths (1.7 MHz to 20 MHz) are supported while maintaining the simple receiver architecture and achieving low processing power requirements. Depending on the chosen operation mode the maximum data rate for a single Data Slice differs, but due to the limited bitrate of a typical mobile service this is easily achieved.

While maintaining the 'Family of Standards' approach by adopting functional blocks from DVB-T2 and DVB-C2 new technologies are proposed that optimize the performance in a mobile environment. One main feature is the proposal of an architecture that allows the use of mixed SISO, MISO and MIMO operation as well as mixed pilot pattern within one NGH frame. Combined with the transparent PLP approach this is seen as a valuable option to provide reliable and best possible delivery of typical applications to a mobile device. For example, mixed MIMO/MISO/SISO operation within a NGH frame in combination with Scalable Video Coding (SVC) is a promising candidate to enable reliable delivery of video services, even in difficult reception conditions (e.g. low reception level and/or correlated MIMO channels).

Further extensions compared to DVB-T2 are proposed in the field of FEC. In addition to the reinsertion of more robust code rates based on the T2 LDPC code sizes of 16k (short) and 64k (long), two new elements have been added: The 4k "mini" LDPC code is seen as an important extension delivering a low-latency and power-efficient solution. Another technique is incremental redundancy which is a means to increase the successful decoding probability while limiting the processing power (the additional parity portion is only used if decoding of the basic codeword fails, i.e. the receiver typically takes advantage of much longer sleeping times).

Figure 31:
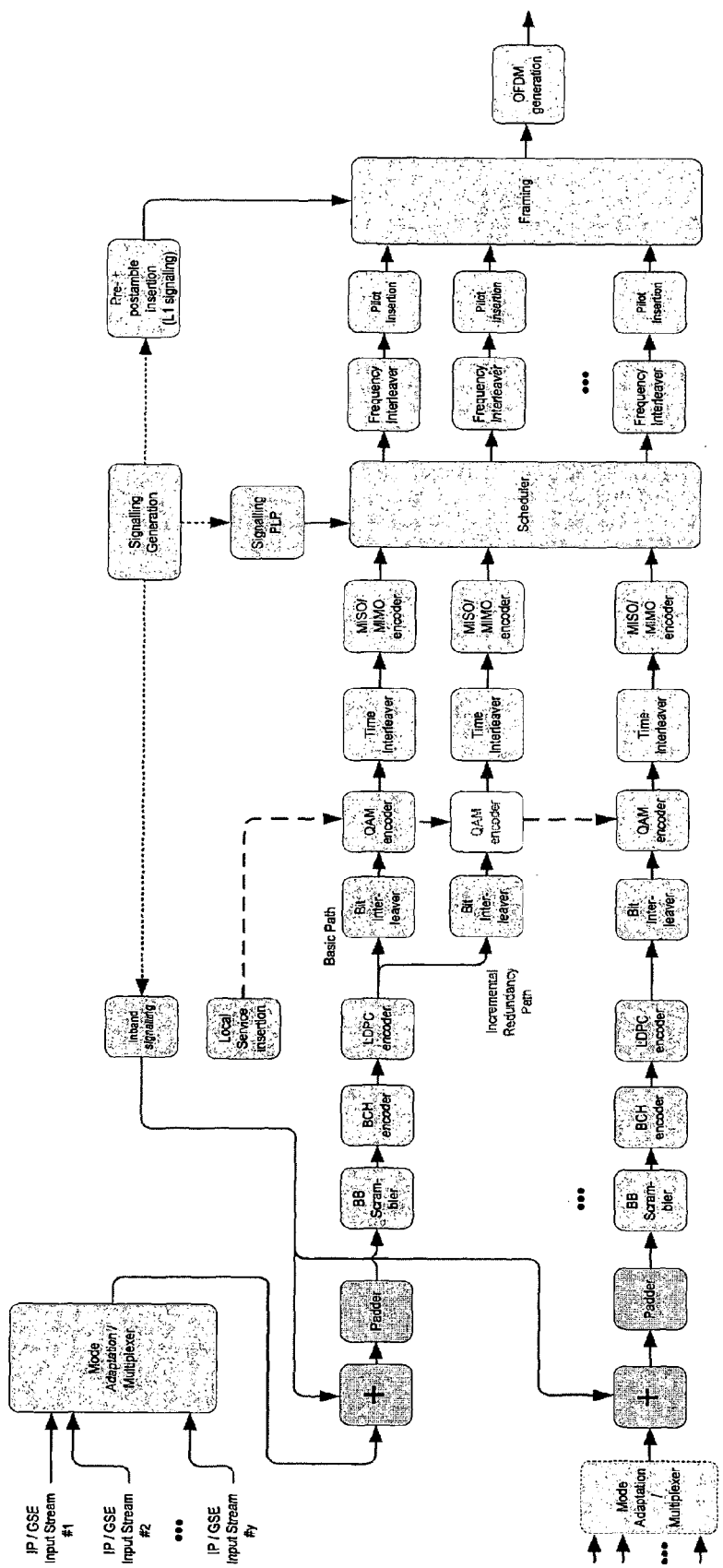
FIG. 31 shows a DVB-NGH proposal block diagram.

The basic block diagram of the proposed system architecture is depicted in Figure 31. Within an NGH frame, the different Data Slices (segments) have their own frequency interleaver and pilot insertion. All Data Slices are merged and a preamble symbol is added for synchronisation and basic signalling purpose. Finally, the frequency domain values are converted into the time domain by means of OFDM, and a cyclic prefix is attached.

Prior to the mode adaptation there is a pre-processing block that performs a similar function as in T2. The allowed input streams are MPEG-2 Transport Stream (TS) [4], IP streams as well as Generic Encapsulated Streams (GSE). The pre-processor breaks up any multi-programme transport streams (MPTS) into its constituent single programme transport streams (SPTS) separating out the SI meta-data to be transported separately. These streams are then encapsulated via RTP into IP or GSE. The output of the pre-processor, which is always IP or GSE, is then fed into the mode adaptation block. For each input IP/GSE stream, the mode adaptation produces a stream of baseband frames (BBFRAMES) that are then carried in a single Physical Layer Pipe (PLP). The SI or IP stream meta-data after due encapsulation in RTP/IP exits the mode adaptation as a common PLP.

The re-combination of a common and data PLP for one service (Multiple PLP) has shown some complexity in T2 implementations, especially on the receiver side, and so is not supported in the NGH system in the same way. There is some linkage signalled for PLPs that are related – the form of relationship is also signalled.

The BICM stage is mainly adopted from T2, but some functional extensions are proposed: A 4k codeword size to allow for reduced decoding complexity and latency is proposed, and lower coderates (below ½) are reintroduced for the 16k and 64k mode to provide more robust code rates. Another feature of the proposed system is that the basic LDPC codewords are extended by using incremental redundancy, which provides an additional parity part that is mapped onto an associated PLP. In case of successful decoding of the basic codeword, the incremental redundancy parity part is neglected in order to significantly save processing power. If, on the other hand, decoding of the basic code word fails, the receiver will include the additional parity blocks to increase the probability of successful decoding. Furthermore, the receiver can predict from previous LDPC block decoding if additional redundancy should be taken into account to provide best possible decoding while minimizing the power consumption. This scalable approach should help to minimize the power consumption of the most processing power intensive stage of a current T2 receiver. The final stage of the BICM is the QAM mapper. QAM constellations from QPSK up to 64-QAM are proposed. Rotated constellations are also adopted from T2. For local service insertion in an SFN, the 'global' service (i.e. operated in an SFN network) uses up to 16-QAM. In the case of 16-QAM the local service will add two low priority bits to each 16-QAM constellation point to produce 64-QAM hierarchical modulation.

After the QAM mapper and the time interleaver (adopted from T2) the MISO/MIMO encoding stage is inserted. Two MISO/MIMO schemes with limited decoding complexity are proposed. Alamouti is a proven technology in T2 that allows MISO decoding but can also be used for MIMO decoding with more than one receive antenna. Alamouti MISO and spatial multiplexing as a full rate MIMO scheme are also proposed, where the number of transmit antennas is limited to two. For spatial multiplexing, serial-to-parallel conversion of one PLP input stream into two output streams is considered. However, it is expected that this (full rate) MIMO works only in a cross-polar transmit antenna environment, since similar reception power levels are required for successful decoding (despite spatial correlation), especially due to the automatic gain control (AGC) at the receiver side. In contrast Alamouti encoding can also be used in a multi-transmitter environment since in Alamouti decoding, the worst case reverts into SISO performance for very different reception power levels or even correlated channels.

Afterwards the signalling PLP (protected by a related BICM stage) is inserted. The NGH framing proposal adopts the concept of Data Slices from DVB-C2 [3]. Within each Data Slice typically several PLPs may be inserted in a time multiplex that allows for an efficient time slicing.

The proposed system supports a variety of different channel bandwidths, ranging from 1.7 MHz to broad 20 MHz-wide channels. It provides for the specific needs of mobile and handheld reception, that is low power consumption and high robustness. It should be noted that the supported bitrates per service are typically just a fraction of the rates for DVB-T2 transmission to roof-top antenna reception scenarios, as the size of a handheld display may not be suitable for viewing high definition multimedia signals.

The proposed system uses band segmentation. The segmentation of the available bandwidth into Data Slices allows for reduced power consumption at the receiver since narrow-band tuners can be employed. If the overall channel bandwidth is partitioned into $n$ segments, the receiver tuner can operate within $1/n$ of the bandwidth, and, more importantly, may apply A/D conversion at an $n$ times slower rate. The concatenation of several data segments or Data Slices means it is possible to utilize a much broader bandwidth (up to 20MHz) efficiently as the guard bands around each channel are used.

Figure 32:
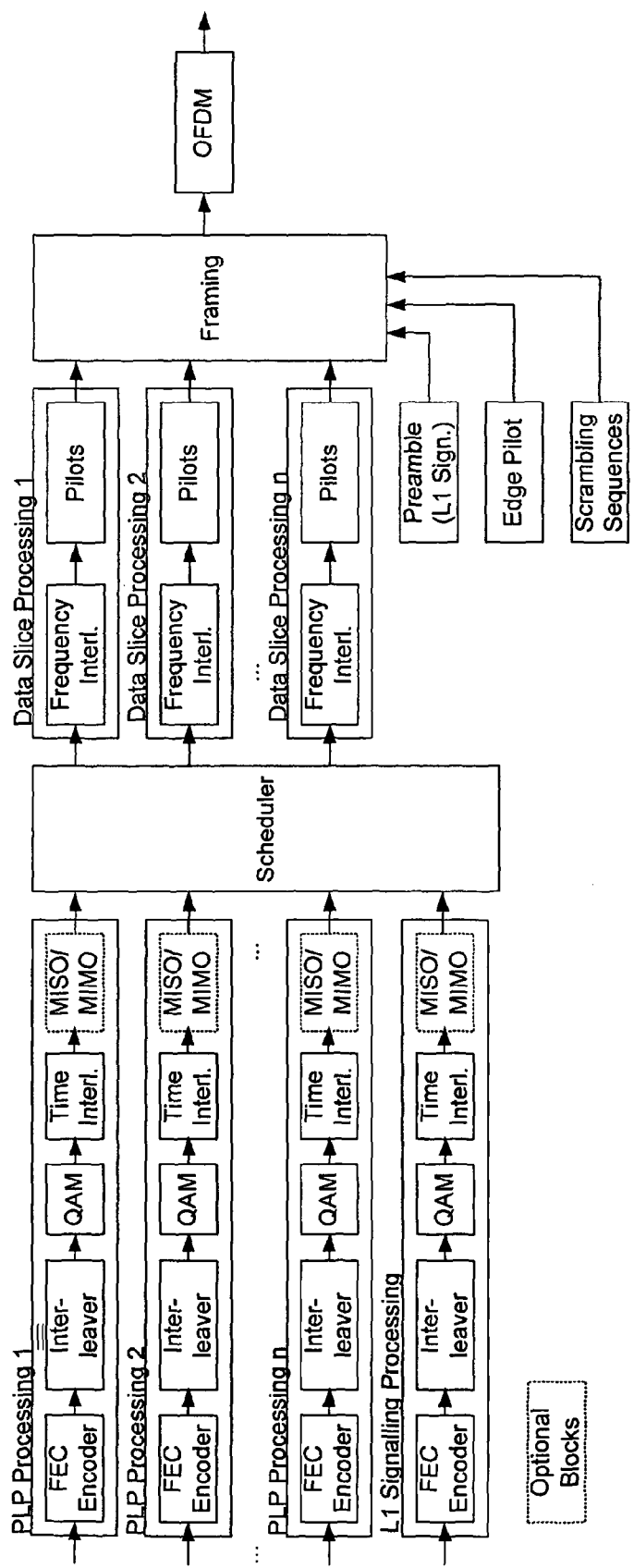
FIG. 32 shows a proposed framing structure block diagram.

The basic block diagram of the framing structure is depicted in Figure 32. The different Data Slices have their own frequency interleaver and pilot insertion. All Data Slices are merged and a preamble (and − in case of combined T2/NGH transmission, a postamble) symbol is added for synchronisation and basic signalling purposes. Finally, the frequency domain values are converted into the time domain by means of the OFDM, and a cyclic prefix is attached.

The concept of 'absolute OFDM' is adopted from DVB-C2 [3]. The L1 signalling blocks in the preamble and postamble symbols begin at the absolute frequency of 0 MHz and are partitioned in steps of 1440 subcarriers. The signal across the different RF frequencies is defined in a unique way for the whole spectrum. It should be noted that the pilot sequences of the OFDM signal are unique for all each frequency. The reason for this is to avoid unwanted repetitions in the frequency domain which may cause unwanted high peak values of the OFDM signal in the time domain. Furthermore the unambiguous pilot sequences allow for easy and reliable synchronization and carrier offset compensation.

Although the L1 block partitioning and the related pilot sequences are defined for the whole RF spectrum, L1 blocks are only transmitted in those frequencies where Data Slices are present.

Figure 33:
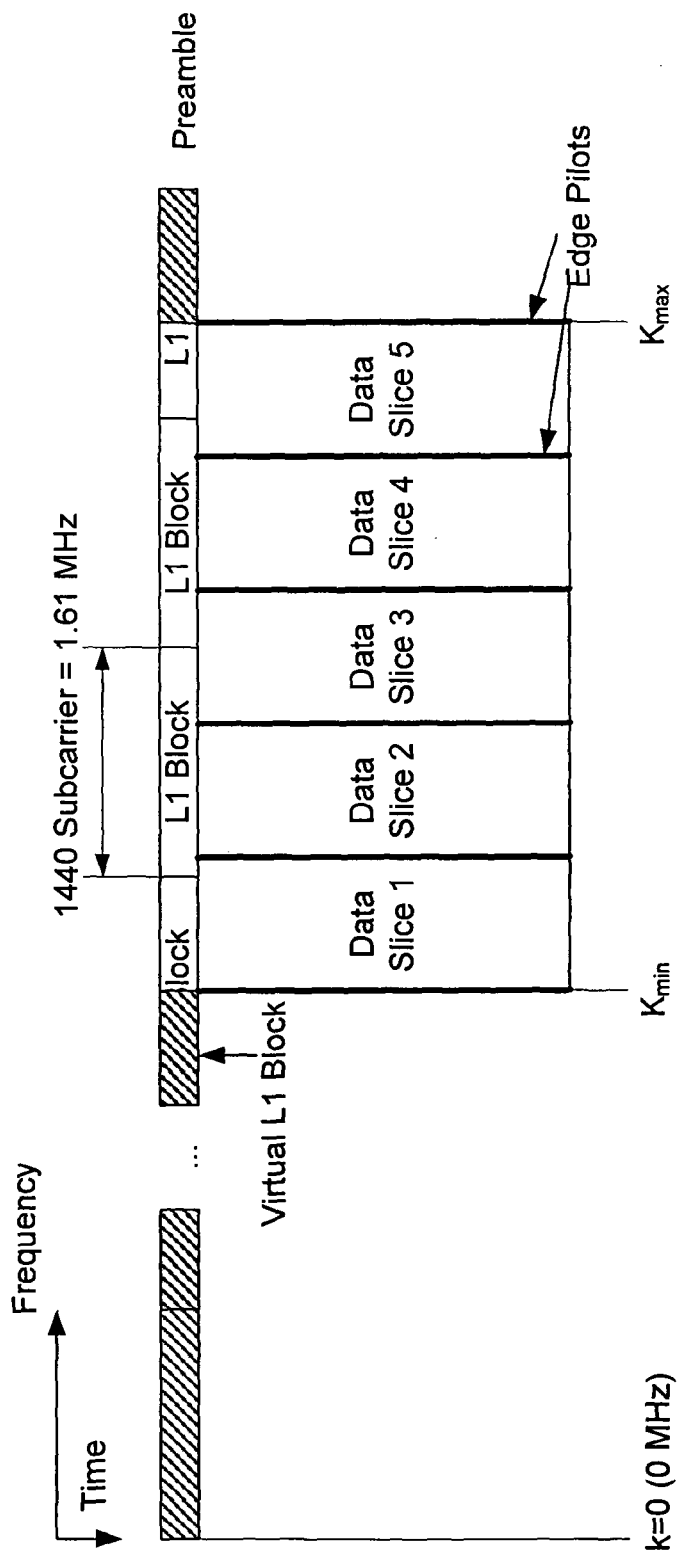
FIG. 33 shows the NGH framing and absolute OFDM.

For carrying NGH frames in T2 FEFs, each FEF begins with the P1 symbol according to the DVB-T2 standard [2] with the related NGH signalling following in the NGH frame preamble symbol. Note that a low power segmented receiver is in general not able to decode the wideband P1 signalling, but T2 receivers know about the occurrence of FEFs. Since the preamble and postamble are repeated every 1440 subcarriers, a segmented receiver will always be able to reconstruct the preamble and postamble completely. The relationship of the preamble and Data Slices is shown in Figure 33.

Figure 34:
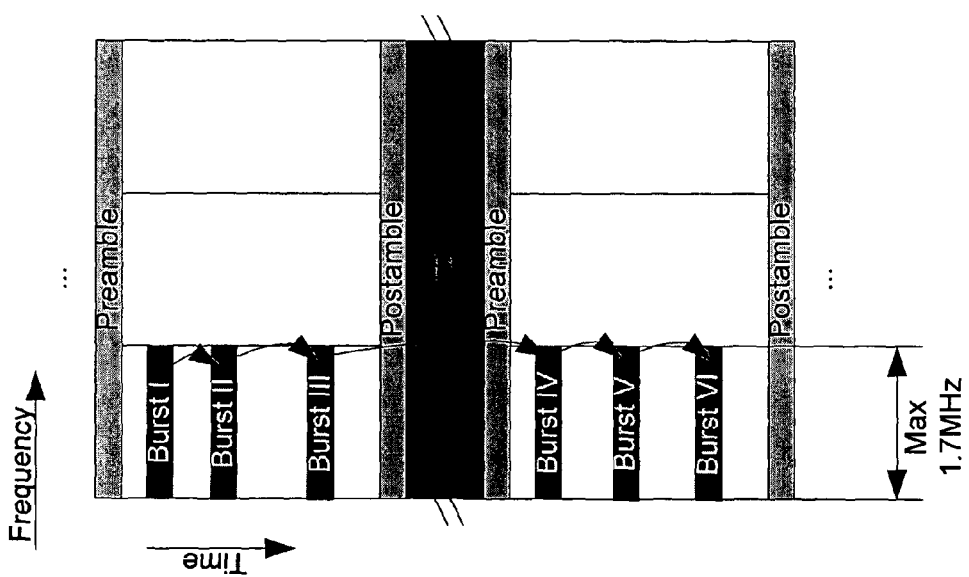
FIG. 34 shows the basic framing format with fixed segments (PLP bursts remain in the same segment)

The proposed NGH framing allows for three different modes. In the first and basic mode, PLPs and associated PLPs remain fixed in one segment, see Figure 34.

Figure 35:
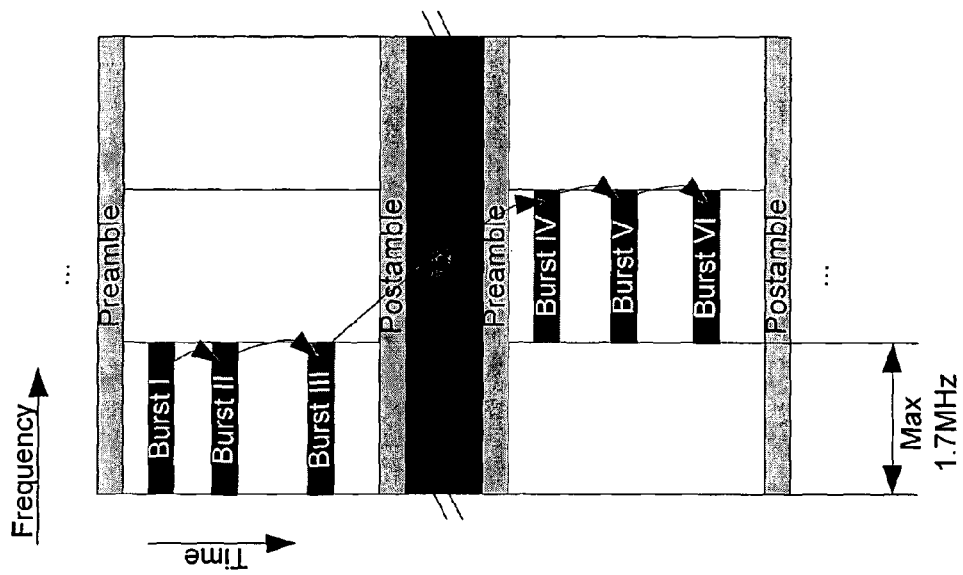
FIG. 35 shows the NGH framing with Data Slice permutation from frame to frame.

In a second framing mode, bursts of a given PLP are located in different Data Slices from NGH frame to NGH frame, which is indicated in Figure 35. This switching of PLP bursts at NGH frame level is to provide increased frequency diversity across the whole NGH system bandwidth without additional complexity and keeping the advantage of a reduced receiver bandwidth. This mode is especially relevant for NGH in FEF transmission, because the interrupting T2 Frames give the receiver time to retune to the next Data Slice.

Figure 36:
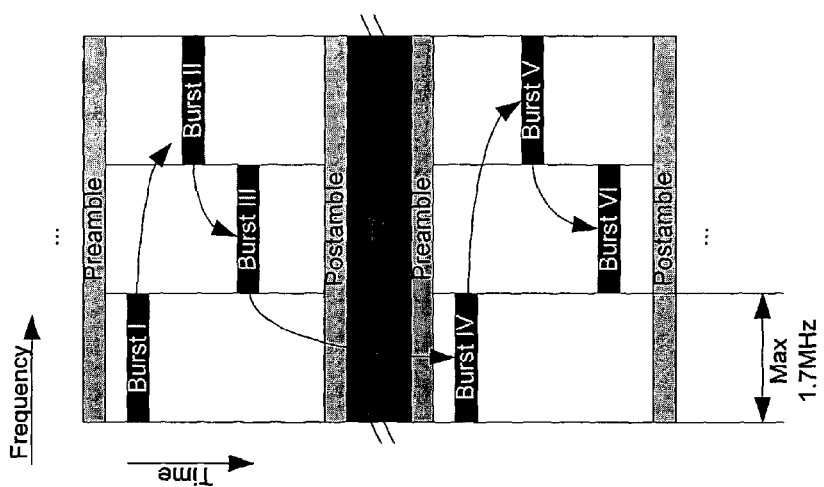
FIG. 36 shows NGH framing with frequency hopping of the PLP bursts.

Finally, a third mode of operation entails a full frequency hopping of PLP bursts between Data Slices. Although most complex as it requires advanced scheduling and large enough transition times for retuning and channel estimation, this mode provides the best possible frequency diversity. Furthermore it can be expected that the NGH framing will consist of several PLPs with rather low bitrates. Scheduling to avoid overlapping of PLPs in different segments as well as sufficient large time gaps between PLP bursts can be accomplished with a reasonable amount of effort. An example for mode 3 can be seen in Figure 36. These three modes of operation can be designated transparently via signalling.

As explained above the overall NGH bandwidth is divided into Data Segments of the same bandwidth. Frequency interleaving is applied to each segment independently. As one major feature of the framing proposal it is possible to use different MIMO operation modes and pilot patterns for each Data Slice. As a result, a mixture of different pilot patterns (e.g. different pilot densities to support different Doppler frequencies) and/or MIMO schemes in the overall NGH signal becomes possible.

For Band III to V the OFDM parameters are derived from the T2 8k FFT size in a sense that the subcarrier spacing of 1.116 kHz is reused. The other channel bandwidths are obtained by changing the number of OFDM subcarriers per Data Slice and concatenating several Data Slices, while keeping the OFDM subcarrier spacing constant.

In the same way for L-Band and S-Band operation the OFDM parameters are derived from the T2 2k FFT size, which leads to a fixed subcarrier spacing of 4.464 kHz for operation in these bands. The higher subcarrier spacing is required to increase the robustness against Doppler shifts, which are linearly dependent on the signal frequency, and hence, more important for operation in these bands.

7 System Description

The following clauses list the detailed technical proposal. In order to reduce the length of the document, references to existing DVB standards are made wherever possible, and only the differences are described.

7.1 Mode Adaptation

The DVB-NGH Commercial Requirements [6] expresses the need for the transmission of both MPEG-2 Transport Streams (TS) and Internet Protocol (IP) streams. This proposal supports both types of streams at the input to the processor. However, the output of the pre-processor is IP streams so the focus in this proposal will be on the transmission of IP streams. It is assumed that for the transmission of MPEG-2 TS, the TS will be encapsulated into RTP and then IP following TS 102 034 [10]. The proposed transmission of the resultant IP is similar to DVB-T2.

7.1.1 MPEG-2 Transport Stream Transmission

Figure 37:
FIG. 37 shows the packet format for IP encapsulation of TS.

The proposed system is principally an IP transport system. Therefore, to carry TS 101 154 compliant MPEG-2 Transport Streams [11], it is required to encapsulate the TS into IP. The content service provider may provide either multi-programme (MPTS) or single programme transport streams (SPTS) to the NGH gateway. SPTS are compliant to TS 101 154 and so can be directly encapsulated with RTP - IP and mapped directly to a PLP. MPTS however must be further split down into SPTS (at the pre-processing stage) prior to RTP-IP encapsulation. Then each SPTS will be carried by a PLP to allow optimisation of physical layer resources such as time interleaver depth over a given service. Encapsulation into IP is done according to TS 102 034 [10] going through RTP, optionally UDP, and then IP. The encapsulation is illustrated in Figure 37 in the case of IPv4. RTP provides the time stamps required for TS packet transport. Many TS packets can be loaded together into each UDP/RTP packet. Thus the more TS packets in a single UDP/RTP packet, the less the redundancy resulting from the IP/RTP/UDP headers. Robust Header Compression (ROHC) [7] can still be used to reduce this even further.

Mode adaptation for each input stream operates in a similar manner to DVB-T2 slicing each IP/GSE stream into data fields to form baseband frames. In addition to carrying SPTS and IP or GSE streams, there may also be a meta-data stream generated for example from the SI information when multiple transport streams have to be transmitted in the system. The meta-data stream can also be generated from cross-navigation information between IP or GSE streams. This meta-data stream is carried in a common PLP.

7.1.2 Internet Protocol Transmission

The transmission of data using the Internet Protocol is seen as the main application of DVB-NGH. The Internet Protocol is the ideal means to cover all possible scenarios, ranging from low bit rate radio transmission to complex scalable video coding (SVC) scenarios. The application of Robust Header Compression (ROHC) [7] reduces the overhead due to the IP transmission, which does not increase the overhead compared to MPEG-2 TS transmission. Furthermore, the application of this protocol allows for the usage of already existing IP stacks, and eases the coexistence with cellular transmission standards, which also take IP as a base.

Figure 38:
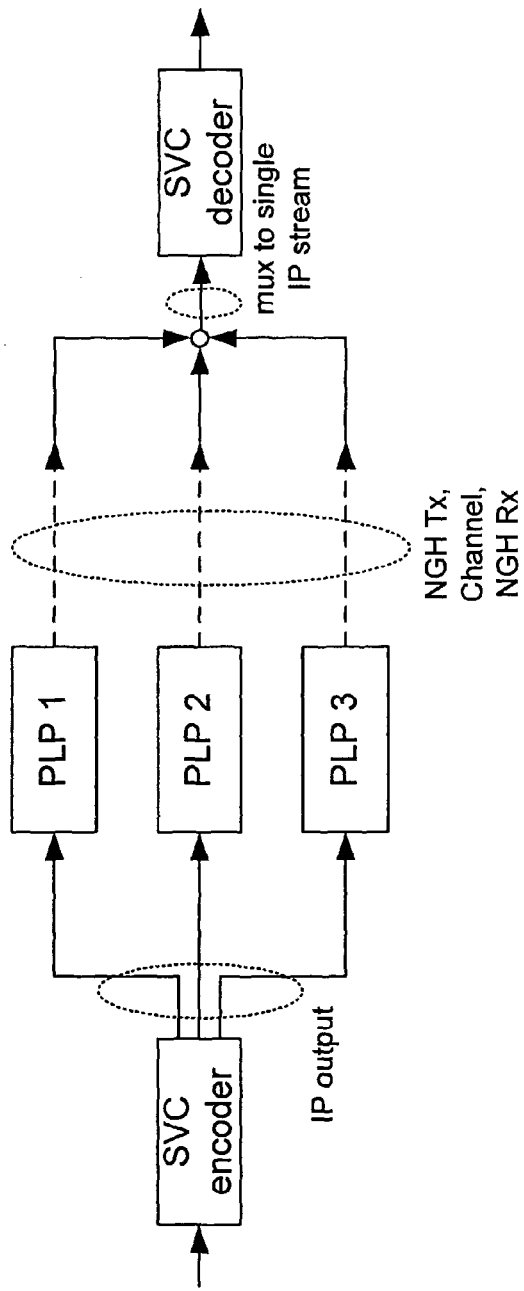
FIG. 38 shows an example of transmission of scalable video coding using the Internet Protocol (each PLP can have a unique robustness)

For the transmission of the IP data, the IP PDUs are encapsulated in GSE and the unidirectional mode of the ROHC is used. The mode adaptation for GSE streams is implemented in the same manner as already standardised in the DVB-T2 standard. Figure 38 shows the flexibility of this approach for the example of transmission of scalable video coding.

The SVC encoder generates three different layers in this example. The three generated output streams are then transmitted via different PLPs, which can have unique robustness by using different ModCod parameters. As these PLPs are signalled as being associated to each other, the scheduler takes care of mapping these three different PLPs in a way that the proposed segmented approach remains possible. Within the receiver, the IP streams of the three different PLPs are simply merged to a single stream, while all synchronisation is left to the Internet Protocol. This reduces the complexity on the physical layer drastically, while it does not increase the complexity on the IP layer, as the mechanisms for the required synchronisation are already implemented in all IP stacks All other possible configurations can be covered in a similar way.

7.2 PLP Processing

The proposed PLP processing is similar to the DVB-T2 standard. Only limited extensions and simplifications are proposed, which are described in the following.

7.2.1 FEC Encoding

The FEC encoding block consists of outer encoding (BCH), inner encoding (LDPC) and bit interleaving. The input stream is composed of BBFRAMEs and the output stream of FECFRAMEs. Each BBFRAME consists of $K_{bch}$ bits and is processed by the FEC encoding subsystem to generate a FECFRAME of length $N_{ldpc}$ bits. The parity check bits of the (systematic) outer BCH code are appended after the BBFRAME, and the parity check bits of the (systematic) inner LDPC encoder are appended after the BCHFEC field. The bit interleaver operates on one complete FECFRAME.

There are three different codeword lengths, $N_{ldpc} \in \{4320, 16200, 64800\}$. The respective codes are referred to as mini, short, or long codes, respectively or simply as 4k, 16k, or 64k code. Note that the 4k codes are a new feature for NGH as they allow for faster, lower power and memory consuming decoding, reduced latencies and faster zapping time.

7.2.1.1 BCH Encoding

The outer BCH encoder appends $N_{bch}$-$K_{bch}$ parity bits to the BBFRAME. Its purpose is to enable the decoder to correct the (remaining few) bit errors after outer LDPC decoding, which may occur due to the error floor behaviour of the LDPC codes, particularly for the higher order modulations (16-QAM, 64-QAM) proposed for DVB-NGH.

BCH encoding is performed according to DVB-S2 [1] for $N_{ldpc}$ = 64800 and 16200. The basic parameters for these FECFRAME sizes are summarized in Table 2 and Table 3. For the new FECFRAME size $N_{ldpc}$ = 4320, BCH codes are newly defined over GF(212) by Table 1 and Table 4.

Table 1: BCH polynomials (for FECFRAME $N_{ldpc}$ = 4 320)

| | |
|---|---|
| $g_1(x)$ | $1+x+x^4+x^6+x^{12}$ |
| $g_2(x)$ | $1+x+ x^3+x^4+x^6+x^{10}+x^{12}$ |
| $g_3(x)$ | $1+x^2+x^3+x^6+x^{12}$ |
| $g_4(x)$ | $1+x+x^3+ x^5+x^6+x^{10}+x^{12}$ |
| $g_5(x)$ | $1+x^2+x^4+x^5+x^6+x^7+x^8+x^9+x^{12}$ |
| $g_6(x)$ | $1+x+ x^2+ x^5+x^7+x^8+x^9+x^{11}+x^{12}$ |
| $g_7(x)$ | $1+x+x^3+x^6+x^8+x^{10}+x^{12}$ |
| $g_8(x)$ | $1+x+ x^2+ x^3+x^4+x^5+x^9+x^{10}+x^{12}$ |
| $g_9(x)$ | $1+x+x^3+x^4+x^6+x^8+x^{10}+x^{11}+x^{12}$ |
| $g_{10}(x)$ | $1+x+x^2+x^5+x^{10}+x^{11}+x^{12}$ |
| $g_{11}(x)$ | $1+x^2+x^4+x^5+x^{12}$ |
| $g_{12}(x)$ | $1+x^2+x^3+x^9+x^{12}$ |

Table 2: Coding parameters (for FECFRAME $N_{ldpc}$ = 64 800)

Table 3: Coding parameters (for FECFRAME $N_{ldpc} = 16\,200$)

| LDPC code | BCH uncoded Block $K_{bch}$ | BCH coded block $N_{bch}$ LDPC uncoded Block $K_{ldpc}$ | BCH t-error correction | $N_{bch}-K_{bch}$ |
|---|---|---|---|---|
| 1/4 | 16 008 | 16 200 | 12 | 192 |
| 1/3 | 21 408 | 21 600 | 12 | 192 |
| 2/5 | 25 728 | 25 920 | 12 | 192 |
| 1/2 | 32 208 | 32 400 | 12 | 192 |
| 3/5 | 38 688 | 38 880 | 12 | 192 |
| 2/3 | 43 040 | 43 200 | 10 | 160 |
| 3/4 | 48 408 | 48 600 | 12 | 192 |
| 4/5 | 51 648 | 51 840 | 12 | 192 |
| 5/6 | 53 840 | 54 000 | 10 | 160 |

Table 4: Coding parameters (for FECFRAME $N_{ldpc} = 4\,320$)

| LDPC code identifier | BCH uncoded Block $K_{bch}$ | BCH coded block $N_{bch}$ LDPC uncoded Block $K_{ldpc}$ | BCH t-error correction | $N_{bch}-K_{bch}$ |
|---|---|---|---|---|
| 1/4 | 3072 | 3240 | 12 | 168 |
| 1/3 | 5232 | 5400 | 12 | 168 |
| 2/5 | 6312 | 6480 | 12 | 168 |
| 1/2 | 7032 | 7200 | 12 | 168 |
| 3/5 | 9552 | 9720 | 12 | 168 |
| 2/3 | 10 632 | 10 800 | 12 | 168 |
| 3/4 | 11 712 | 11 880 | 12 | 168 |
| 4/5 | 12 432 | 12 600 | 12 | 168 |

| LDPC code identifier | BCH uncoded Block $K_{bch}$ | BCH coded block $N_{bch}$ LDPC uncoded Block $K_{ldpc}$ | BCH t-error correction | $N_{bch}-K_{bch}$ |
|---|---|---|---|---|
| 1/4 | 936 | 1 080 | 12 | 144 |
| 1/3 | 1 296 | 1 440 | 12 | 144 |
| 5/12 | 1 656 | 1 800 | 12 | 144 |
| 1/2 | 2 016 | 2 160 | 12 | 144 |
| 7/12 | 2 376 | 2 520 | 12 | 144 |
| 2/3 | 2 736 | 2 880 | 12 | 144 |
| 3/4 | 3 096 | 3 240 | 12 | 144 |

7.2.1.2 LDPC encoding

Table 6 summarizes for all codeword lengths and all code rates for which LDPC encoding is defined. In this table S2 and T2 represent the DVB-S2 [1] and DVB-T2 [2] standards, respectively, and the entry NGH indicates that the code is defined in this document, see Table 39- Table 45 in the Annex. Mini LDPC codes have the same structure as other codes of the DVB-family, namely a quasi-cyclic structure in the information part and a staircase structure in the parity part. The code rate dependent constants $Q_{ldpc}$ for mini codes are specified in Table 5.

Table 5: q values for mini (4k) LDPC codes

| Code Rate | $Q_{ldpc}$ |
|---|---|
| 1/4 | 9 |
| 1/3 | 8 |
| 5/12 | 7 |
| 1/2 | 6 |
| 7/12 | 5 |
| 2/3 | 4 |
| 3/4 | 3 |

Table 6: Summary of FEC settings

| Mini codes (4k) | | | Short codes (16k) | | | Long codes (64k) | | |
|---|---|---|---|---|---|---|---|---|
| LDPC code identifier | LDPC code rate | FEC acc. to | LDPC code identifier | LDPC code rate | FEC acc. to | LDPC code identifier | LDPC code rate | FEC acc. to |
| 1/4 | 1/4 | NGH | 1/4 | 1/5 | S2 | 1/4 | 1/4 | S2 |
| 1/3 | 1/3 | NGH | 1/3 | 1/3 | S2 | 1/3 | 1/3 | S2 |
| 5/12 | 5/12 | NGH | 2/5 | 2/5 | S2 | 2/5 | 2/5 | S2 |
| 1/2 | 1/2 | NGH | 1/2 | 4/9 | S2 | 1/2 | 1/2 | S2 |
| 7/12 | 7/12 | NGH | 3/5 | 3/5 | T2 | 3/5 | 3/5 | S2 |
| 2/3 | 2/3 | NGH | 2/3 | 2/3 | S2 | 2/3 | 2/3 | T2 |
| 3/4 | 3/4 | NGH | 3/4 | 11/15 | S2 | 3/4 | 3/4 | S2 |
| - | - | - | 4/5 | 7/9 | S2 | 4/5 | 4/5 | S2 |

7.2.1.3 Bit Interleaver

Figure 39:
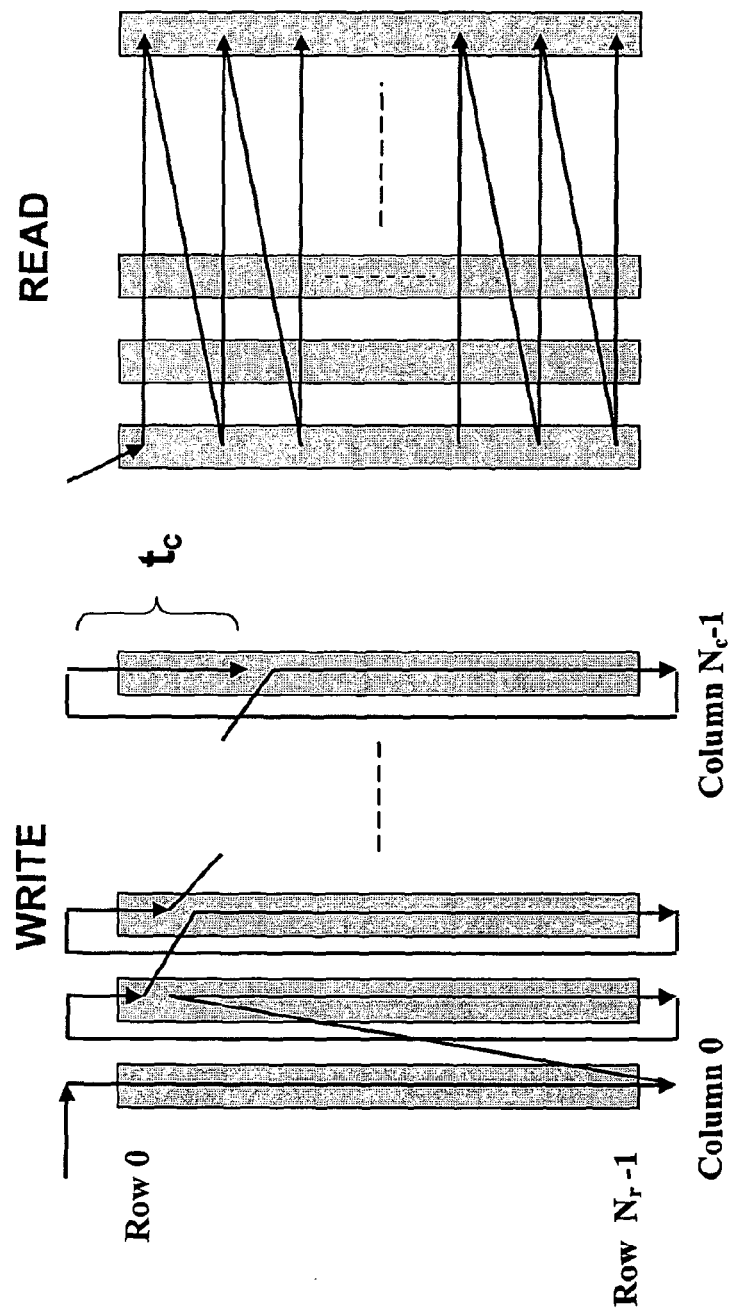
FIG. 39 shows a bit interleaving scheme.

A bit interleaver (see Fig. 39) is employed to optimize assignments between LDPC code bits and bit labels of Gray mapped QAM symbols. As in DVB-T2 [2], it is proposed to consist of a block interleaver and a de-multiplexer.

In the block interleaver part, the output of the LDPC encoder is parity interleaved first and then stored into a memory consisting of Nc columns and Nr rows. The data are written column by column with column twisting offset tc and are read row by row.

The output $N_c$-tuple $\{b_{0,r}, b_{1,r}, b_{2,r}, ..., b_{N_c-1,r}\}$ with respect to the r-th row is permuted into $\{y_{0,r}, y_{1,r}, y_{2,r}, ..., y_{N_c-1,r}\}$ in the de-multiplexer part, where each of the $\eta_{mod}$ bits belongs to a $2^{\eta_{mod}}$-QAM symbol.

QPSK, 16-QAM, and 64-QAM are proposed for broadcasting services. The necessary parameters for the bit interleaver and the de-multiplexer part are shown in Table 7 - Table 14.

Table 7: Bit interleaver structure (16- and 64-QAM)

| Modulation | Rows $N_r$ | | | Columns $N_c$ |
|---|---|---|---|---|
| | $N_{ldpc}$ = 64 800 | $N_{ldpc}$ = 16 200 | $N_{ldpc}$ = 4 320 | |
| 16-QAM | 8 100 | 2 025 | 540 | 8 |
| 64-QAM | 5 400 | 1 350 | 360 | 12 |

Table 8: Column twisting parameter $t_c$ (16- and 64-QAM)

| Modulation | Columns $N_c$ | $N_{ldpc}$ | Twisting parameter $t_c$ | | | | | | | | | | | |
|---|---|---|---|---|---|---|---|---|---|---|---|---|---|---|
| | | | Col. 0 | 1 | 2 | 3 | 4 | 5 | 6 | 7 | 8 | 9 | 10 | 11 |
| 16-QAM | 8 | 64800 | 0 | 0 | 2 | 4 | 4 | 5 | 7 | 7 | - | - | - | - |
| | | 16200 | 0 | 0 | 0 | 1 | 7 | 20 | 20 | 21 | - | - | - | - |
| | | 4320 | 0 | 8 | 10 | 10 | 25 | 54 | 62 | 69 | - | - | - | - |
| 64-QAM | 12 | 64800 | 0 | 0 | 2 | 2 | 3 | 4 | 4 | 5 | 5 | 7 | 8 | 9 |
| | | 16200 | 0 | 0 | 0 | 2 | 2 | 2 | 3 | 3 | 3 | 6 | 7 | 7 |
| | | 4320 | 0 | 2 | 10 | 12 | 15 | 17 | 20 | 21 | 23 | 25 | 26 | 30 |

Table 9: Parameters for de-multiplexing of bits to cells for rate 1/4, 1/3, and 2/5 (for $N_{ldpc} = 64\,800$)

| Modulation format | 16-QAM | | | | | | | |
|---|---|---|---|---|---|---|---|---|
| Input bit-number, $i$ for $b_{i,r}$ | 0 | 1 | 2 | 3 | 4 | 5 | 6 | 7 |
| Output bit-number, $j$ for $y_{j,}$ — 1/4, 1/3, 2/5 | 7 | 6 | 0 | 2 | 1 | 3 | 4 | 5 |
| Output bit-number, $j$ for $y_{j,}$ — 1/2, 3/5, 2/3, 3/4, 4/5 | 7 | 1 | 4 | 2 | 5 | 3 | 6 | 0 |

Table 10: Parameters for de-multiplexing of bits to cells for $N_{ldpc} = 64\,800$, 64-QAM

| Modulation format | | 64-QAM | | | | | | | | | | |
|---|---|---|---|---|---|---|---|---|---|---|---|---|
| Input bit-number, $i$ for $b_{i,r}$ | | 0 | 1 | 2 | 3 | 4 | 5 | 6 | 7 | 8 | 9 | 10 | 11 |
| Output bit-number, $j$ for $y_{j,}$ | 1/4 | 11 | 10 | 5 | 4 | 2 | 6 | 3 | 8 | 7 | 1 | 9 | 0 |
| | 1/3 | 5 | 11 | 4 | 10 | 3 | 9 | 2 | 8 | 1 | 7 | 0 | 6 |
| | 2/5 | 2 | 8 | 4 | 10 | 5 | 0 | 11 | 6 | 3 | 1 | 9 | 7 |
| | 1/2, 3/5, 2/3, 3/4, 4/5 | 11 | 7 | 3 | 10 | 6 | 2 | 9 | 5 | 1 | 8 | 4 | 0 |

Table 11: Parameters for de-multiplexing of bits to cells for $N_{ldpc} = 16\,200$, 16-QAM

| Modulation format | | 16-QAM | | | | | | | |
|---|---|---|---|---|---|---|---|---|---|
| Input bit-number, $i$ for $b_{i,r}$ | | 0 | 1 | 2 | 3 | 4 | 5 | 6 | 7 |
| Output bit-number, $j$ for $y_{j,}$ | 1/4, 1/3 | 6 | 7 | 2 | 5 | 4 | 3 | 1 | 0 |
| | 2/5 | 6 | 7 | 4 | 3 | 5 | 2 | 1 | 0 |
| | 1/2, 2/3, 3/4, 4/5 | 6 | 7 | 2 | 3 | 5 | 4 | 1 | 0 |
| | 3/5 | 7 | 3 | 1 | 5 | 2 | 6 | 4 | 0 |

Table 12: Parameters for de-multiplexing of bits to cells for $N_{ldpc} = 16\,200$, 64-QAM

| Modulation format | | 64-QAM | | | | | | | | | | |
|---|---|---|---|---|---|---|---|---|---|---|---|---|
| Input bit-number, $i$ for $b_{i,r}$ | | 0 | 1 | 2 | 3 | 4 | 5 | 6 | 7 | 8 | 9 | 10 | 11 |
| Output bit-number, $j$ for $y_{j,}$ | 1/4, 1/3 | 11 | 10 | 2 | 3 | 4 | 5 | 6 | 7 | 8 | 9 | 1 | 0 |
| | 1/2, 2/3, 3/4, 4/5 | 11 | 10 | 2 | 4 | 3 | 5 | 6 | 7 | 9 | 8 | 1 | 0 |
| | 2/5, 3/5 | 11 | 7 | 3 | 10 | 6 | 2 | 9 | 5 | 1 | 8 | 4 | 0 |

Table 13: Parameters for de-multiplexing of bits to cells for $N_{ldpc} = 4\,320$, 16-QAM

| Modulation format | | 16-QAM | | | | | | | |
|---|---|---|---|---|---|---|---|---|---|
| Input bit-number, $i$ for $b_{i,r}$ | | 0 | 1 | 2 | 3 | 4 | 5 | 6 | 7 |
| Output bit-number, $j$ for $y_j$ | 1/4 1/3 1/2 | 7 | 6 | 4 | 3 | 2 | 5 | 1 | 0 |
| | 5/12 7/12 2/3 3/4 | 0 | 4 | 2 | 6 | 1 | 5 | 3 | 7 |

Table 14: Parameters for de-multiplexing of bits to cells for $N_{ldpc} = 4\,320$, 64QAM

| Modulation format | | 64-QAM | | | | | | | | | | | |
|---|---|---|---|---|---|---|---|---|---|---|---|---|---|
| Input bit-number, $i$ for $b_{i,r}$ | | 0 | 1 | 2 | 3 | 4 | 5 | 6 | 7 | 8 | 9 | 10 | 11 |
| Output bit-number, $j$ for $y_j$ | 1/4 | 11 | 10 | 4 | 5 | 2 | 3 | 8 | 9 | 6 | 7 | 1 | 0 |
| | 1/3 5/12 1/2 7/12 | 0 | 11 | 1 | 10 | 4 | 8 | 2 | 9 | 3 | 7 | 5 | 6 |
| | 2/3 3/4 | 2 | 8 | 5 | 11 | 0 | 6 | 1 | 10 | 4 | 9 | 3 | 7 |

7.2.1.4 Incremental Redundancy

7.2.1.4.1 Introduction of incremental redundancy

As a new feature, the application of incremental redundancy (IR) is proposed. Existing LDPC codes of FECFRAME length $N_{ldpc} = 16\,200$ as well as the newly proposed mini codes are extended, such that the new codeword consists of the original codeword (basic FEC) and $M_{IR}$ additional parity bits to be used as IR. The new codeword length is thus $N_{ldpc,1} = N_{ldpc} + M_{IR}$. The LDPC encoding with IR can be thought of as one encoder of code rate $R_1 = K_{ldpc}/N_{ldpc,1}$, where the output is split into a basic FEC and an IR part. Both parts are treated as two associated PLPs, see Figure 31.

Figure 40:
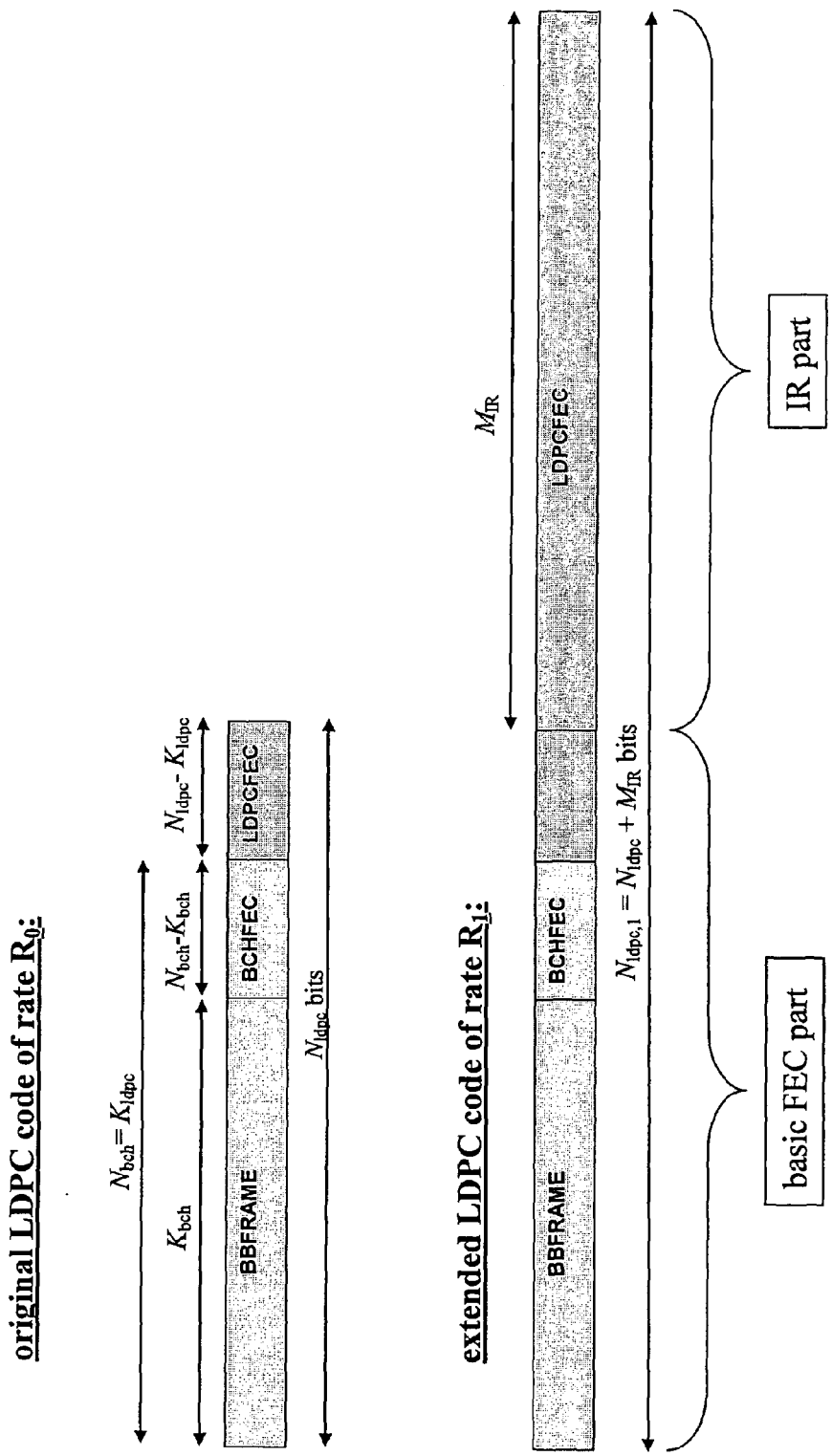
FIG. 40 shows extended LDPC encoding for IR.

The relationship between original codeword and extended codeword can be seen in Figure 40. The upper part depicts conventional FEC encoding according to, e.g., DVB-T2 [2], where the input to the LDPC encoder of code rate $R_0 = K_{ldpc}/N_{ldpc}$ are the $K_{ldpc}$ output bits of the BCH encoder, while its output is a systematic codeword of length $N_{ldpc}$. The last $N_{ldpc} - K_{ldpc}$ bits of this codeword are the LDPC parity bits. If a PLP applies IR, then an extended LDPC encoder of code rate $R_1 = K_{ldpc}/N_{ldpc,1} < R_0$ is used, which has the same input as for conventional encoding, but outputs $N_{ldpc,1} = N_{ldpc} + M_{IR}$ bits, i.e., that amount of LDPC parity bits is increased to $N_{ldpc} - K_{ldpc} + M_{IR}$. However, the first $N_{ldpc} - K_{ldpc}$ parity bits thereof are identical to the parity bits of the original LDPC encoder of rate $R_0$. The codeword is split into two parts: the first $N_{ldpc}$ bits are the *basic FEC part*, while the remaining $M_{IR}$ bits are the *IR part* to be used as IR at the receiver, if necessary.

Thus, it is ensured that decoding of the received codeword is possible (for good channel conditions) with a rate $R_0$ decoder, which considers just the basic FEC part, while the extended codeword – consisting of both basic FEC *and* IR part, allows for decoding with a rate $R_1$ decoder.

Figure 41:
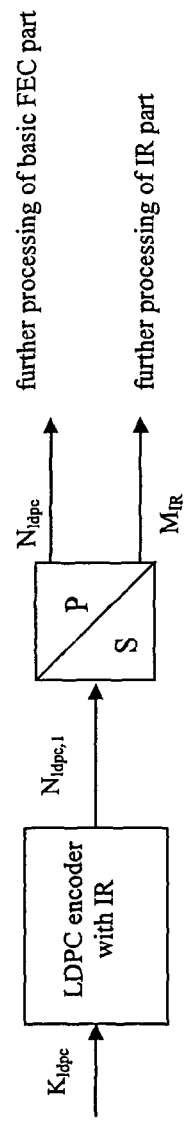
FIG. 41 shows an LDPC encoder with basic FEC and IR part.

The separation of one FECFRAME, which uses IR, into a basic FEC and an IR part is shown in Figure 41. The encoded bits of both streams are further processed by independent instances of bit interleavers, de-multiplexer parts, and so on, as depicted in Figure 40 for a particular PLP. Thus, it is possible to increase the robustness of the basic FEC part by applying a low order QAM constellation for this part.

The scheduler will allocate the bursts of the basic FEC part at earlier time instances than the bursts of the corresponding IR part. If the receiver wants to decode a PLP that uses IR, it has to demodulate at least the basic FEC part, which corresponds to the output of the original encode of rate $R_0 = K_{ldpc}/N_{ldpc} > R_1$. If decoding fails, due to difficult channel conditions, it can, in addition, demodulate the IR part, which – together with the basic FEC part, builds the codeword of length $N_{ldpc,1}$. However, the decoder has to switch to a new parity check matrix according to the code of (smaller) code rate $R_1$, where successful decoding is more likely, as the decoding threshold of the extended code is much smaller than that of the original code.

Note that the main advantage of IR (compared to applying a low code rate $R_1$ without IR in the first place) is that the IR part can be ignored by the receiver unless it is needed. If, e.g., $R_1 = 1/2*R_0$, a conventional approach would apply the rate $R_1$ code, which limits the throughput of the data by a factor of 2. So, twice as many bursts have to be detected by a receiver for a given data rate, compared to the case, when, due to favourable channel conditions, transmission would be possible with a rate $R_0$ code. Applying IR, however, would allow the receiver to fall into sleep-mode, whenever IR bursts are transmitted, if decoding of the basic FEC part is possible and/or was successful. This enables the receiver to operate longer under good channel conditions.

7.2.1.4.2 Extended LDPC encoding for incremental redundancy

The amount of IR bits shall be as large as the FECFRAME length itself, thus: $M_{IR} = N_{ldpc}$, which results in halving of the original code rate, $R_1 = 1/2*R_0$. We propose IR for the short codes ($N_{ldpc} = 16\ 200$) for the following code identifiers:

$R_0 \in \{1/2, 3/5, 2/3, 3/4, 4/5\}$, i.e. for all proposed short codes, except the 1/4 and 1/3 code (identifier). Furthermore, IR is also proposed for the newly introduced mini codes ($N_{ldpc} = 4\ 320$) for the following codes:

$R_0 \in \{1/2, 7/12, 2/3, 3/4\}$.

For the above mentioned LDPC codes, in the following denoted as *original code* of rate $R_0$, an *extended code* of rate $R_1 = 1/2*R_0$ is derived by setting $M_{IR} = N_{ldpc}$ in this subchapter.

The extended LDPC encoder treats the output of the outer BCH encoding, $I = (i_0, i_1, ..., i_{K_{ldpc}-1})$, as an information block of size $K_{ldpc} = N_{BCH}$, and systematically encodes it onto a codeword $\Lambda$ of size $N_{ldpc,1} = N_{ldpc} + M_{IR}$, where:

$$\Lambda = (\lambda_0, \lambda_1, \lambda_2, ..., \lambda_{N_{ldpc,1}-1}) = (i_0, i_1, ..., i_{K_{ldpc}-1}, p_0, p_1, ... p_{N_{ldpc,1}-K_{ldpc}-1}).$$

The following encoding procedure ensures that the first bits of the extended codeword $\lambda_i$, for $i \in \{0,..., N_{ldpc} - K_{ldpc} -1\}$ are the same as if the original LDPC code would have been used.

The task of the encoder is to determine $N_{ldpc,1} - K_{ldpc}$ parity bits $(p_0, p_1, ..., p_{N_{ldpc,1}-K_{ldpc}-1})$ for every block of $K_{ldpc}$ information bits, $(i_0, i_1, ..., i_{K_{ldpc}-1})$. The procedure is as follows:

- Initialize $p_0 = p_1 = p_2 = ... = p_{N_{ldpc,1}-K_{ldpc}-1} = 0$

- Accumulate the first information bit, $i_0$, at parity bit addresses specified in the first row of Table 46 through Table 54. For example, for the 16k rate 4/5 (see Table 43), (all additions are in GF(2)):

$p_5 = p_5 \oplus i_0$　　　　　$p_{7092} = p_{7092} \oplus i_0$　　　　　$p_{13423} = p_{13423} \oplus i_0$ $p_{896} = p_{896} \oplus i_0$　　　　$p_{7119} = p_{7119} \oplus i_0$　　　　$p_{15147} = p_{15147} \oplus i_0$ $p_{1565} = p_{1565} \oplus i_0$　　　$p_{7737} = p_{7737} \oplus i_0$　　　　$p_{15236} = p_{15236} \oplus i_0$ $p_{3976} = p_{3976} \oplus i_0$　　　$p_{9989} = p_{9989} \oplus i_0$　　　　$p_{18042} = p_{18042} \oplus i_0$ $p_{5177} = p_{5177} \oplus i_0$　　　$p_{10690} = p_{10690} \oplus i_0$　　　$p_{18646} = p_{18646} \oplus i_0$ $p_{5570} = p_{5570} \oplus i_0$　　　$p_{11608} = p_{11608} \oplus i_0$　　　$p_{18943} = p_{18943} \oplus i_0$ $p_{6450} = p_{6450} \oplus i_0$　　　$p_{12337} = p_{12337} \oplus i_0$ Note that the first three parity addresses (all smaller than $N_{ldpc} - K_{ldpc} = 3240$) are the same as defined in DVB-S2 for the 16k code of rate 4/5, while the remaining addresses are according to the extended LDPC code and are written in bold numbers in the Annex Table 50.

- For the next 359 information bits, $i_m, m = 1, 2, ..., 359$ accumulate $i_m$ at parity bit addresses $$\{x + m \mod 360 \times Q_{ldpc}\} \mod (N_{ldpc} - K_{ldpc}) \quad \text{if} \quad x < N_{ldpc} - K_{ldpc}$$

$$N_{ldpc} - K_{ldpc} + \{x + m \mod 360 \times Q_{IR}\} \mod M_{IR} \quad \text{if} \quad x \geq N_{ldpc} - K_{ldpc}$$

where $x$ denotes the address of the parity bit accumulator corresponding to the first bit $i_0$, $Q_{ldpc}$ is a code rate dependent constant specified for the original LDPC codes in [1,2] and $Q_{IR} = M_{IR}/360 = 45$ for the 16k codes and $Q_{IR} = 12$ for the 4k codes. The positions x, which are larger than or equal to $N_{ldpc} - K_{ldpc}$ are written in bold numbers in the tables in the Annex 13.3 and 13.4.

Note that this approach leaves the basic FEC as the original code, adds $M_{IR}$ more parity checks, and maintains the quasi-cyclic LDPC structure for both basic and IR part. However, the quasi-cyclic structure is interrupted after the first $N_{ldpc} - K_{ldpc}$ rows of the parity check matrix. But as this is a multiple of 360 (namely $Q_{ldpc}$), blockwise decoding based on 360 bit groups can still be applied.

- In a similar manner, for every group of 360 new information bits, a new row from Table 46 through Table 54 is used to find the addresses of the parity bit accumulators.

After all of the information bits are exhausted, the final parity bits are obtained as follows:

- Sequentially perform the following operations starting with $i = 1$.

$$p_i = p_i \oplus p_{i-1}, \quad i = 1, 2, ..., N_{ldpc,1} - K_{ldpc} - 1$$

- Final content of $p_i, i = 0, 1, ..., N_{ldpc,1} - K_{ldpc} - 1$ is equal to the parity bit $p_i$.

7.2.1.4.3 Example of extended LDPC code

Figure 42:
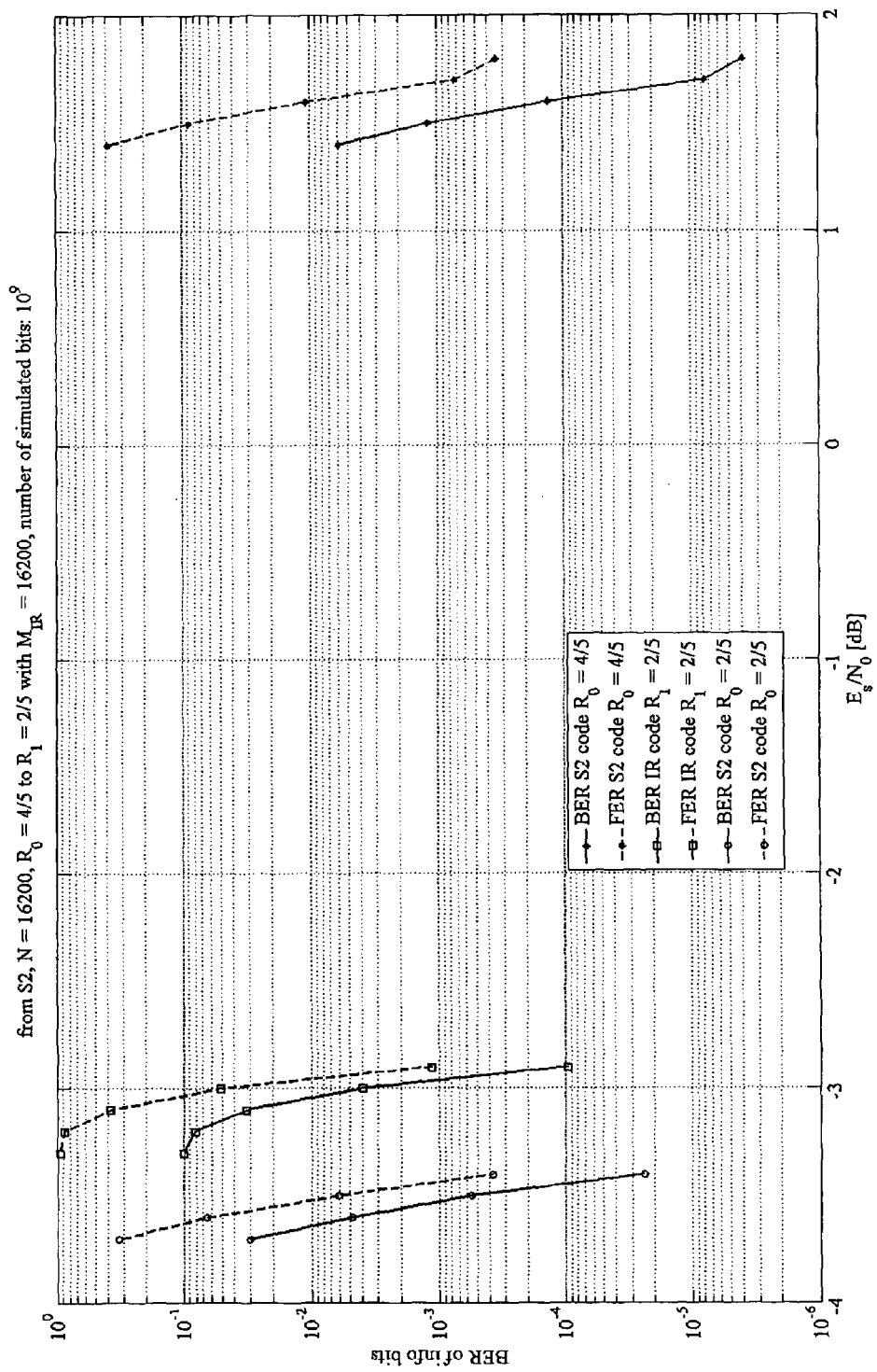
FIG. 42 shows the performance of extended LDPC code over AWGN channel.

The bit and frame error rates (BER and FER) over SNR performance of an extended LDPC code over the (non-fading) AWGN channel is depicted in Figure 42. The original code is the rate $R_0 = 4/5$ code of DVB-S2 [1] of length $N_{ldpc} = 16200$, the extended code has code rate $R_1 = 2/5$. The decoding threshold (or pinch-off limit) of the original 4/5 code from DVB-S2 is at about 1.7 dB. The rate 2/5 code from DVB-S2 of the same length, $N_{ldpc} = 16200$, has its limit at -3.4 dB. The extended LDPC code of the same code rate ($R_1=2/5$) has its threshold at -2.9 dB. The number of simulated information bits was $10^9$. While the rate 4/5 code of S2 shows some error floor behaviour after the decoding threshold, no errors could be detected for the other two codes in the simulated $10^9$ bits.

If the SNR at the receiver exceeds 1.7 dB, it can decode the original rate 4/5 code, which also corresponds to the basic FEC part of the extended LDPC code. In this case, the IR part could be neglected, which yields a reduction in processing power by a factor of 2 (as half of the bursts belonging to this PLP are from the IR part). If the SNR decreases, the receiver can demodulate the IR part and thus has a margin of additional 4.6 dB. In terms of coding gain (difference in $E_b/N_0$) this corresponds to 1.6 dB gain, as the code rate is halved.

It shall be noted that it is also possible to design new LDPC codes, which can be partitioned into a basic FEC and an IR part. As the FEC part of these newly designed codes does not have to match the existing (standardized) LDPC codes of the DVB family, the resulting coding gains of the IR part will be even larger than those of the proposed codes in this document. Furthermore, it is also possible to extend LDPC codes with a different number of additional parity bits, $M_{IR}$, or to allow for more than one IR part. The partitioning into several IR parts would enable the receiver to estimate the amount of additional parity portions which are required for successful decoding.

7.2.2 Mapping Bits onto Constellations

Each FECFRAME (which is a sequence of 64800 bits for long, 16200 bits for short and 4320 for the mini FECFRAME), is mapped to a coded and modulated FEC block by first de-multiplexing the input bits into parallel cell words and then mapping these cell words into constellation values. The number of output data cells and the effective number of bits per cell $\eta_{MOD}$ is defined by Table 15. De-multiplexing is performed according to clause 7.2.2.1 and constellation mapping is performed according to clause 7.2.3.2.

Table 15: Parameters for bit-mapping into constellations

| LDPC block length ($N_{ldpc}$) | Modulation mode | $\eta_{MOD}$ | Number of output data cells |
|---|---|---|---|
| 64 800 | 64-QAM | 6 | 10800 |
| | 16-QAM | 4 | 16200 |
| | QPSK | 2 | 32400 |
| 16 200 | 64-QAM | 6 | 2700 |
| | 16-QAM | 4 | 4050 |
| | QPSK | 2 | 8100 |
| 4320 | 64-QAM | 6 | 720 |
| | 16-QAM | 4 | 1080 |
| | QPSK | 2 | 2160 |

7.2.2.1 Bit to cell word de-multiplexer

Figure 43:
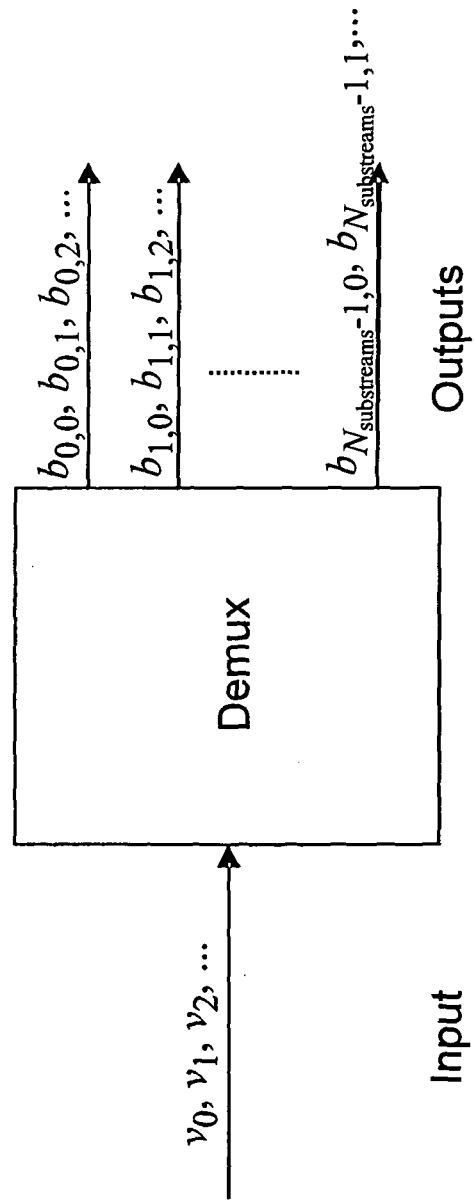
FIG. 43 shows de-multiplexing of bits into sub-streams.

The bit-stream $v_{di}$ from the bit interleaver is de-multiplexed into $N_{substreams}$ sub-streams, as shown in Figure 43. The value of $N_{substreams}$ is defined in Table 16.

Table 16: Number of sub-streams in de-multiplexer

| Modulation | $N_{ldpc}$ | Number of sub-streams, $N_{substreams}$ |
|---|---|---|
| QPSK | Any | 2 |
| 16-QAM | Any | 8 |
| 64-QAM | Any | 12 |

The de-multiplexing is defined as a mapping of the bit-interleaved input bits, $v_{di}$ onto the output bits $b_{e,do}$, where:

do =      di div $N_{substreams}$;

e      is the de-multiplexed bit substream number ($0 \leq e < N_{substreams}$), which depends on di as defined in Table 17;

$v_{di}$      is the input to the de-multiplexer;

di      is the input bit number;

$b_{e,do}$      is the output from the de-multiplexer;

do      is the bit number of a given stream at the output of the de-multiplexer.

Table 17: Parameters for de-multiplexing of bits to sub-streams for code rates 1/2, 3/4, and 4/5

| Modulation format | QPSK | | | | | | | | | | | |
|---|---|---|---|---|---|---|---|---|---|---|---|---|
| Input bit-number, $d_i$ mod $N_{substreams}$ | 0 | 1 | | | | | | | | | | |
| Output bit-number, $e$ | 0 | 1 | | | | | | | | | | |
| Modulation format | 16-QAM | | | | | | | | | | | |
| Input bit-number, $d_i$ mod $N_{substreams}$ | 0 | 1 | 2 | 3 | 4 | 5 | 6 | 7 | | | | |
| Output bit-number, $e$ | 7 | 1 | 4 | 2 | 5 | 3 | 6 | 0 | | | | |
| Modulation format | 64-QAM | | | | | | | | | | | |
| Input bit-number, $d_i$ mod $N_{substreams}$ | 0 | 1 | 2 | 3 | 4 | 5 | 6 | 7 | 8 | 9 | 10 | 11 |
| Output bit-number, $e$ | 11 | 7 | 3 | 10 | 6 | 2 | 9 | 5 | 1 | 8 | 4 | 0 |

Except for QPSK, the words of width $N_{substreams}$ are split into two cell words of width $\eta_{MOD} = N_{substreams}/2$ at the output of the demultiplexer. The first $\eta_{mod} = N_{substreams}/2$ bits $[b_{0,do}..b_{Nsubstreams/2-1,do}]$ form the first of a pair of output cell words $[y_{0,2do}.. y_{\eta mod-1, 2do}]$ and the remaining output bits $[b_{Nsubstreams/2, do}..b_{Nsubstreams-1,do}]$ form the second output cell word $[y_{0, 2do+1}..y_{\eta mod-1,2do+1}]$ fed to the constellation mapper.

In the case of QPSK ($N_{ldpc}$ = 64 800 or 16 200), the words of width $N_{substreams}$ from the demultiplexer form the output cell words and are fed directly to the constellation mapper, so:

$$[y_{0,do}..y_{\eta mod-1,do}] = [b_{0,do}..b_{Nsubstreams-1,do}]$$

7.2.2.2 Cell word mapping into I/Q constellations

Each cell word $(y_{0,q}..y_{\eta mod-1,q})$ from the demultiplexer in clause 7.2.2.1 is modulated using either QPSK, 16-QAM, 64-QAM constellations to give a constellation point $z_q$ prior to normalization.

The exact values of the real and imaginary components $Re(z_q)$ and $Im(z_q)$ for each combination of the relevant input bits $y_{e,q}$ are given in Table 18 to Table 23 for the various constellations:

Table 18: Constellation mapping for real part of QPSK

| $y_{0,q}$ | 1 | 0 |
|---|---|---|
| $Re(z_q)$ | -1 | 1 |

Table 19: Constellation mapping for imaginary part of QPSK

| $y_{1,q}$ | 1 | 0 |
|---|---|---|
| $Im(z_q)$ | -1 | 1 |

Table 20: Constellation mapping for real part of 16-QAM

| $y_{0,q}$ | 1 | 1 | 0 | 0 |
|---|---|---|---|---|
| $y_{2,q}$ | 0 | 1 | 1 | 0 |
| $Re(z_q)$ | -3 | -1 | 1 | 3 |

Table 21: Constellation mapping for imaginary part of 16-QAM

| $y_{1,q}$ | 1 | 1 | 0 | 0 |
| $y_{3,q}$ | 0 | 1 | 1 | 0 |
| Im($z_q$) | -3 | -1 | 1 | 3 |

Table 22: Constellation mapping for real part of 64-QAM

| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| Re($z_q$) | -7 | -5 | -3 | -1 | 1 | 3 | 5 | 7 |

Table 23: Constellation mapping for imaginary part of 64-QAM

| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| Im($z_q$) | -7 | -5 | -3 | -1 | 1 | 3 | 5 | 7 |

Figure 44:
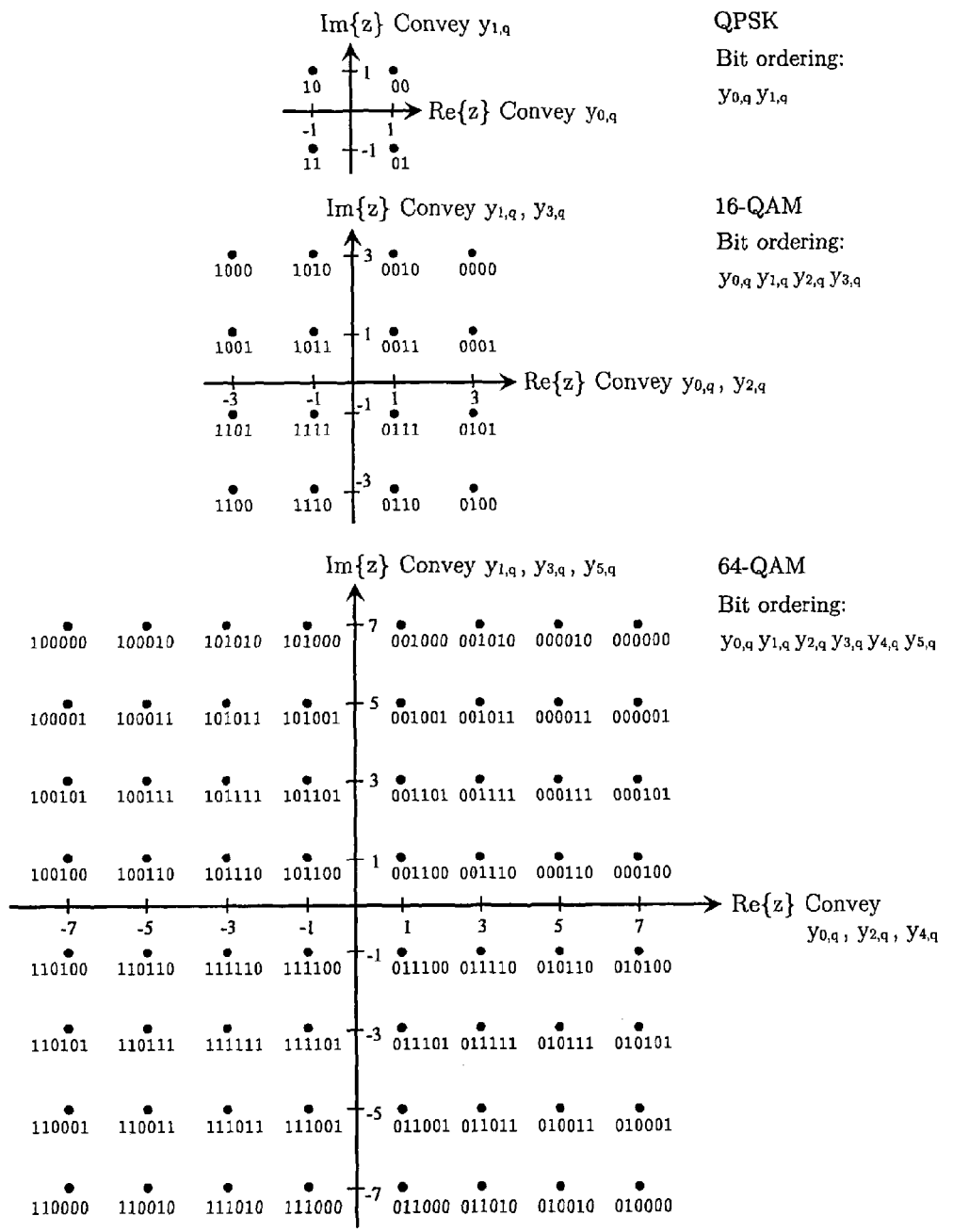
FIG. 44 shows QPSK, 16-QAM and 64-QAM mappings and the corresponding bit patterns.

The constellations, and the details of the Gray mapping applied to them, are illustrated in Figure 44.

The constellation points $z_q$ for each input cell word $(y_{0,q}..y_{\eta mod-1,q})$ are normalized according to Table 24 to obtain the correct complex cell value $f_q$ to be used.

Table 24: Normalization factors for data cells

| Modulation | Normalization |
|---|---|
| QPSK | $f_q = \dfrac{z_q}{\sqrt{2}}$ |
| 16-QAM | $f_q = \dfrac{z_q}{\sqrt{10}}$ |
| 64-QAM | $f_q = \dfrac{z_q}{\sqrt{42}}$ |

When local services are inserted on a PLP as described in clause 8, hierarchical modulation of QPSK uses 16-QAM and 16-QAM uses 64-QAM. But also, QPSK can use 64-QAM adding 4 bits per constellation point. Hierarchical modulation is not allowed on 64-QAM.

7.2.2.3 Constellation Rotation and Cyclic Q Delay

When constellation rotation is used, the normalized cell values of each FEC block $F=(f_0, f_1, ..., f_{Ncells-1})$, coming from the constellation mapper (see clause 7.2.2.2) are rotated in the complex plane and the imaginary part cyclically delayed by one cell within a FEC block. $N_{cells}$ is the number of cells per FEC block and is given in Table 26. The output cells $G=(g_0, g_1, ..., g_{Ncells-1})$ are given by:

$$g_0 = \text{Re}(R_{RQD}f_0) + j\,\text{Im}(R_{RQD}f_{Ncells-1}),$$

$$g_q = \text{Re}(R_{RQD}f_q) + j\,\text{Im}(R_{RQD}f_{q-1}),\ q=1,2,\ ...\ N_{cells}-1,$$

where the rotation phasor $R_{RQD} = e^{j\frac{2\pi\Phi}{360}}$. The rotation angle $\Phi$ depends on the modulation and is given in Table 25.

Table 25: Rotation angle for each modulation type

| Modulation | QPSK | 16-QAM | 64-QAM |
|---|---|---|---|
| Φ (degrees) | 29.0 | 16.8 | 8.6 |

Constellation rotation is only used for the data PLPs and never for the cells of the signalling PLP. When local insertion by hierarchical modulation is applied on a PLP, the rotation angle used for the hierarchical modulated cells must be the same as that used for the national SFN cells. Thus for example, 16-QAM hierarchical from QPSK uses the rotation angle for QPSK.

7.2.3 Time Interleaving

The time interleaver (TI) is adopted from DVB-T2 [2], however, the application of a cell interleaver is dropped, as it introduces no additional advantage. Thus, the applied interleaving blocks are: bit interleaving after FEC encoding, demultiplexing to optimize bit-to-QAM mappings for the given FEC scheme, time interleaver (operates on several FEC frames), and finally the frequency interleaver (operates on one Data Slice, according to clause 7.6.3).

As in DVB-T2 [2] the TI is a row-column block interleaver: the number of rows $N_r$ in the interleaver is equal to the number of cells in the FEC block ($N_{cells}$) divided by 5, and the number of columns $N_c = 5 \times N_{FEC}(n,s)$. Hence the number of columns filled will vary TI-block by TI-block depending on its cell-rate. The parameters of the interleaver are defined in Table 26.

Table 26: Parameters for time interleaver

| LDPC block length ($N_{ldpc}$) | Modulation mode | Number of cells per LDPC block ($N_{CELLS}$) | Number of rows $N_r$ |
|---|---|---|---|
| 64800 | 64-QAM | 10 800 | 2 160 |
| 64800 | 16-QAM | 16 200 | 3 240 |
| 64800 | QPSK | 32 400 | 6 480 |
| 16200 | 64-QAM | 2 700 | 540 |
| 16200 | 16-QAM | 4 050 | 810 |
| 16200 | QPSK | 8 100 | 1 620 |
| 4320 | 64-QAM | 720 | 144 |
| 4320 | 16-QAM | 1080 | 216 |
| 4320 | QPSK | 2160 | 432 |

However, the time interleaver is restricted to apply only option 1 from the DVB-T2 standard, i.e., no frame skipping and no division into several sub-slices is proposed. The reason for that is the application of the proposed scheduler (see clause 7.3), which allows for the same principle. The TI frames are input to a buffer, which is read out as bursts and scheduled by the scheduler block in a very flexible way. As an example, the scheduler can separate the bursts of one PLP over a long time interval (even exceeding the current NGH frame, which would correspond to the frame skipping TI option in T2), while the bursts of another PLP could be concatenated to form a long burst in one Data Slice (which corresponds to Type 1 PLPs in T2).

7.3 Scheduler

The task of the scheduler is the mapping of Time Interleaver (TI) frames of the several PLPs onto the NGH frame structure. In a first step the Time Interleaving Blocks of the different PLPs are fed into PLP specific buffers. As soon as the buffer level exceeds the number of active cells per segment the scheduler can take such a burst out of the buffer and map it onto the active subcarriers (i.e. non-pilot carriers) of a single Data Slice at a particular OFDM symbol. Note that the number of active cells per segment might vary for different Data Slices since different pilot patterns are applicable for them. The scheduler has further to ensure that bursts from PLPs, which employ MISO or MIMO mode (see clause 9) are allocated to Data Slices, which offer the desired pilot density. One or more bursts of a PLP buffer might be concatenated, i.e. following symbols of a Data Slice can also contain bursts of the same PLP. Thus, different subslicing lengths can be created, similar to DVB-T2.

Figure 45:
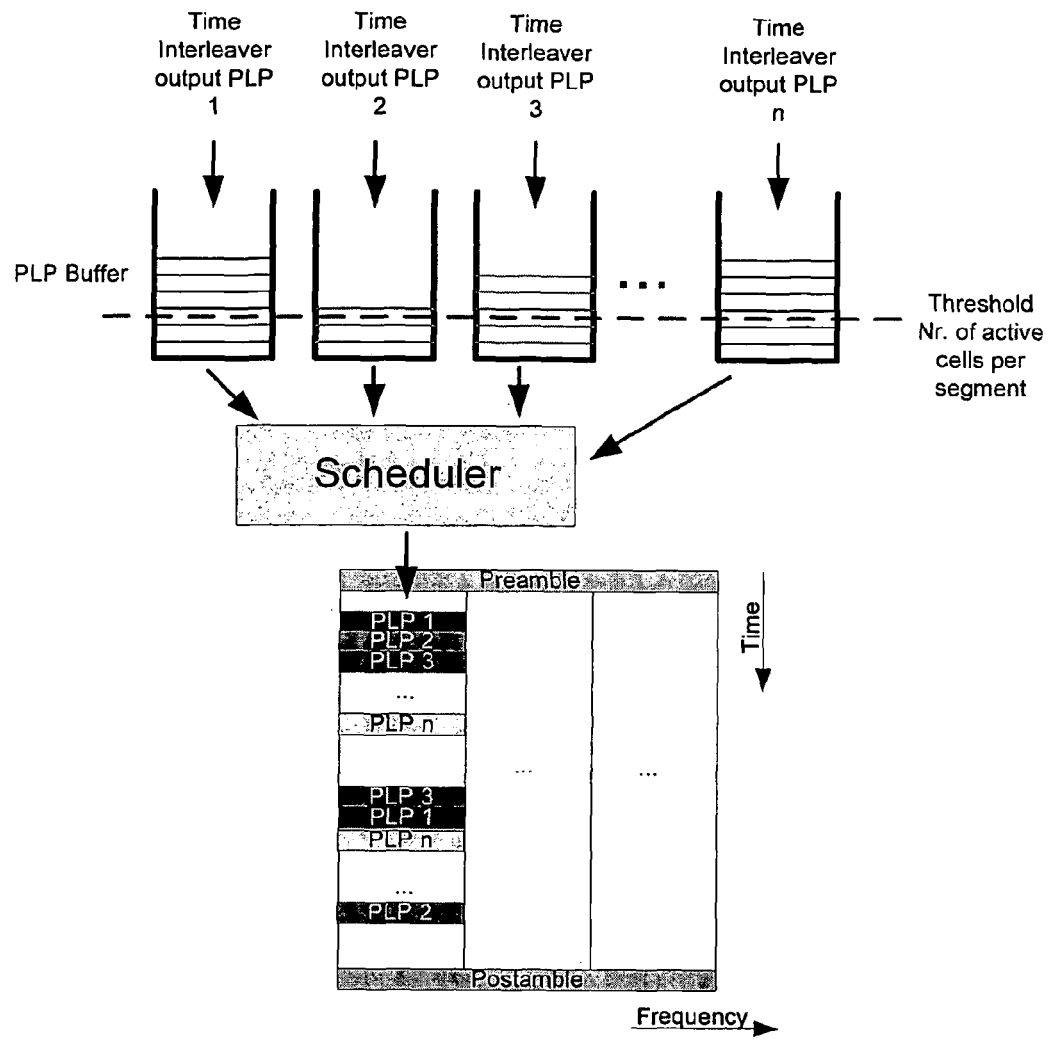
FIG. 45 shows the NGH scheduler mechanism.

As the minimum receiver bandwidth is 1.7 MHz (allowing detection of one Data Slice), the scheduler must avoid that bursts belonging to associated PLPs are transmitted simultaneously, i.e., in different Data Slices at the same time. As an example, this can be achieved if the associated PLPs are allocated in the same Data Slice in the scheduling mode 2, see Figure 45.

Figure 46:
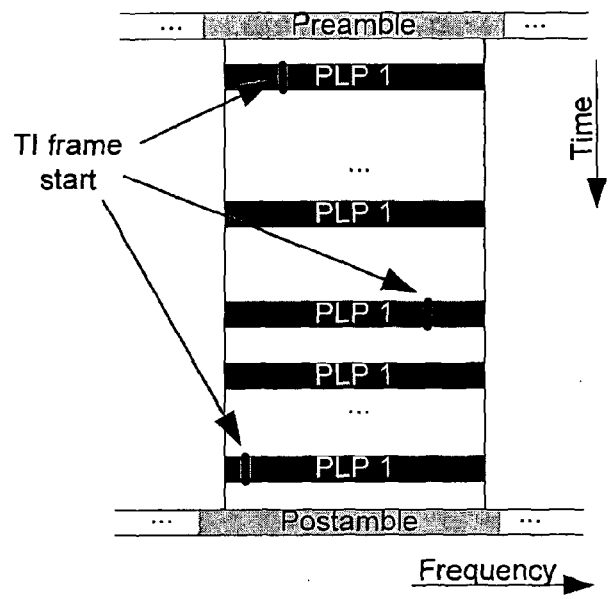
FIG. 46 shows the mapping of time interleaver frames to PLP bursts in the NGH frame.

The PLP specific buffer mechanism makes sure that in each OFDM data symbol and in each segment only bursts of a single PLP are inserted. Since the beginning of a Time Interleaver frame does typically not coincide with the beginning of a burst in a Data Slice, a pointer mechanism in the signalling PLP as well as in the in-band signalling is introduced (an Intrasymbol Pointer to the first burst of a TI frame). Figure 46 shows the principle. The start positions (in terms of active subcarrier addresses within a Data Slice) of the new Time Interleaver frames for PLP 1 are somewhere within the PLP bursts.

A scheduling scheme itself is not defined. This allows for optimizing the mapping algorithm for the specific needs of each service, e.g. maximum robustness or low latency.

However, in contrast to DVB-T2, where subslicing of PLPs results in a regular partitioning of the PLP data in time, the NGH scheduler takes care that such regular repetition patterns are avoided. It has been shown in the Helsinki measurements that fading over time occurs rather often in a regular (i.e. periodic) way. Periodic time fading also occurs in moving receivers, with the fade repetition rate dependent on the Doppler frequency. The scheduler needs to overcome this kind of regularity by introducing a mechanism to shuffle the bursts of each PLP at least within the Data Slice. For example, the order of the PLP bursts within the Data Slice can be changed or shifted between the overall burst repetition interval.

The scheduler can also take care that in order to increase receiver sleeping times bursts of certain PLPs might not be inserted in some NGH frames, i.e. the receiver will not need to decode all NGH frames.

Note that the proposed scheduler allows for a high degree of flexibility. To ensure that scheduling operates in a unique and thus predetermined way, however, this flexibility can be restricted by appropriate algorithms. For example, in framing mode 2, where several PLPs are allocated to a fixed Data Slice during one frame but can change to a different Data Slice in the next frame (in a defined manner, see Figure 45), the scheduler could operate in a similar manner as the frame builder in DVB-T2. This means that the scheduler allocates the bursts of the PLPs onto the segmented OFDM symbols for each Data Slice individually. These could be single bursts or several concatenated bursts, while the latter would correspond to a coarser subslicing length. It is also possible to allocate all bursts of a PLP combined, which would correspond to Type 1 PLPs on DVB-T2. The ordering of the various bursts (from different PLPs) can be regular as in DVB-T2. However, as discussed above, any regularity in mapping the bursts onto a frame should be avoided to mitigate the effects of periodic fading.

7.4 Signalling

The signalling concept differs from DVB-T2 and increases robustness while minimizing the overhead. The signalling concept is described in clause 7.4.1. The detailed contents of the different signalling stages are then given in the subsequent clauses.

7.4.1 Signalling Concept

Figure 47:
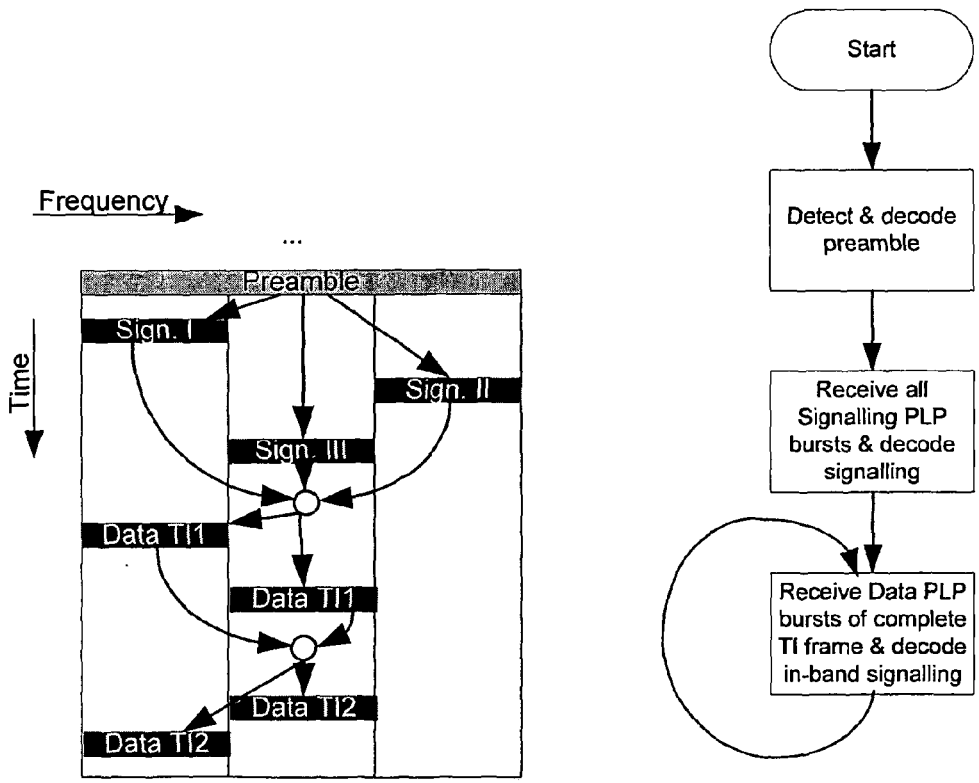
FIG. 47 shows an example for initial receiver acquisition procedure (for frequency hopping mode)

The signalling concept proposed means that the receiver uses three steps to acquire the payload data. First, the receiver decodes the quasi static signalling within the preamble. The preamble also points to all bursts that carry the complete Signalling PLP. The Signalling PLP carries information about all PLPs transmitted within the DVB-NGH signal and includes pointers to the bursts of each data PLP. Furthermore, each data PLP contains an in-band signalling to itself and a definable group of other PLPs. Thus, the Signalling PLP is required for initial acquisition only or for zapping from one PLP to another. A simple acquisition procedure diagram is shown in Figure 47.

The main benefit of this structure is the reduced overhead, whilst maintaining high robustness. The preamble contains mainly signalling related to the framing structure, which is static within the given NGH system. Due to the concept of absolute OFDM that is already used in DVB-C2, the receiver is able to decode the preamble at any tuning position within the NGH signal. The preamble and postamble act like the L1-pre signalling in the P2 symbol, and furthermore, the postamble as the frame closing symbol of DVB-T2, as it allows for complete channel estimation, even for MIXO. MIXO means either MISO or MIMO transmission.

The Signalling PLP is transmitted like a normal data PLP, while its position is indicated by means of pointers within the preamble or postamble. Therefore, it is possible to use time interleaving for the Signalling PLP, which increases its robustness significantly and does not necessitate extremely high robustness compared to the payload data as is required in the P2 symbol of DVB-T2. Thus, the overhead is reduced due to the increased spectral efficiency of the signalling. Furthermore, repetition rate of the Signalling PLP within the framing structure is adjustable by the network operator. The Signalling PLP can be e.g. transmitted in every frame for reduced signal acquisition time. However, it is also possible to transmit the Signalling PLP in large intervals, which reduces the signalling overhead significantly. The Signalling PLP contains the parameters of all PLPs, while the modulation and coding parameters of each individual PLP are assumed to be quasi static. Furthermore, the Signalling PLP contains all information to decode the data PLPs, i.e. it signals the number of bursts and the positions of one or more time interleaving frames of each PLP.

The data PLPs also contain in-band signalling for itself, which is transmitted once in each group of time interleaving frames. The number of TI frames, which are signalled as together as one group, is ranges from one to four and is signalled in NUM_SIGNALLED_TI_FRAMES. Additionally, it can carry signalling for a number of other PLPs, e.g. of the same bouquet. Hence, there is no requirement to track the Signalling PLP. Furthermore, as only the time-variant parameters are transmitted, the additional overhead caused by this signalling is quite limited.

7.4.2 Preamble Signalling

The Preamble Signalling, transmitted in every preamble (or postamble, if transmitted in TDMA with another transmission system as DVB-T2) symbol contains mainly static parameters, which are related to the framing structure:

| Field | Size |
|---|---|
| SYSTEM_ID | 16 bit |
| NETWORK_ID | 16 bit |
| CELL_ID | 16 bit |
| TX_ID_AVAILABILITY | 8 bit |
| GUARD_INTERVAL | 2 bit |
| START_FREQUENCY | 24 bit |
| RESERVED_TONES | 1 bit |
| CHANNEL_BANDWIDTH | 4 bit |
| SUPER_FRAME_LENGTH | 8 bit |
| FRAME_LENGTH | 6 bit |
| NGH_OPERATION_MODE | 1 bit |
| if (OPERATION_MODE == 1) { // TDMA with e.g. T2 | |
| POSTAMBLE_FLAG | 1 bit |
| GAP_LENGTH | 22 bit |
| } | |
| for i = 1 ... NUM_DATA_SLICES { | |
| PILOT_PATTERN | 3 bit |
| } | |
| FRAME_NUMBER | 8 bit |
| L1_SIG_QAM | 4 bit |
| L1_SIG_FEC | 3 bit |
| L1_SIG_MIMO | 2 bit |
| L1_SIG_LENGTH | 8 bit |
| L1_SIG_PILOT_PATTERN | 3 bit |
| L1_SIG_FRAME_NUMBER | 8 bit |
| INTRASYMBOL_POINTER | 11 bit |
| NUM_L1_SIG_BURSTS | 3 bit |
| for i=1 ... NUM_L1_SIG_BURSTS { | Max. 36 bit |
| DATA_SLICE_ID | 4 bit |
| OFDM_SYMBOL_NUMBER | 8 bit |
| } | |
| CRC32 | 32 bit |
| *Total number of signalling bits* | Max. 258 bits |

Table 27: Contents of preamble (postamble) signalling

SYSTEM_ID: This is a 16-bit field which uniquely identifies the system ID of the DVB-NGH network.

NETWORK_ID: This is a 16-bit field which uniquely identifies the network ID of the DVB-NGH network.

CELL_ID: This is a 16-bit field which uniquely identifies the cell ID of the DVB-NGH network.

TX_ID_AVAILABILITY: This 8 bit field signals the TX_ID_AVAILABILITY as used in DVB-T2.

GUARD_INTERVAL: This 2-bit field identifies the guard interval of the current DVB-NGH frame.

START_FREQUENCY: This 24-bit field indicates the start frequency of the current DVB-NGH signal in multiples of 16 OFDM subcarriers (i.e. in multiples of $16/(896\mu s) \approx 17.8 kHz$ ). The value 0 means the absolute frequency 0Hz.

RESERVED_TONES: This flag signals the presence of reserved tones.

CHANNEL_BANDWIDTH: This 4-bit field signals the bandwidth of the DVB-NGH signal.

SUPER_FRAME_LENGTH: This 8-bit field indicates the number of frames in a superframe.

FRAME_LENGTH: The value of this 6-bit field multiplied by 4 is the number of OFDM symbols within a DVB-NGH frame (excluding preamble and postamble).

NGH_OPERATION_MODE: This flag indicates whether the current DVB-NGH system is standalone (NGH_OPERATION_MODE == 0) or in time division multiple access (NGH_OPERATION_MODE == 1) with another transmission system, e.g. DVB-T2.

The following two fields only appear if the DVB-NGH system is in time division multiple access with another transmission standard:

> POSTAMBLE_FLAG: This flag indicates if the current preamble symbol is a preamble or postamble.

> GAP_LENGTH: This 22-bit field indicates the length of the gap between two DVB-NGH frames from the end of the postamble to the beginning of the next DVB-NGH preamble (not T2 P1 symbol) in multiples of the elementary period.

The following field appears for every Data Slice. (The number of Data Slices can be calculated by means of the channel bandwidth.)

> PILOT_PATTERN: This 3-bit field indicates the pilot pattern used in the given Data Slice. In case of a postamble, this signalling is valid for the next DVB-NGH frame.

FRAME_NUMBER: This 8-bit field indicates the number of the current frame within the super frame. In case of a postamble, this field indicates the number of the next DVB-NGH frame.

L1_SIG_QAM: This 3-bit field indicates the QAM mapping of the PLP containing the Layer 1 Signalling (including rotated constellations).

L1_SIG_FEC: This 4-bit field indicates the FEC encoding of the PLP containing the Layer 1 (including FEC code length).

L1_SIG_MIMO: This 2-bit field indicates the MIMO encoding of the PLP containing the Layer 1 Signalling.

L1_SIG_LENGTH: This 8-bit field signals the length of the PLP containing the Layer 1 Signalling in multiples of LDPC codewords.

L1_SIG_PILOT_PATTERN: This 3-bit field signals the pilot pattern of the Data Slices containing the Layer 1 Signalling PLP.

L1_SIG_FRAME_NUMBER: This 8-bit field indicates the frame number in which the signalled Signalling PLP starts.

INTRASYMBOL_POINTER: This 11-bit field points to the start of the Signalling PLP within an OFDM symbol.

NUM_L1_SIG_BURSTS: This 3-bit field signals the number of bursts of the PLP containing the Layer 1 Signalling.

The following two fields appear for each Layer 1 Signalling Burst.

> DATA_SLICE_ID: This 4-bit field indicates the Data Slice number containing the burst.

> OFDM_SYMBOL_NUMBER: This 8-bit field indicates the OFDM symbol number of the next given burst. If the number is lower than the number of the previous burst, this burst is transmitted within the next frame.

CRC32: This 32-bit cyclic redundancy check ensured correctness of the data.

7.4.3 Signalling PLP

This signalling PLP contains the signalling data required to decode all data PLPs. All parameters concerning ModCod, MIMO and pilot pattern are assumed to be quasi static. The PLP ID 0 is reserved for the Signalling PLP.

| Field | Size |
|---|---|
| FRAME_NUMBER | 8 bit |
| NUM_PLP | 8 bit |
| for i = 1 ... NUM_PLP { | |
| PLP_ID | 8 bit |
| PLP_IDENTIFICATION | 16 bit |
| PLP_QAM_MODE | 3 bit |
| PLP_FEC_MODE | 4 bit |
| PLP_MIMO_MODE | 2 bit |
| PLP_PILOT_PATTERN | 3 bit |
| PLP_TYPE | 8 bit |
| PLP_PAYLOAD_TYPE | 8 bit |
| NUM_ASSOCIATED_PLPs | 3 bit |
| For NUM_ASSOCIATED_PLPs { | |
| ASSOCIATED_PLP_ID | 8 bit |
| ASSOCIATION_TYPE | 2 bit |
| } | |
| INTERLEAVING_TYPE | 2 bit |
| NUM_SIGNALLED_TI_FRAMES | 2 bit |
| for i = 1 ... NUM_SIGNALLED_TI_FRAMES { | |
| TI_NUM_BURSTS | 3 bit |
| TI_FRAME_NUMBER | 8 bit |
| INTRASYMBOL_POINTER | 11 bit |
| for i = 1 ... NUM_BURSTS { | |
| DATA_SLICE_ID | 4 bit |
| OFDM_SYMBOL_DELTA | 10 bit |
| if (NUM_ASSOCIATED_PLP > 0) { | |
| ASSOCIATED_PLP_IDX | 3 bit |
| } | |
| } | |
| TIME_INTERLEAVER_SIZE | 8 bit |
| } | |
| } | |
| NUM_HANDOVER_PLPs | 8 bit |
| for i = 1 ... NUM_HANDOVER_PLPs { | |
| PLP_IDENTIFICATION | 16 bit |
| NUM_ALTERNATIVE_CELLS | 8 bit |
| for j = 1 ... NUM_ALTERNATIVE_CELLS { | |
| START_FREQUENCY | 24 bit |
| CELL_ID | 16 bit |
| } | |
| } | |
| CRC32 | 32 bit |

Table 28: Signalling PLP

FRAME_NUMBER: This 8-bit field indicates the frame number of the last burst of the time interleaving frame.

NUM_PLP: This 8-bit field signals the number of PLPs present in the current DVB-NGH signal.

The following fields appear for every signalled PLP:

PLP_ID: 8-bit identifier of the PLP.

PLP_IDENTIFICATION: This 16-bit field uniquely identifies a PLP within a network.

PLP_QAM_MODE: This 4-bit field signals the QAM mode of the PLP (including rotated constellations).

PLP_FEC_MODE: This 4-bit field signals the FEC mode of the PLP (including FEC code length).

PLP_MIMO_MODE: This 2-bit field signals the MIMO mode of the PLP according to the following table:

Table 29: PLP_MIMO_MODE field

| PLP_MIMO_MODE | 00 | 01 | 10 | 11 |
|---|---|---|---|---|
| mode | SISO | MISO | MIMO | reserved |

PLP_PILOT_PATTERN: This 3-bit field identifies the pilot pattern in which the PLP is transmitted.

PLP_TYPE: This 8-bit field indicates the PLP type.

PLP_PAYLOAD_TYPE: This 8-bit field signals the payload type, e.g. TS, GSE.

NUM_ASSOCIATED_PLP: This 3-bit field indicates the number of PLPs that are associated with this PLP.

The following two fields appear for each associated PLP:

ASSOICATED_PLP_ID: This 8-bit field indicated the PLP ID of the associated PLP.

ASSOCIATION_TYPE: This 2-bit field signals the association type, e.g. local service or incremental redundancy.

INTERLEAVING_TYPE: This 2-bit field indicates the time interleaver type.

NUM_SIGNALLED_TI_FRAMES: This 2-bit field indicates the number of signalled time interleaving frames for the given PLP minus 1, so NUM_SIGNALLED_TI_FRAMES = 0 corresponds to one TI frame.

The following fields appear for each signalled time interleaving frame:

TI_NUM_BURSTS: This 3-bit field signals the number of bursts for the given time interleaving frame.

TI_FRAME_NUMBER: This 8-bit field indicates the frame number in which the time interleaving frame starts. If the number is smaller than the frame number of the current frame, the TI_FRAME_NUMBER refers to the following super frame.

INTRASYMBOL_POINTER: This 11-bit field points to the start of the time interleaving frame within an OFDM symbol.

The following fields appear for each time interleaving burst:

DATA_SLICE_ID: This 4-bit field indicates the Data Slice number containing the burst.

OFDM_SYMBOL_NUMBER:_DELTA: This 10-bit field indicates the OFDM symbol number of the next given burst. In case of the first burst of a time interleaving frame the number gives the absolute OFDM symbol number within the signalled NGH frame. All other values are given relative to the beginning of the previous burst, i.e. the beginning of the burst is indicated by the frame number plus the addition of all previous OFDM_SYMBOL_DELTA.

The following field only appears if there are associated PLPs:

ASSOCIATED_PLP_IDX: This 3-bit field indicates the index of the associated PLP in the NUM_ASSOICATED_PLP loop. A value of 0 means that no PLP is currently associated.

TIME_INTERLEAVER_SIZE: This 8-bit field indicates the length of the time interleaving frame in multiples of LDPC codewords.

NUM_HANDOVER_PLP: This 8-bit field indicates the number of PLPs that will be signalled in the handover signalling.

The following fields appear for every signalled handover PLP.

PLP_IDENTIFICATION: This 16-bit field uniquely identifies the PLP within a network.

NUM_ALTERNATIVE_CELLS: This 8-bit field indicates the number of alternative cells within the given network that also carry the PLP.

The following fields appear for every alternative cell:

START_FREQUENCY: This 24-bit field indicates the start frequency of the alternative cell.

CELL_ID: This 16-bit field indicates the cell ID of the alternative cell.

CRC32: This 32-bit cyclic redundancy check ensured correctness of the data.

7.4.4 In-Band Signalling

The in-band signalling is transmitted in the first BBFRAME of each time interleaving frame. It carries information about the currently received PLP, and optionally, about related PLPs or any other PLPs. Only the time-variant parameters are signalled within the in-band signalling.

| Field | Size |
|---|---|
| FRAME_NUMBER | 8 bit |
| NUM_SIGNALLED_PLP | 8 bit |
| for i = 1 ... NUM_SIGNALLED_PLP { | |
| PLP_ID | 8 bit |
| NUM_SIGNALLED_TI_FRAMES | 2 bit |
| for j = 1 ... NUM_SIGNALLED_TI_FRAMES | |
| TI_NUM_BURSTS | 3 bit |
| TI_FRAME_NUMBER | 8 bit |
| INTRASYMBOL_POINTER | 11 bit |
| for i = 1 ... NUM_BURSTS { | |
| DATA_SLICE_ID | 4 bit |
| OFDM_SYMBOL_NUMBER | 8 bit |
| if (NUM_ASSOCIATED_PLP > 0) { | |
| ASSOCIATED_PLP_IDX | 3 bit |
| } | |
| } | |
| TIME_INTERLEAVER_SIZE | 8 bit |
| } | |
| CRC8 | 8 bit |

Table 30: In-band signalling

FRAME_NUMBER: This 8-bit field indicates the frame number of the last burst of the time interleaving frame.

NUM_SIGNALLED_PLP: This 8-bit field signals the number of PLPs signalled within the given in-band signalling.

The remaining parameters have the same meaning as in the Signalling PLP.

7.5 Data Slice Processing

The Data Slice processing takes the input data from the scheduler and creates the complete OFDM symbol for the corresponding Data Slice. It performs a frequency interleaving and adds all pilots, i.e. the scattered, the continual pilots and the reserved tones, if used. The addition of the pilots is done at this stage, as it allows for the possibility to have different pilot patterns in different Data Slices of the same system.

In order to simplify the alignment, the bandwidth of the Data Slices is always a multiple of 32 OFDM subcarriers. This ensures that the number of payload subcarriers remains constant within a Data Slice over multiple OFDM symbols. Furthermore, in order to allow for the reception of the signal by means of a 1.7 MHz tuner, its bandwidth shall not exceed 1440 OFDM subcarriers (1.61 MHz).

7.5.1 Data Slice Bandwidth

The bandwidth (or number of subcarriers per Data Slice) depends on the overall bandwidth of the DVB-NGH signal. Table 31 lists the number of Data Slice subcarriers $N_{DS}$ for the different channel bandwidths. They are chosen so that the bandwidth of the Data Slices is always maximum without exceeding 1.61 MHz. At the edge of the signal spectrum a guard band of 200 kHz is assumed. Small adaptations of the Data Slice bandwidth may be possible due to special spectrum requirements.

Table 31: Data Slice parameters for different bandwidth configurations

| Channel Bandwidth | Data Slice subcarriers $N_{DS}$ | Number of Data Slices |
|---|---|---|
| 1.7 MHz | 1440 | 1 |
| 5 MHz | 1344 | 3 |
| 6 MHz | 1248 | 4 |
| 7 MHz | 1152 | 5 |
| 8 MHz | 1344 | 5 |
| 10 MHz | 1408 | 6 |
| 15 MHz | 1440 | 9 |
| 20 MHz | 1344 | 13 |

Furthermore, the bandwidth of the Data Slices ensures that no unwanted common phase rotations occur if the receiver tunes to the centre frequency of each Data Slice. Otherwise, these phase rotations would have to be compensated by e.g. continual pilots or rotation of the phases, as explained in the Implementation Guidelines of DVB-C2 [8].

The values are similar to the 8k FFT mode of DVB-T2 in 8 MHz operation. Scaling is proposed to fit these parameters for L-Band and S-Band operation, where the subcarrier spacing of the DVB-T2 2k FFT mode in 8 MHz operation is proposed.

7.5.2 Frequency Interleaver

The frequency interleaver is used to distribute the input data randomly over the subcarriers allocated to each Data Slice. The interleaving is performed only within Data Slices using an odd-odd scheme. The proposed scheme is derived from the DVB-T2 2k frequency interleaver.

For the Data Slices using SISO pilots, the output is defined as:

$a_{m,l,p} = x_{m,l,H0(p)}$ for even symbols of the frame ($l \bmod 2 = 0$) for $p = 0, ..., N_{DS}\text{-}1$; and $a_{m,l,p} = x_{m,l,H1(p)}$ for odd symbols of the frame ($l \bmod 2 = 1$) for $p = 0, ..., N_{DS}\text{-}1$, where $N_{DS}$ is the number of payload OFDM subcarrier per Data Slice and $a$ and $x$ are the elements of the vectors $X$, $A$.

$H_0(p)$ and $H_1(p)$ are permutation functions of the bits of members of the sequence $R'_i$. These permutation functions are defined in Table 32.

Table 32: Bit permutations for the frequency interleaver (similar to DVB-T2 2k mode)

| $R'_i$ bit positions | 9 | 8 | 7 | 6 | 5 | 4 | 3 | 2 | 1 | 0 |
|---|---|---|---|---|---|---|---|---|---|---|
| $R_i$ bit positions ($H_0$) | 0 | 7 | 5 | 1 | 8 | 2 | 6 | 9 | 3 | 4 |
| $R_i$ bit positions ($H_1$) | 3 | 2 | 7 | 0 | 1 | 5 | 8 | 4 | 9 | 6 |

The sequence $R'_i$ is defined by the following procedure:

An $(N_r - 1)$ bit word $R'_i$ is defined, with $N_r = \log_2(M_{max})$ with $M_{max} = 2048$, where $R'_i$ takes the following values:

```
i = 0,1:        R'i [Nr-2, Nr-3,...,1,0] = 0,0,...,0,0
i = 2:          R'i [Nr-2, Nr-3,...,1,0] = 0,0,...,0,1
2 < i < Mmax: {
     R'i [Nr-3, Nr-4,...,1,0] = R'i-1 [Nr-2, Nr-3,...,2,1];
     R'i [9] = R'i-1 [0] ⊕ R'i-1 [3]
}
```

```
p = 0;
for (i = 0; i < Mmax; i = i + 1) {
```
$$H(p) = (i \bmod 2) \cdot 2^{N_r-1} + \sum_{j=0}^{N_r-2} R_i(j) \cdot 2^j;$$
```
    if (H(p)<Ndata) p = p+1;
}
```

Figure 48:
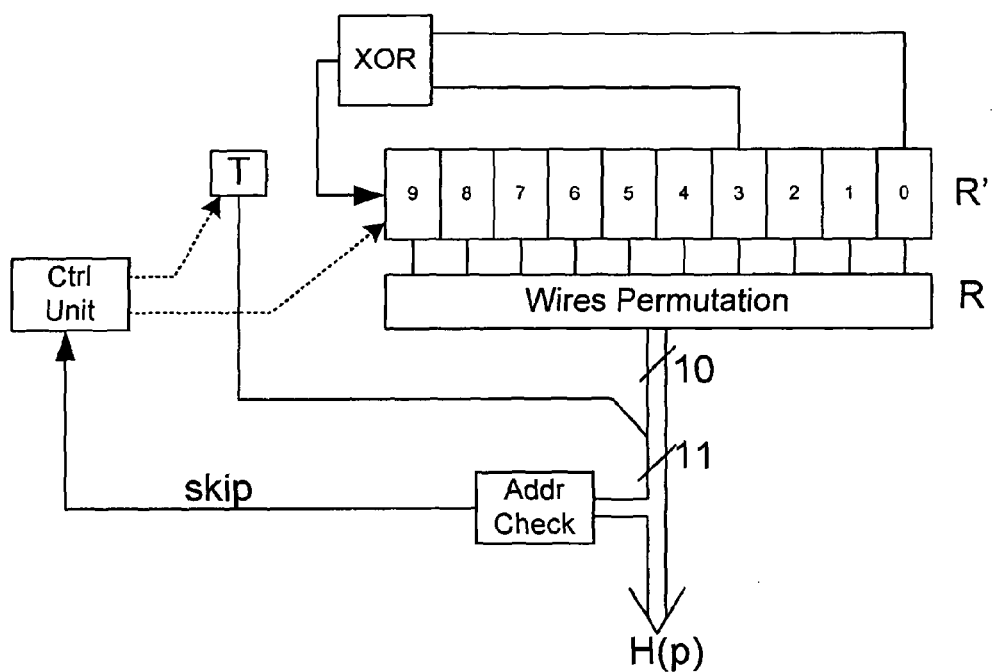
FIG. 48 shows frequency interleaver address generation scheme.

A schematic block diagram of the algorithm used to generate the permutation function is represented in Figure 48.

If a Data Slices used MIXO pilots, a pairwise interleaving is used to not destroy the pairwise coupling of space-time/frequency block codes. Therefore, the interleaving scheme is modified. The output is then defined as:

$a_{m,l,2p} = x_{m,l,H0(2p)}$ and $a_{m,l,2p+1} = x_{m,l,H0(2p)+1}$ for even symbols of the frame ($l \bmod 2 = 0$) for $p = 0, ..., N_{DS}/2-1$;

$a_{m,l,2p} = x_{m,l,H1(2p)}$ and $a_{m,l,2p+1} = x_{m,l,H1(2p)+1}$ for odd symbols of the frame ($l \bmod 2 = 1$) for $p = 0, ..., N_{DS}/2-1$.

7.5.3 Data Slice Pilots

To enable channel estimation Scattered Pilots are added to the Data Slices. The addition of these Scattered Pilots is already done within individual Data Slices, as it is possible to have different pilot densities within different Data Slices of the same signal.

7.5.3.1 Scattered Pilots for SISO Transmission

The equalisation of SISO signals requires the estimation of a single channel transfer function, only. However, as the neighbouring Data Slices may use MIXO signals, the edge pilots and the preamble pilots always carry MIXO pilots. Edge pilots and preamble pilots are not part of the Data Slice pilots and their insertion is described in section 7.7.3. The proposal supports different pilot densities. The pilot patterns PP0 and PP1 are indented for large Single Frequency Networks (SFNs), while the pilot schemes PP2 and PP3 offer reduced overhead. Furthermore, PP0 and PP2 are optimized for high speed reception, as they have an increased pilot density in the time direction.

Within a Data Slice a given cell is a Scattered Pilot if:

$$k_{DS} \bmod(D_X \cdot D_Y) = D_X(l \bmod D_Y) \quad k = 1,...,N_{DS}-1,$$

where $k_{DS}$ is the subcarrier number within the Data Slice, and l is the symbol number within the frame, respectively, The values for $D_X$ and $D_Y$ as well as the allowed Guard Interval fractions are given in Table 33.

Table 33: Factors $D_X$ and $D_Y$ for SISO and MIXO pilots

| Pilot Pattern | $D_X$ | $D_Y$ | Allowed Guard Interval fractions |
|---|---|---|---|
| PP0 | 4 | 2 | 1/4, 1/8, 1/16, 1/32 |
| PP1 | 4 | 4 | 1/4, 1/8, 1/16, 1/32 |
| PP2 | 8 | 2 | 1/8, 1/16, 1/32 |
| PP3 | 8 | 4 | 1/8, 1/16, 1/32 |

Figure 49:
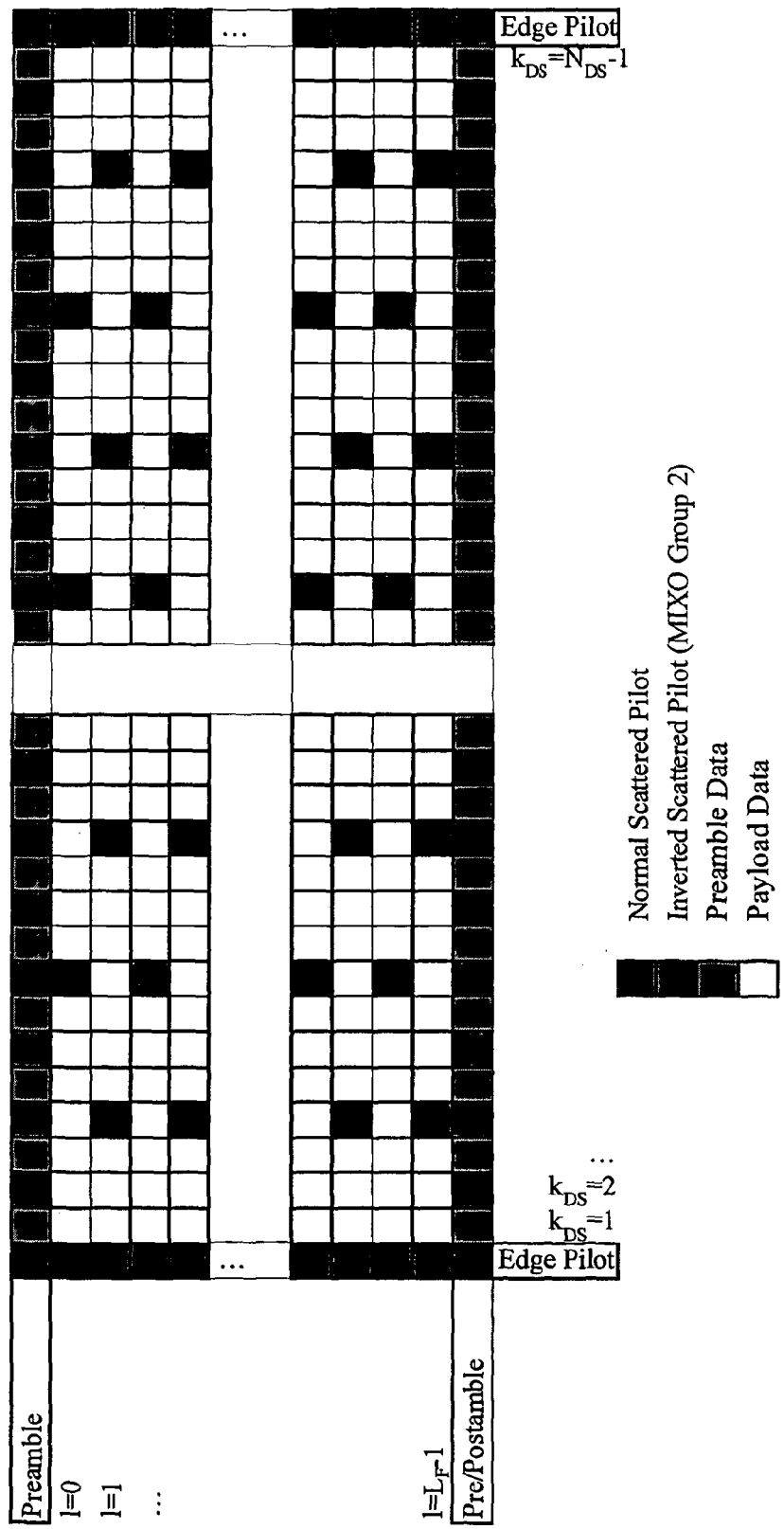
FIG. 49 shows the insertion of Scattered Pilots into the Data. Slice for Pilot Pattern PP0-SISO.

Figure 49 shows an example pilot arrangement for pilot pattern PP0.

The modulation sequence of the pilots is:

$$Re\{c'_{m,l,k_{DS}}\} = A_{SP}$$

$$Im\{c'_{m,l,k_{DS}}\} = 0,$$

where $A_{SP}$ is the boosting level of the Scattered Pilots as defined in Table 34. Furthermore, no scrambling is applied at this point as the complete scrambling is performed in the framing section.

Table 34: Amplitudes of Scattered Pilots

| Pilot Pattern | $A_{SP}$ |
|---|---|
| PP0 | 4/3 |
| PP1 | 4/3 |
| PP2 | 4/3 |
| PP3 | 7/4 |

7.5.3.2 Scattered Pilots for MIXO Transmission

The transmission of MIXO services requires additional pilots, as twice the number of different channel transfer functions have to be estimated by the receiver. However, in contrast to DVB-T2, the possibility to support also large Single Frequency Networks shall be kept. Hence, an additional pilot pattern is overlaid to the SISO pilots, i.e. the inverted pilots. Hence, a cell is a non-inverted pilot if:

$$k_{DS} \bmod(D_X \cdot D_Y) = D_X(l \bmod D_Y) \quad k = 1,...,N_{DS}-1,$$

and an inverted pilot if:

$$k_{DS} \bmod(D_X \cdot D_Y) = D_X[(l + D_Y/2) \bmod D_Y] \quad k = 1,...,N_{DS}-1,$$

where the values $D_X$ and $D_Y$ are again defined in Table 33.

The modulation sequence for the transmitters of MIXO group 0 is:

$$Re\{c^{0'}_{m,l,k_{DS}}\} = A_{SP}$$

$$Im\{c^{0'}_{m,l,k_{DS}}\} = 0.$$

The modulation sequence for the non-inverted pilots of MIXO group 1 is:

$$Re\{c^{1'}_{m,l,k_{DS}}\} = A_{SP}$$

$$Im\{c^{1'}_{m,l,k_{DS}}\} = 0,$$

while the modulation sequence for the inverted pilots of MIXO group 1 is:

$$\text{Re}\{c^{1'}_{m,l,k_{DS}}\} = -A_{SP}$$

$$\text{Im}\{c^{1'}_{m,l,k_{DS}}\} = 0.$$

Figure 50:
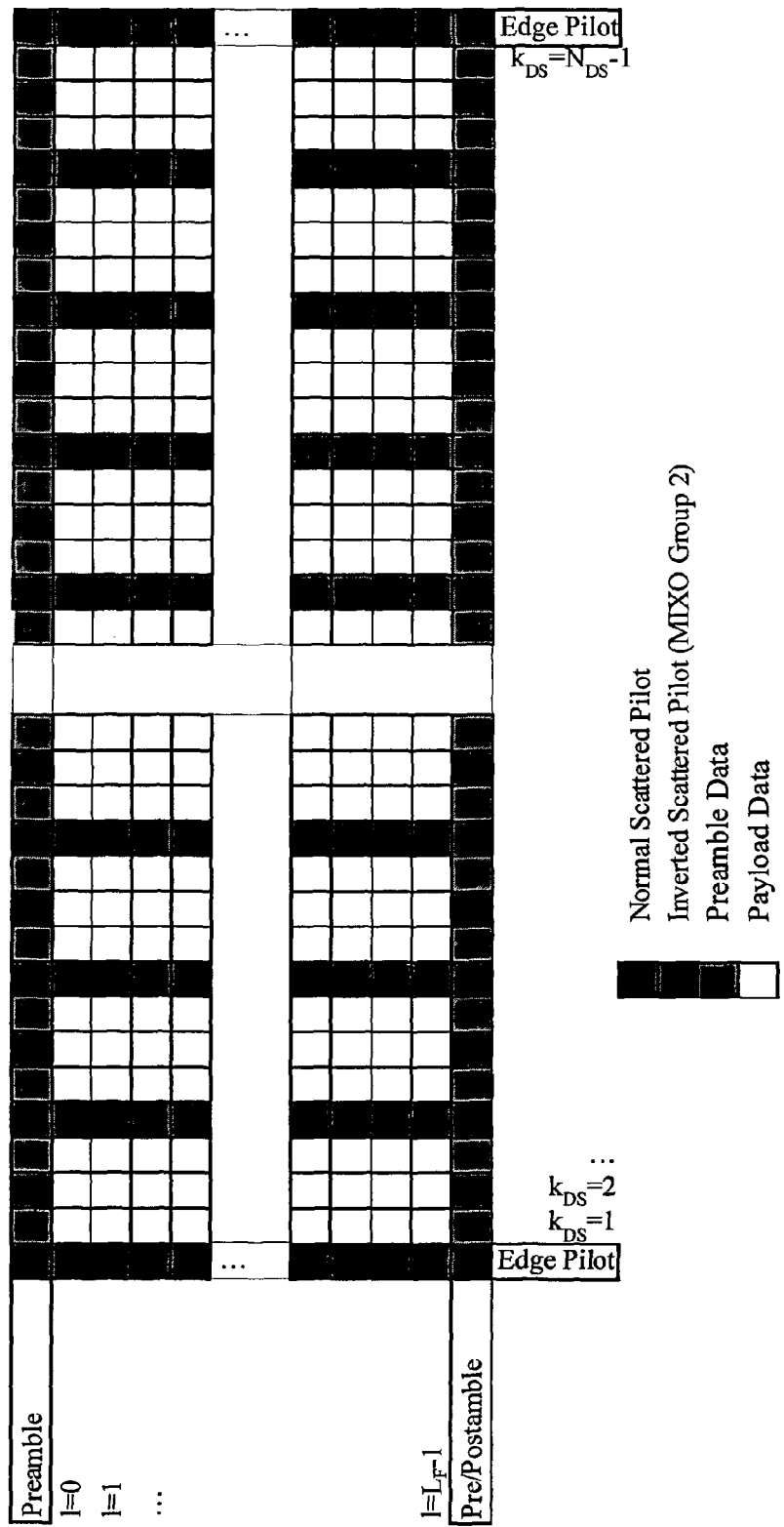
FIG. 50 shows the insertion of Scattered Pilots into the Data Slice for Pilot Pattern PP0-MIXO.

The values for $A_{SP}$ are again given in Table 34. Furthermore, Figure 50 depicts an arrangement of the MIXO pilots for pilot pattern PP0.

7.5.3.3 Continual Pilots

The Data Slices contain Continual Pilots, which can be used for synchronisation and the removal of common phase error. A cell within a Data Slice is a Continual Pilot if:

$$k_{DS} \in M_{CP},$$

where $M_{SP}$ is defined in Table 35. The modulation of Continual Pilots is:

$$\text{Re}\{c'_{m,l,k_{DS}}\} = A_{CP}$$

$$\text{Im}\{c'_{m,l,k_{DS}}\} = 0.$$

The amplitude of the continual pilots is $A_{CP} = 4/3$. If a continual pilot falls on the same position as a Scattered Pilot, the Scattered Pilot is transmitted.

Table 35: List of Continual Pilot positions $M_{CP}$.

| 0, 46, 68, 86, 136, 202, 254, 268, 278, 334, 434, 450, 482, 526, 528, 530, 564, 618, 632, 714, 758, 766, 782, 802, 886, 918, 469, 942, 970, 1050, 1084, 1102, 1154, 1206, 1346, 1430 |
|---|

The list of continual pilots ensures that the number of payload OFDM subcarrier per Data-Slice is always constant. Furthermore, the number of payload OFDM subcarriers per Data Slice is always even, which does not cause any difficulties in the case of pairwise frequency interleaving.

7.5.3.4 Reserved Tones

If required some cells may be reserved for purposes as peak to average power (PAPR) reduction. Reserved tones can be set to any value in order to decrease the PAPR of the OFDM output symbols according to the reserved tones algorithm from DVB-T2 [2]. Reserved tones are not co-located with pilots. A cell is a reserved tone if:

$$k_{DS} \in M_{RT},$$

where the list of reserved tones is defined in Table 36.

Table 36: List of Reserved Tone positions $M_{RT}$.

| The list of reserved tones has to be calculated when the final parameter set has been set to obtain maximum performance. However, pilot tones must not be co-located with continual and scattered pilot's positions. |
|---|

7.5.4 Mapping of the Payload Data

The payload data vector $X_{m,l,DSx}$ is mapped onto the cells of Data Slice $x$ that are not occupied by pilots or reserved tones. The mapping is done in an increasing order of $k_{DS}$, i.e. the first cell of the vector $X_{m,l,DSx}$ is mapped onto the cells $c'_{m,l,k_{DS}}$ with the smallest index $k_{DS}$. Please note that $c'$ may consist of two groups, i.e. MIXO group 0 and MIXO group 1.

7.6 Preamble and Postamble Generation

The preamble (and postamble) carries all information to obtain initial acquisition to the DVB-NGH frame. Therefore, the preamble transmits the signalling bits as described in section 7.4.2. The preamble is transmitted at the beginning of every DVB-NGH frame. Furthermore, if the DVB-NGH signal is transmitted in DVB-T2 FEFs (or in time division multiple access with any other system), a postamble symbol is transmitted at the end of the NGH frame. Both, preamble and postamble allows for complete channel estimation.

7.6.1 FEC Encoding for Preamble

The signalling bits of the preamble and postamble are protected by an outer shortened BCH encoder and an inner LDPC code. In the following, the preamble encoding is described. The postamble encoding is identical to the encoding of the preamble.

7.6.1.1 Shortened BCH Encoding for Preamble

The inner encoder applies a shortened $(N_{bch}, K_{bch}, t) = (360, 262, 7)$ BCH code defined over $GF(2^{14})$. The signalling bits from the preamble, as described in clause, 7.4.2, have a total length of $N_{pre} \leq 258$. Appending $K_{bch} - N_{pre}$ zeros, where $K_{bch} = 262$ is the input length of the BCH encoder, forms the message bit vector. The generator polynomial g(x) is the same as the one for short FECFRAME of DVB-T2.

7.6.1.2 Shortened and punctured LDPC Encoding for Preamble

The LDPC encoder has a code rate of 360/1440 = ¼. The code is induced from the short LDPC code of rate 2/3 by shortening and puncturing as follows:

(1) Append 10440 zeroes after a 360bits BCH codeword, and encode the 10800 bits.

Information: $(m_0, m_1, ..., m_{359}, m_{360}, m_{361}, ..., m_{10799}) = (m_0, m_1, ..., m_{359}, 0, 0, ..., 0)$ Codeword: $(c_0, c_1, c_2, ..., c_{16199})$ (2) Do the parity interleave.

Before interleave: $(c_0, c_1, c_2, ..., c_{16199})$

After interleave: $(d_0, d_1, d_2, ..., d_{16199})$, where $d_i = c_i$ for $0 \leq i < 10800$ (information bits are not interleaved.)

$d_{10800+360t+s} = c_{10800+15s+t}$ for $0 \leq s < 360, 0 \leq t < 15$.

Refer to the details in DVB-T2 [2].

(3) Choose $0^{th}$, $30^{th}$, $31^{st}$, and $43^{th}$ 360-sized blocks to be transmitted.

$(d_0, d_1, ..., d_{359}, d_{10800}, d_{10801}, ..., d_{11159}, d_{11160}, d_{11161}, ..., d_{11519}, d_{15480}, d_{15481}, ..., d_{15840})$

The total number of transmitted code bits is 1440.

7.6.1.3 Simulation Results for Preamble Encoding

Figure 51:
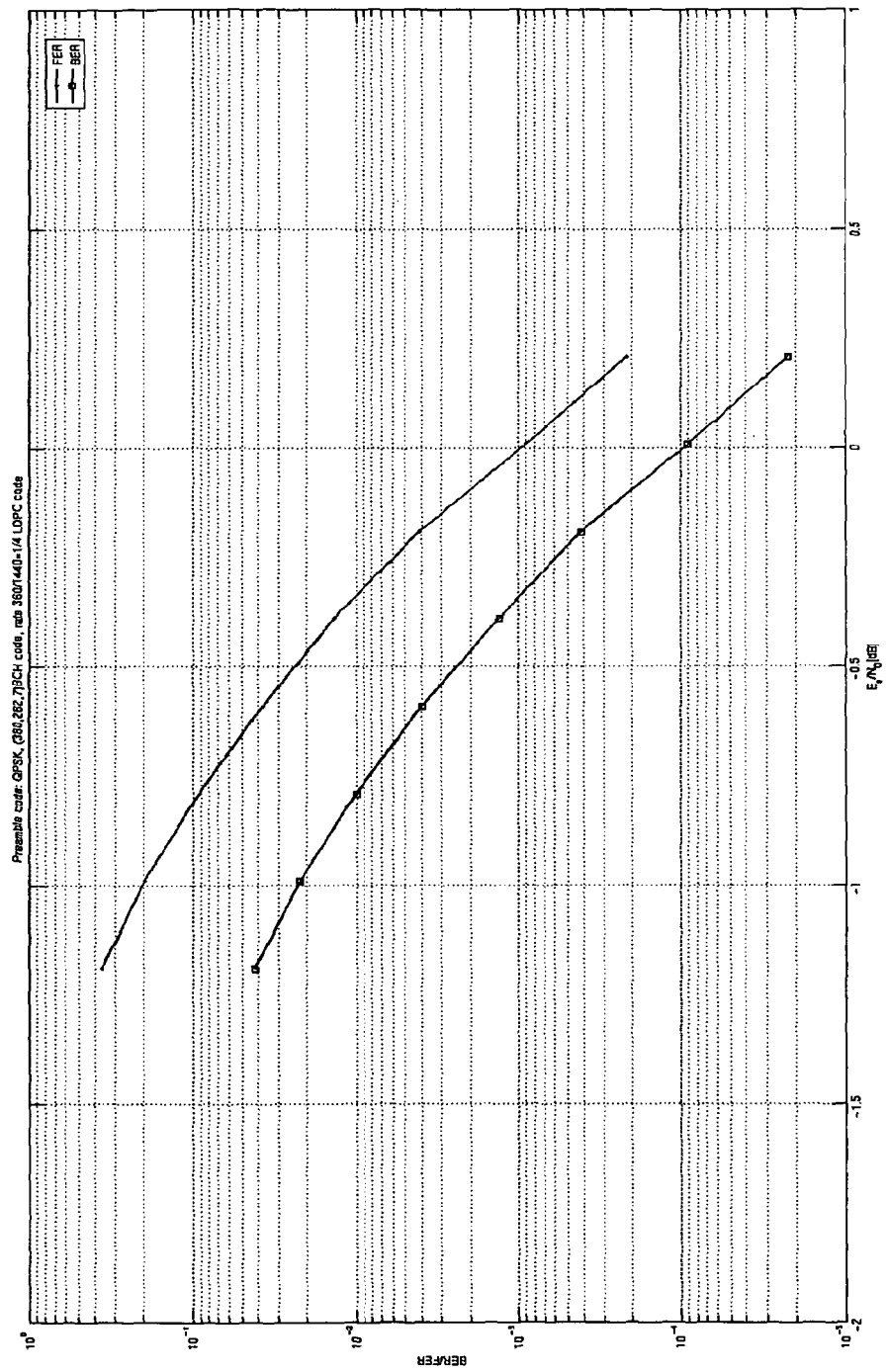
FIG. 51 shows simulation results for preamble encoding over AWGN channel (QPSK modulation)

The proposed encoding scheme operates into the negative C/N region, as shown in Figure 51, and is a good trade-off between robustness and low overhead. Here, at least 50 frame (preamble) errors were measured to give reliable results.

7.6.2 QAM Mapping

The 1440 FEC encoded preamble signalling bits are encoded into 720 QPSK symbols as defined in section 7.2.2.

7.6.3 Frequency Interleaver

The 720 QAM cells $A_{m,l,PR}$ of the preamble are interleaved to the output $X_{m,l,PR}$ vector using the frequency interleaver based on the permutation function $H_0$ (SISO mode), and the parameter $N_{DS} = 720$ as described in section 7.5.2.

7.6.4 Preamble Pilots

The preamble (and postamble) always contains MIXO pilots, and allow for complete channel estimation within one OFDM symbol. A cell within the preamble is a non-inverted pilot if:

$$k_{PR} \bmod 4 = 0,$$

and an inverted pilot if:

$$k_{PR} \bmod 4 = 2.$$

The modulation of both pilots for MIXO group 0 is:

$$\mathrm{Re}\{c^{0'}_{m,l,k_{PR}}\} = A_{PR}$$

$$\mathrm{Im}\{c^{0'}_{m,l,k_{PR}}\} = 0.$$

Furthermore, the modulation of the non-inverted pilots for MIXO group 1 is:

$$\mathrm{Re}\{c^{1'}_{m,l,k_{PR}}\} = A_{PR}$$

$$\mathrm{Im}\{c^{1'}_{m,l,k_{PR}}\} = 0.$$

and $$\mathrm{Re}\{c^{1'}_{m,l,k_{PR}}\} = -A_{PR}$$

$$\mathrm{Im}\{c^{1'}_{m,l,k_{PR}}\} = 0$$

for the inverted pilots. The amplitude in all cases is $A_{PR} = 6/5$.

7.6.5 Mapping of the Preamble Data

The preamble data vector $X_{m,l,PS}$ is mapped onto the cells of Data Slice $x$ that are not occupied by pilots. The mapping is done in an increasing order of $k_{PR}$, i.e. the first cell of the vector $X_{m,l,PR}$ is mapped onto the cells $c'_{m,l,k_{PR}}$ with the smallest index $k_{PR}$. Please note that the preamble payload data is always transmitted in SISO.

7.7 Framing

Figure 52:
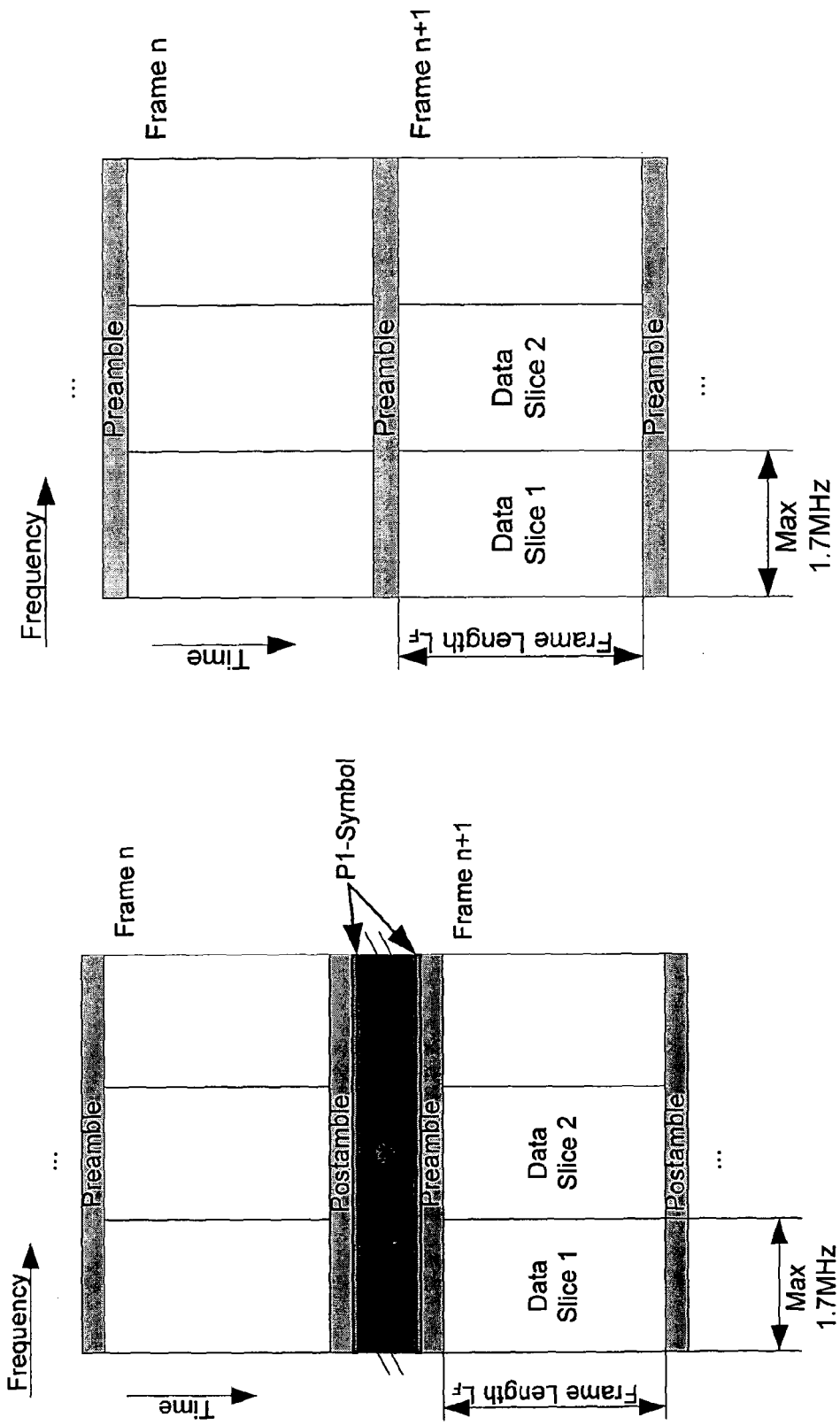
FIG. 52 shows the framing structure in case of TDMA transmission (e.g. in DVB-T2 FEFs) (left hand side) and stand-alone operation (right hand side)

The purpose of the framing is the merging of the preamble and different Data Slices and the insertion of edge pilots. The overall framing concept is adopted from DVB-C2 and offers high flexibility, while maintaining low complexity for receivers. The structure of the proposed system for transmission in DVB-T2 FEFs (or any other transmission system, e.g. LTE) and for stand-alone operation is shown in Figure 52.

At the beginning of every NGH frame a preamble symbol is transmitted. It is followed by $L_F$ OFDM symbols. In case of transmission in e.g. DVB-T2, a postamble is transmitted at the end of the frame. This postamble carries the signalling for the next frame, and additionally, allows for frame closing of the pilots. Furthermore, it carries the length of the DVB-T2 part, which allows a receiver to synchronise on the next DVB-NGH frame immediately. In case of stand-alone operation this postamble is not required. The preamble of the next frame is transmitted instead. If the signal is transmitted inside DVB-T2 FEFs, a P1 symbol according to the DVB T2 standard [2] has to be transmitted at the beginning of each DVB-NGH frame. However, this P1 symbol is not part of the DVB-NGH system.

Between all Data Slices and at the edges of the spectrum special edge pilots are transmitted, which will be described in this clause. The bandwidth of each Data Slice depends on the chosen channel bandwidth and is given in the Data Slice clause.

7.7.1 Insertion of the Preamble and Postamble Symbol

Figure 53:
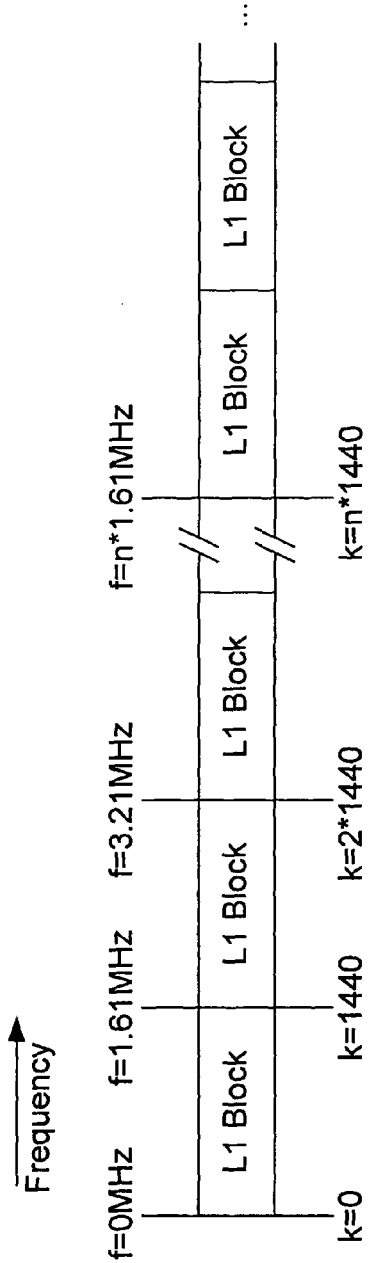
FIG. 53 shows cyclic repetition of the preamble symbol.

The preamble concept is similar to the preamble concept adopted in DVB-C2. The 1440 complex cells that have been generated in the preamble and postamble generation, see clause 7.4.2, are cyclically mapped onto the frequency axis of the preamble symbol, that is the complete preamble repeats itself every 1.61 MHz, as shown in Figure 53. The frequency bandswidth in which a complete preamble is inserted is denoted as an L1 Block. The repetition of L1 Blocks begins at the absolute frequency of 0 MHz, so that this concept is called absolute OFDM.

Naturally, only the spectral parts within the DVB-NGH signal bandwidth are actually transmitted. In the case where the signal does not necessarily start at the beginning of an L1 Block, due to the cyclic structure of the data, the receiver is able to restore the complete signalling data of the preamble. This is valid for any tuning position within the signalling data. In order to avoid high peaks in the time domain signal, the preamble is scrambled using the scrambling sequence $w_k$ described later on.

7.7.2 Assembly of the Data Slices

The data of the different Data Slices is aligned within the frequency domain as defined in DVB-C2.

7.7.3 Edge Pilots

Edge pilots are used at the edges of each Data Slice as shown in Figure 49 (for SISO) and Figure 50 (for MIXO). Edge pilots are always transmitted in MIXO mode, even if the signal is transmitted in SISO operation. This allows for mixing SISO and MIXO Data Slices within the same DVB-NGH signal.

The modulation of the edge pilots for MIXO group 1 (or in case of SISO transmission) is:

$$\text{Re}\{c^{0'}_{m,l,k_{PR}}\} = A_{Edge}$$

$$\text{Im}\{c^{0'}_{m,l,k_{PR}}\} = 0,$$

where $A_{Edge} = 7/3$.

For the MIXO group 2 and even OFDM symbols (i.e. $l \mod 2 = 0$), the pilot modulation is $$\text{Re}\{c^{1'}_{m,l,k_{PR}}\} = A_{Edge}$$

$$\text{Im}\{c^{1'}_{m,l,k_{PR}}\} = 0,$$

and in case of odd OFDM symbols (i.e. $l \mod 2 = 1$), the edge pilot is defined as:

$$\text{Re}\{c^{1'}_{m,l,k_{PR}}\} = -A_{Edge}$$

$$\text{Im}\{c^{1'}_{m,l,k_{PR}}\} = 0.$$

Figure 54:
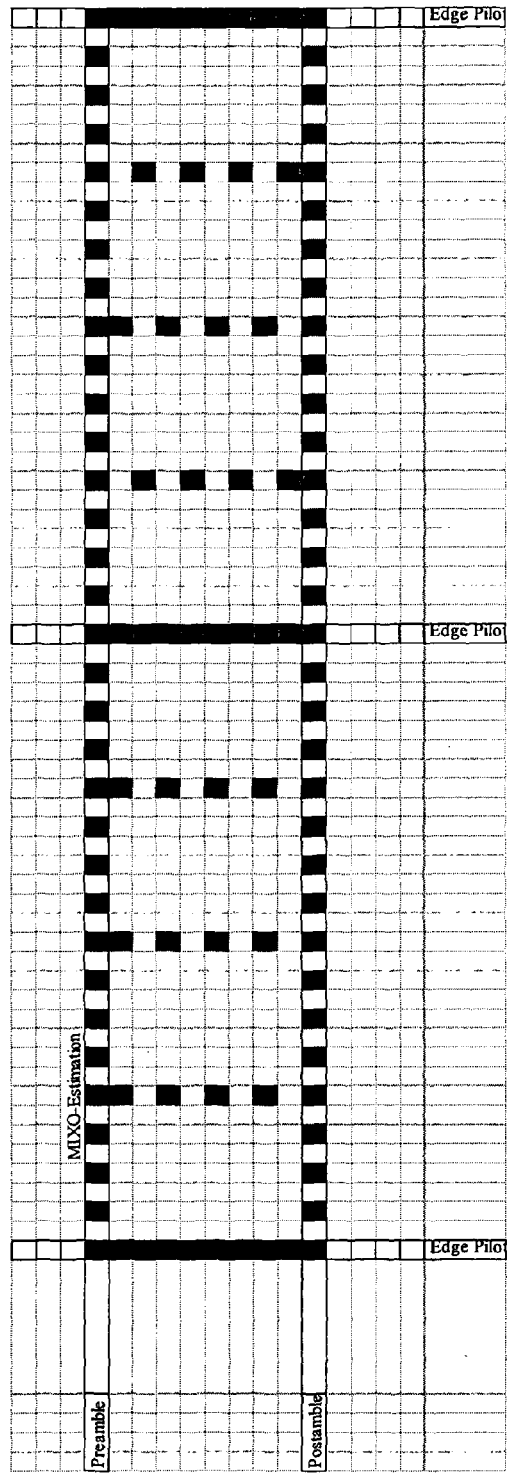
FIG. 54 shows MIXO and SISO within different Data Slices in the same DVB-NGH signal.

An example of the resulting edge pilot structure is shown in Figure 54. In this case, the pilot pattern PP2 has been used in both Data Slices, while the left hand Data Slice used MIXO pilots, and the right hand Data Slices employs SISO pilots, only.

7.7.4 Scrambling

The pilot signals, as well as the data, have not been scrambled in the previous stages. However, this is required to ensure a random-like structure of the signal in the time domain. Furthermore, the same holds for the data. Therefore, scrambling sequences as described below is used for this purpose.

The reference sequence described below is used to scramble the different OFDM subcarriers uniquely. This scrambling sequence is constant for all OFDM symbols.

Figure 55:
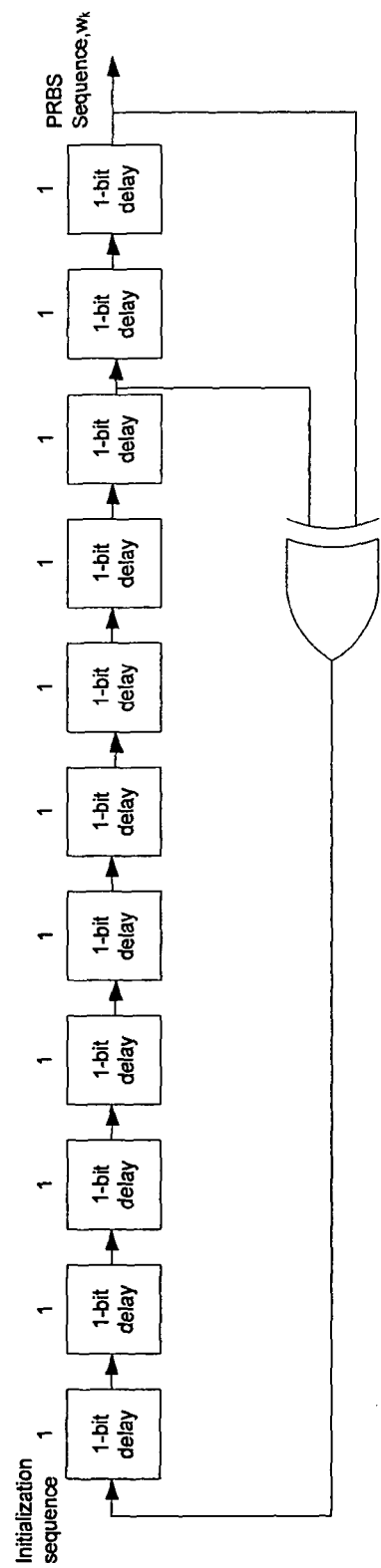
FIG. 55 shows a generator for scrambling sequence.

The PRBS sequence, $w_k$ is generated according to Figure 55, where $w_k$ is the k-th output value of the PRBS generator. Its polynomial for the PRBS generator is:

$$X^{11} + X^2 + 1$$

The shift register is initialized with all '1's so that the sequence begins with $w_0, w_1, w_2... = 1,1,1,1,1,1,1,1,1,1,0,0...$ The unscrambled complex cells $c'_k$ for the given absolute OFDM subcarrier k are scrambled using the k-th output of the scrambling sequence. This can be described by:

$$c_k = c'_k \cdot (-1)^{w_k},$$

which practically means that the phase of the complex cell is rotated by 180 degrees if $w_k=1$, while the phase is unchanged for $w_k=0$. As the scrambling sequence $w_k$ starts at the absolute OFDM subcarrier $k=0$, this also contributes to the concept of absolute OFDM. Furthermore, it causes a specific signature of the DVB-NGH signal in the frequency domain, which allows for fast initial scan, because the receiver is already aware of the scrambling sequence it has to expect at a given signal frequency. Hence, the receiver is able to detect a DVB-NGH signal even if only few 100 kHz of the signal bandwidth are located within its receiver window. Additionally, the unique scrambling ensures a low PAPR, even in the preamble.

7.8 OFDM Generation

The OFDM modulation is based on a similar concept as already used in DVB-T2. This ensures simple adaptation to different channel bandwidth, without any additional receiver complexity. The methods for PAPR reduction are similar as used in DVB-T2.

7.8.1 IFFT Modulation

The proposed OFDM generation is similar to DVB-C2. However, in order to adapt the system for the terrestrial channel, the OFDM subcarrier spacing and the Guard Interval fractions have to be adjusted. Therefore, the application of 1.116 kHz (DVB-T2 8k mode) subcarrier spacing for VHF and UHF operation, and 4.464 kHz (DVB-T2 2k mode) subcarrier spacing for L and S-band are proposed. Furthermore, the proposed Guard Interval fractions are 1/4, 1/8, 1/16 and 1/32. The adaptation to the different bandwidths required by the Commercial Requirements is reached by means of adjusting the number of used OFDM subcarriers.

7.8.2 PAPR

The proposed methods for the aim of peak to average power reduction (PAPR) are similar to the ones used in DVB-T2. These are Reserved Tones for the payload OFDM symbols and ACE for the preamble and postamble symbols.

8 Local Services Insertion Based on Hierarchical Modulation

The insertion of local services in a single frequency network (SFN) poses a particular problem. On the one hand, content needs to be different from locality to locality. On the other hand, all transmitters in an SFN must transmit the same signal at a given time. We assume a national SFN carrying various services via PLPs (denoted as national service PLPs). Local service insertion entails either the replacement of a national service PLP with a local content PLP or superposition of a local content PLP over a given national service PLP in a given locality - the coverage area of one or more adjacent SFN transmitters. Local content can be inserted using hierarchical modulation of the QAM cells which carry the national service PLP with the national service information carried in the high priority bits and the local service information carried on the low priority bits. Within the local area, reception of the local service would require a higher SNR. But this is readily available as most receivers would be in the vicinity of the transmitter. Within the coverage area of adjacent SFN cells, the hierarchically modulated QAM cells would simply "look" like a little more noise requiring a small increase in SNR. This SNR penalty diminishes with distance from the local insertion transmitter. Hierarchical modulation of the PLP cells converts them from a low order QAM to higher order QAM e.g. from QPSK (national service) to 16-QAM (national + local service) or 16-QAM (national service) to 64-QAM (national + local service) or QPSK (national service) to 64-QAM (national + local service). In each case, hierarchical modulation provides at least 2 bits per cell for local service insertion.

To ensure that the hierarchical modulation cells "look" like noise to adjacent SFN receivers, the proposals from the following two clauses have to be fulfilled.

8.1.1 Constellation Rotation

If constellation rotation is used for the national service PLP, the rotation angle applied to the hierarchically modulated cells would be the same as is used in the national service. Thus if the national service is carried for example with 16-QAM, then the hierarchical modulation cells of the 64-QAM would be rotated with the rotation angle for 16-QAM. This is illustrated in Figure 56.

8.1.2 TDM of Local Service Insertion between Neighbouring SFN Transmitters

Figure 57:
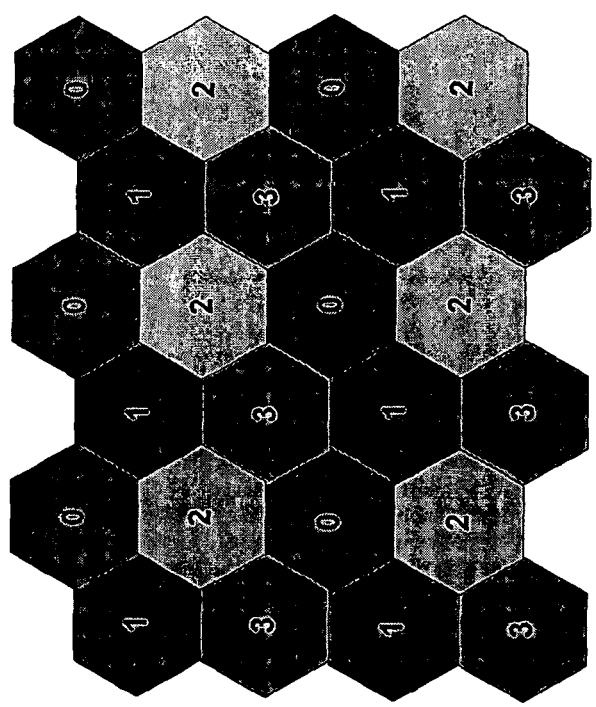
FIG. 57 shows local service insertion slot re-use pattern.

Consider neighbouring SFN transmitters TxA and TxB. In the absence of local insertion, both transmitters carry the same national SFN service in the QAM cells carrying PLP n. When there is need for TxA to insert a local service over PLP n say, there may also be need for TxB to do the same. If the local service to be inserted over PLP n is the same for the coverage areas of the two transmitters, then both transmitters can use similar hierarchical modulation over the QAM cells carrying PLP n. If however, TxA and TxB must insert different local services over PLP n, then doing it simultaneously would cause too much noise within their respective coverage areas for the QAM cells concerned. Solution is to time share the PLP n carrying QAM cells on a burst by burst or frame by frame basis. For example, TxA can hierarchically modulate all the PLP n QAM cells with its local content during even physical layer frames whilst TxB does it only on odd physical layer frames. If there are more neighbouring transmitters to insert different local services, then the time sharing increases. Time share slots can be re-used between transmitters that are sufficiently far apart. Increased time sharing (high re-use factors) also lead to a lower limit on the capacity of local content that can be inserted. Figure 57 illustrates local insertion with time slot re-use factor 4 in a 4 SFN transmitter re-use pattern. In this example, each transmitter (with coverage area shown in a different colour) uses all the QAM cells available in the physical layer frame for which FRAME_NUM modulos 4 is the number shown in the cell. In this case, the capacity of each of the locally inserted services would be at most a quarter of the total capacity available for local insertion. During each physical layer frame therefore, only one out of four transmitters in a cluster would insert local content.

9 MIMO

Besides the normal single-input, single-output (SISO) mode, the modified Alamouti encoding scheme from DVB T2 [2] is adopted. However, it is further proposed to allow for full-rate MIMO, where the number of transmit antennas is limited to two. Here, the 2 x $N_r$ MIMO scheme applies spatial multiplexing of one PLP according to the V-BLAST [9], where $N_r$ is the number of transmit antennas, which must be larger that one for this case.

One unique feature of the segmented OFDM framing structure with different Data Slices as proposed in clause 7.5 is the ability to transmit some PLPs with SISO, others with Alamouti encoded MISO, and again others with full-rate MIMO. This offers a maximum amount of flexibility. The broadcast network operator can choose, e.g., the full rate MIMO mode for a movie service, which requires a high data throughput, while a news service applies Alamouti MISO to increase the robustness of the transmission, while again other services as low bitrate radio can be transmitted with SISO. All three antenna configurations can thus be applied during one NGH frame, in particular, within one OFDM symbol.

The employed MIMO mode is signalled for each PLP in the Signalling PLP in the field PLP_MIMO_MODE, see Table 29. Note that even though the MIMO mode is PLP specific, the pilot patterns are Data Slice specific, see field PILOT_PATTERN in the preamble signalling, Table 29. Hence, the scheduler has to allocate all PLPs of the same MIMO mode into the particular Data Slice that employs the respective pilot pattern. In principal, PLPs with MISO and MIMO transmission have the same requirements on pilot densities and could thus be scheduled into the same Data Slice.

9.1 SISO and MISO Transmission

No changes to the DVB-T2 standard [2] are proposed, such that normal SISO transmission and MISO according to the modified space-frequency coding Alamouti scheme from [2] are fully adopted.

The entry PLP_MIMO_MODE, which is signalled in the Signalling PLP, is 0 for SISO transmission mode and 1 for Alamouti encoded MISO.

9.2 Spatial Multiplexing MIMO Transmission

This mode is signalled with PLP_MIMO_MODE = 2. The MIMO encoding operates according to the V-BLAST [9] architecture, which is simply a serial-to-parallel conversion (de-multiplexing) of one FEC encoded data stream (here: output of time interleaver block) into two parallel output streams. The first stream is fed to the scheduler, which operates for transmit antenna 1, while the second stream is fed to the scheduler, which operates for transmit antenna 2. The blocks following the Data Slice processing unit apply frequency interleaving and pilot insertion as discussed in previous clauses.

It is also be possible to de-multiplex two different PLPs or at least associated PLPs in the MIMO encoder. However, this would require the receiver to spatially equalize both PLPs, even though the data might not be of interest. Assume, e.g., that for SVC low-resolution video stream is transmitted over antenna 1, while the high-resolution stream is transmitted over antenna 2. If the ModCod parameters of the high-resolution stream prevent successful decoding of this (associated) PLP, the receiver would still need to apply spatial equalization, even though it will ignore the high-resolution. It would be more beneficial with respect to processing power and energy consumption, if in this example, the low-resolution stream is transmitted within a certain Data Slice (applying any MIMO scheme, e.g, MISO for increasing robustness), while the high-resolution stream is transmitted at a later time instance in the NGH frame (in the same or another Data Slice – applying e.g., MIMO transmission to increase throughput). If decoding of the latter fails, the second receive antenna could be switched off, and only the low-resolution PLP would be detected.

10 Scalable Video Coding

10.1 Mixed MIMO / SISO

The architecture allows using mixed SISO, MISO and MIMO operation as well as mixed pilot pattern within one NGH frame. Combined with the transparent PLP approach this is seen as a valuable option to provide reliable and best possible delivery of typical applications to a mobile device.

For example, mixed MIMO/MISO/SISO operation within a NGH frame in combination with Scalable Video Coding (SVC) is a promising candidate to enable reliable delivery of video services, even in difficult reception conditions (e.g. low reception level and/or correlated MIMO channels): While the larger bitstream with the high video quality component is MIMO encoded in order to save bandwidth (potentially even in combination with a less robust ModCod selection), the lower bitstream with the base video quality is SISO encoded (potentially with more robust ModCods). In typical reception cases the receiver will be able to decode the MIMO encoded high quality video part. If MIMO decoding fails, the receiver can still decode the more robust SISO path with the base quality video.

The two different PLPs with the two different scalable video streams are linked in the signalling as 'associated PLPs'.

10.2 Application of IR

One application of IR is its use together with scalable video coding (SVC) to allow for graceful degradation. Assuming, a video stream is hierarchically encoded by means of SVC and is separated into a low- and a high-resolution PLP (one is signalled as associate PLP to the other). Both PLPs are FEC encoded with the same LDPC encoder of rate $R_0$, but the low-resolution stream uses in addition the IR of the extended LDPC code (extended from rate $R_0$ to $R_1$). For good channel conditions, decoding of the basic code (rate $R_0$) is possible and both PLPs can be detected, allowing for a high-resolution video. If the channel conditions worsen and decoding of the basic FEC fails, the receiver should neglect the high-resolution PLP, demodulate the IR part of the low-resolution PLP and decode the extended LDPC code of rate $R_1 < R_0$. Hence, the signal is not completely lost, but a low-resolution video may still be displayed (graceful degradation).

11 Throughput rates

This chapter gives an overview on the throughput rates of the proposed NGH system.

The given throughput rates consider all relevant overhead for an 8MHz NGH operation mode, except for the Signalling PLP and in-band signalling overhead. The parameters considered are:

- Guard interval

- Scattered pilot pattern overhead (PP is chosen according GI length)

- Continual pilot overhead

- Edge pilot overhead

- Pre-/postamble overhead (NGH located in FEFs, frame length approx. 250 msec)

- FEC overhead

- MIMO gain

- Different constellation sizes

Figure 58:
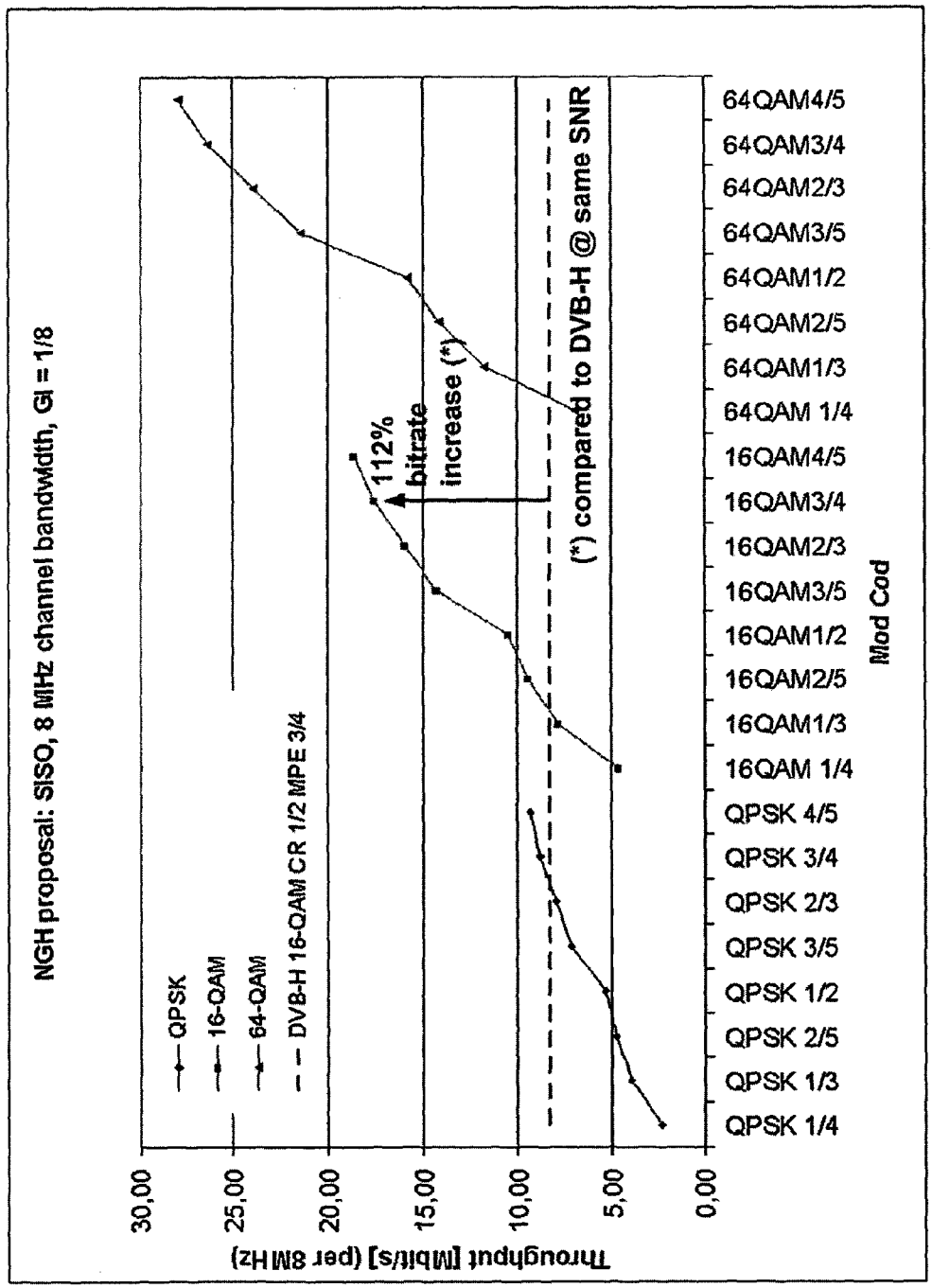
FIG. 58 shows SISO throughput rates for different ModCods.
Figure 59:
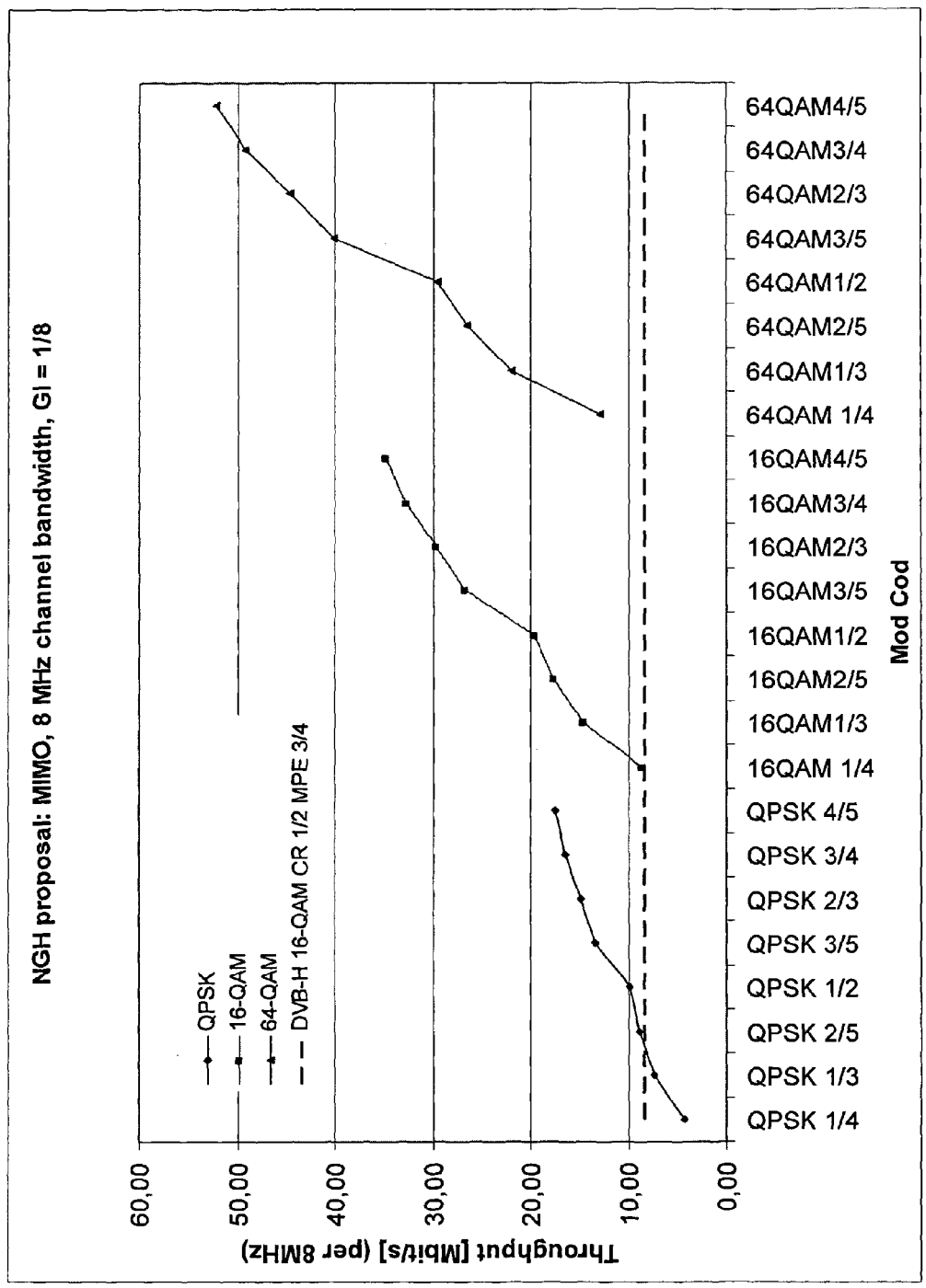
FIG. 59 shows MIMO throughput rates for different ModCods.

The throughput rates can be seen in Table 37, Table 38 and are presented in graphical form in Figure 58 and Figure 59. For reference the bitrate of a typical DVB-H operation mode (16-QAM CR ½ MPE ¾) is inserted in Figure 58 and Figure 59. This DVB-H mode requires 11.8 dB SNR in the P1 Rayleigh channel and provides a bitrate of approx. 8.3 MBit/s. It is expected that due to the close relation of the NGH proposal to DVB-T2 the SISO system performance figures given in the DVB-T2 Implementation Guidelines [12] can be taken as a good first approximation. 16-QAM CR ¾ is the T2 mode with the closest SNR requirement (12.4 dB) for the P1 Rayleigh channel, allowing a bitrate in our proposal of 17.6 MBit/s for the SISO case. This results in a rough bitrate increase of 112%. For the MIMO case this already huge increase is expected to be even higher (*). Therefore the required throughput gain of at least 50% compared to DVB-H (CR #28) is significantly exceeded.

(*) Note: Benchmarking the MIMO performance within the agreed MIMO channel models will follow.

11.1 SISO modes

Table 37: Throughput rates (8MHz mode) - SISO

| Constel-lation | Code rate | Effective Code Rate | Bitrate (MBit/s) | | | |
|---|---|---|---|---|---|---|
| | | | GI 1/4 | GI 1/8 | GI 1/16 | GI 1/32 |
| QPSK | 1/4 | 1/5 | 1.93 | 2.30 | 2.52 | 2.60 |
| QPSK | 1/3 | 1/3 | 3.29 | 3.92 | 4.29 | 4.42 |
| QPSK | 2/5 | 2/5 | 3.97 | 4.73 | 5.18 | 5.34 |
| QPSK | 1/2 | 4/9 | 4.42 | 5.27 | 5.77 | 5.95 |
| QPSK | 3/5 | 3/5 | 6.01 | 7.16 | 7.84 | 8.08 |
| QPSK | 2/3 | 2/3 | 6.69 | 7.97 | 8.72 | 8.99 |
| QPSK | 3/4 | 11/15 | 7.37 | 8.78 | 9.61 | 9.90 |
| QPSK | 4/5 | 7/9 | 7.82 | 9.32 | 10.20 | 10.51 |
| 16-QAM | 1/4 | 1/5 | 3.87 | 4.61 | 5.04 | 5.19 |
| 16-QAM | 1/3 | 1/3 | 6.58 | 7.84 | 8.58 | 8.85 |
| 16-QAM | 2/5 | 2/5 | 7.94 | 9.46 | 10.36 | 10.67 |
| 16-QAM | 1/2 | 4/9 | 8.85 | 10.54 | 11.54 | 11.89 |
| 16-QAM | 3/5 | 3/5 | 12.02 | 14.32 | 15.67 | 16.15 |
| 16-QAM | 2/3 | 2/3 | 13.38 | 15.94 | 17.45 | 17.98 |
| 16-QAM | 3/4 | 11/15 | 14.74 | 17.56 | 19.22 | 19.80 |
| 16-QAM | 4/5 | 7/9 | 15.65 | 18.64 | 20.40 | 21.02 |
| 64-QAM | 1/4 | 1/5 | 5.80 | 6.91 | 7.56 | 7.79 |
| 64-QAM | 1/3 | 1/3 | 9.88 | 11.76 | 12.88 | 13.27 |
| 64-QAM | 2/5 | 2/5 | 11.92 | 14.19 | 15.54 | 16.01 |
| 64-QAM | 1/2 | 4/9 | 13.27 | 15.81 | 17.31 | 17.84 |
| 64-QAM | 3/5 | 3/5 | 18.03 | 21.48 | 23.51 | 24.23 |
| 64-QAM | 2/3 | 2/3 | 20.07 | 23.91 | 26.17 | 26.97 |
| 64-QAM | 3/4 | 11/15 | 22.11 | 26.34 | 28.83 | 29.71 |
| 64-QAM | 4/5 | 7/9 | 23.47 | 27.95 | 30.60 | 31.53 |

NOTE 1: Figures in italics are approximate values.
NOTE 2: Bit rates do not take into account loss due to signalling PLP and inband signalling

11.2 MIMO modes

Table 38: Throughput rates (8MHz mode) - MIMO

| Constel-lation | Code rate | Effective Code Rate | Bitrate (MBit/s) | | | |
|---|---|---|---|---|---|---|
| | | | GI 1/4 | GI 1/8 | GI 1/16 | GI 1/32 |
| QPSK | 1/4 | 1/5 | 3.31 | 4.30 | 4.88 | 5.03 |
| QPSK | 1/3 | 1/3 | 5.64 | 7.32 | 8.31 | 8.56 |
| QPSK | 2/5 | 2/5 | 6.81 | 8.83 | 10.02 | 10.33 |
| QPSK | 1/2 | 4/9 | 7.59 | 9.84 | 11.17 | 11.51 |
| QPSK | 3/5 | 3/5 | 10.30 | 13.36 | 15.17 | 15.63 |
| QPSK | 2/3 | 2/3 | 11.47 | 14.88 | 16.88 | 17.40 |
| QPSK | 3/4 | 11/15 | 12.63 | 16.39 | 18.60 | 19.17 |
| QPSK | 4/5 | 7/9 | 13.41 | 17.39 | 19.74 | 20.34 |
| 16-QAM | 1/4 | 1/5 | 6.63 | 8.60 | 9.76 | 10.05 |
| 16-QAM | 1/3 | 1/3 | 11.29 | 14.64 | 16.62 | 17.12 |
| 16-QAM | 2/5 | 2/5 | 13.62 | 17.66 | 20.05 | 20.66 |
| 16-QAM | 1/2 | 4/9 | 15.17 | 19.68 | 22.33 | 23.01 |
| 16-QAM | 3/5 | 3/5 | 20.61 | 26.73 | 30.34 | 31.26 |
| 16-QAM | 2/3 | 2/3 | 22.94 | 29.75 | 33.77 | 34.80 |
| 16-QAM | 3/4 | 11/15 | 25.27 | 32.77 | 37.19 | 38.33 |
| 16-QAM | 4/5 | 7/9 | 26.82 | 34.79 | 39.48 | 40.69 |
| 64-QAM | 1/4 | 1/5 | 9.94 | 12.89 | 14.63 | 15.08 |
| 64-QAM | 1/3 | 1/3 | 16.93 | 21.96 | 24.92 | 25.68 |
| 64-QAM | 2/5 | 2/5 | 20.43 | 26.49 | 30.07 | 30.99 |
| 64-QAM | 1/2 | 4/9 | 22.76 | 29.52 | 33.50 | 34.52 |
| 64-QAM | 3/5 | 3/5 | 30.91 | 40.09 | 45.50 | 46.89 |
| 64-QAM | 2/3 | 2/3 | 34.41 | 44.63 | 50.65 | 52.19 |
| 64-QAM | 3/4 | 11/15 | 37.90 | 49.16 | 55.79 | 57.50 |
| 64-QAM | 4/5 | 7/9 | 40.23 | 52.18 | 59.22 | 61.03 |

NOTE 1: Figures in italics are approximate values.
NOTE 2: Bit rates do not take into account loss due to signalling PLP and inband signalling

12 References

[1] ETSI EN 302 307: "Digital Video Broadcasting (DVB); Second generation framing structure, channel coding and modulation systems for Broadcasting, Interactive Services, News Gathering and other broadband satellite applications".

[2] EN 302 755 V1.1.1 – "Frame structure channel coding and modulation for a second generation digital terrestrial television broadcasting system (DVB-T2)".

[3] DVB BlueBook A138: "Frame structure channel coding and modulation for a second generation digital transmission system for cable systems (DVB-C2)".

[4] ISO/IEC 13818-1: "Information technology - Generic coding of moving pictures and associated audio information: Systems".

[5] ETSI TS 102 606: "Digital Video Broadcasting (DVB); Generic Stream Encapsulation (GSE) Protocol".

[6] DVB-CM-NGH015R1 - Commercial Requirements for DVB-NGH DVB CM-NGH Version 1.01

[7] RFC 5225 - RObust Header Compression Version 2 (ROHCv2): Profiles for RTP, UDP, IP, ESP and UDP-Lite.

[8] Draft ETSI TR 102 8xx - DVB Digital Video Broadcasting (DVB); Implementation Guidelines for a second generation digital cable transmission system (DVB-C2).

[9] Wolniansky, P.W.; Foschini, G.J.; Golden, G.D.; R.A. Valenzuela, R.A.; "V-BLAST: an architecture for realizing very high data rates over the rich-scattering wireless channel", ISSSE 1998, URSI Int. Symposium, pp. 295–300

[10] ETSI TS 102 034: "Transport of MPEG-2 TS Based DVB Services over IP Based Networks", v1.4.1 August 2008.

[11] ETSI TS 101 154: "Specification for the use of Video and Audio Coding in Broadcasting Applications based on the MPEG-2 Transport Stream", v1.9.1, Sept 2009.

[12] Draft ETSI TR 102 831 – "Digital Video Broadcasting (DVB); Implementation guidelines for a second generation digital terrestrial television broadcasting system (DVB-T2)"

[13] "DVB TM-H NGH Call for Technologies (CfT), v 1.0 (TM4270r2), 19 November 2009"

13 Annex

13.1 Comparison of the proposal with the commercial requirements

| N° | General Requirements | Response |
|---|---|---|
| 1 | The system shall be configurable either as a broadcasting system (unidirectional) or as a system incorporating also an interaction channel (bidirectional). | *The proposed system is especially suited as broadcast medium but allows also the inclusion of a return channel by means of the application of IP transmission.* |
| 2 | The time taken to start to consume NGH services when switching from non-NGH application/service should be faster than DVB-H or other similar systems in the market. | *Met – the proposed signalling scheme allows very fast zapping times. Initial acquisition (i.e. receiver switch-on) is extremely fast due to the unique pilot signature in the frequency domain.* |
| 3 | The DVB-NGH specification should enable distribution of location based content/services within an SFN with minimum increase to network overhead. | *A local service insertion mechanism in a SFN context is proposed, applying hierarchical modulation in local service areas* |
| 4 | The NGH system shall enable significantly shorter service interruption than DVB-H when a user changes from one NGH service to another and in any case be competitive with other state-of the art mobile TV systems. | *Fully met – see comment in CR #2* |
| 5 | The new specification should enable low power consumption at least comparable to the one of the existing DVB-H receivers. | *Fully met – the proposed system is especially suited to combine time slicing and a segmented OFDM approach for best possible energy savings. Furthermore a power efficient 4k LDPC code is proposed.* |
| 6 | The DVB-NGH specification should be designed to allow for real time interaction with a DVB-NGH service with a minimum of broadcast downlink latency delay. | *Partially met – as in T2 the proposed NGH transmitter needs to prepare an overall frame in advance.* |
| 7 | The DVB-NGH specification shall be optimized for outdoor and deep indoor portable and slow mobile reception (pedestrian ≤15 km/h). | *Fully met – the irregular subslicing structure avoids any degradation coming from slow-fading Doppler frequencies. The proposed OFDM parameters based on the T2 8k mode can easily cope with the described scenarios* |

| | | |
|---|---|---|
| 8 | The DVB-NGH specification shall also be optimized for in-vehicle and outdoor mobile vehicular reception (15 to 350 km/h). | *The proposed OFDM parameters based on the T2 8k mode fully meets the high speed conditions in the Bands III-V. For S-Band and L-Band operation a lower transmitter IFFT mode is proposed (2k mode).* |
| 9 | The DVB-NGH specification should be designed for co-existence with other broadcasting and wireless/mobile telecommunication systems on the transmitter/base station side. | *The proposed system has no restrictions on that CR.* |
| 10 | The DVB-NGH specification shall be designed for allowing co-existence with other broadcasting and wireless/mobile telecommunication systems on the receiver/mobile station side. | *The proposed system has no restrictions on that CR.* |
| 11 | The DVB-NGH specification shall be designed to operate at least in the frequency bands III, IV and V, L-band and S-band. | *All required bands are supported Higher bands will adopt a lower FFT size to work best possible in the mobile environment.* |
| 12 | DVB-NGH shall be designed to operate in RF channel bandwidths of 1.7, 5, 6, 7, 8, 10, 15 and 20 MHz. | *Fully met – the proposed C2 like framing structure with underlying Data Slices is especially suited and allows the adaptation to all required bandwidths while keeping the receiver complexity limited (i.e. smaller reception bandwidth).* |
| 13 | DVB-NGH shall meet interference levels and spectrum mask requirements as defined by GE06 (and hence not cause more interference than DVB-T or T-DAB would do). It would be highly desirable if DVB-NGH could cause less interference than other broadcast systems for mobile TV. | *Fully met - Since the proposal is based on the T2 8k mode it meets this requirement in the same way as T2 does.* |
| 14 | The NGH system shall support both IP-based and TS-based upper layer solutions, taking into consideration the two application areas as in chapter 4.2. | *This requirement is covered in the proposal.* |
| 15 | The system shall be designed for terrestrial use and it may also contain a satellite component. | *The proposal is designed only for a terrestrial component. However, there is no restriction to use the proposed system also for satellite transmission, e.g. in SFN operation with terrestrial transmitters.* |
| 16 | In ideal channel conditions the DVB-NGH specification shall enable a Quasi-Error Free (QEF) quality of service, i.e. less than one uncorrected error event per hour.<br><br>For all channel models identified as relevant for portable and mobile reception the DVB-NGH specification shall enable a quality of service equivalent to no more than one corrupted second to any audio or video component per minute. | *The proposed system is designed to provide best possible performance in mobile environment. First simulation results prove the performance, final benchmarking in all relevant channel models will follow (1$^{st}$ agreed MIMO models have just become available).* |
| 17 | The system shall support in-band configuration of remote sites. | *The proposal has no special solution, but also no restriction in relation to that CR.* |
| 18 | The system should support for the transport of the whole stream to transmitters over non synchronous networks such as IP. | *The system is rather IP centric and fulfils this requirement completely.* |

| 19 | Individual quality for service components should be possible. | *The PLP approach with individual ModCod settings as well as the scalable MIMO applicability within a NGH frame fully meets this requirement.* |
|---|---|---|
| 20 | The NGH standard should offer graceful degradation mechanism in fringe areas of the network. | *The proposed incremental redundancy concept in combination with SVC (Scalable Video Coding) allows graceful degradation and improved performance in fringe areas of the network. SVC in combination with mixed MIMO/SISO is also a means to provide graceful degradation.* |
| 21 | The system shall allow flexible network design – SFN and MFN. For MFN, it should accommodate multiple configurations (robust or high Doppler) within an MFN. | *The proposal meets this requirement, all relevant MFN and SFN operation scenarios are expected to be covered.* |
| 22 | The NGH standard should allow for a NGH service to be offered in different qualities. The lower quality being more robust, e.g. based on the use of scalable video coding. | *With the help of associated PLPs services with different qualities are easy to implement, although the physical layer itself is transparent.* |
| 23 | The system shall enable use of shared service components for different services, e.g. Teletext, alert messaging. | *These services can easily be included as (part of) PLPs.* |
| 24 | The video, audio or data net throughput shall be maximized for a given reception condition (e.g. C/N), i.e. overheads such as packet headers and metadata should be minimized, without losing functionality. | *The proposal minimizes overhead (e.g. signalling) as much as possible while providing enough robustness for mobile reception. For IP headers existing mechanism are reused (e.g. ROHC).* |
| 25 | Dynamic multiplex reconfigurations should be enabled and should be followed seamlessly by the terminals. | *The proposed system is flexible enough to fulfil this requirement.* |
| 26 | Automatic service following - as seamless as possible - should be enabled from cell to cell and also to other bearer systems including DVB-H. | *In an SFN environment this requirement is fulfilled automatically. Furthermore, the proposal supports handover between different cells of one DVB-NGH network. Meachnisms for handover with other bearer system are not inlucded in this proposal, as it focuses on the physical layer* |
| 27 | The DVB-NGH specification (physical layer specification) shall be designed to be transparent to higher layers. While this is the case it is still highly desirable that the total DVB-NGH system allows for cross-layer optimization. | *The chosen T2 like PLP approach provides the required transparency.* |

| 28 | The preference, in terms of performance improvement, is on robustness and indoor coverage. Recognizing that capacity can be traded for robustness, the overall capacity improvement, for a given robustness, shall be at least 50% compared to DVB-H. | *The spectral efficiency of the system exceeds the required 50% for similar SNR values or comparable channel conditions. In a typical example the bitrate is increased by 112%.* |
|---|---|---|
| 29 | The DVB-NGH specification should allow for the re-use of DVB-H RF network structures mixing several sites profiles (e.g. from high power/high broadcast towers to low power/low sites similar to 3G sites) and distribution networks as far as possible. | *The configurable OFDM parameters (i.e. Guard Interval, pilot density) support the application in different scenarios, i.e. channel bandwidths, while using a minimum of overhead..* |
| 30 | It shall be possible to combine DVB-NGH and DVB-T2 signals in one RF channel | *Fully met – the proposed framing structure allows a flexible and energy efficient NGH operation in T2 NGH frames.* |
| 31 | The DVB Technical Module is requested to complete the DVB-NGH technical specification(s) by the end of 2011. | *The proposed building blocks are already part of other DVB standards (i.e. framing structure in C2) or contain limited complexity. A prove of concept is expected to be feasible within the given time frame.* |

13.2 Indices List for LDPC codes of $N_{ldpc} = 4\ 320$

Table 39: Rate 1/4

58 311 554 679 783 1280 1500 1545 1821 2089 2105 2251 3004
255 728 2316 2854 3170
162 2083 2446 2637 2693

Table 40: Rate 1/3

231 416 587 952 1189 1523 1602 1750 1833 1894 2236 2620 2869
951 1160 2509 2849
472 1089 2326 2787
474 591 2500 2866

Table 41: Rate 5/12

24 441 446 550 880 921 980 1038 1515 1710 1847 2234 2360
55 131 1943 2409
69 178 405 1962
284 449 728 808
357 915 975 1708

Table 42: Rate 1/2

118 375 395 490 552 599 895 954 1005 1517 1576 1739 2030
194 1547 1598 1801
140 238 253 1734
243 378 919 1188
201 1005 1033 1128
202 727 782 1100

Table 43: Rate 7/12

125 447 543 634 864 1112 1124 1206 1268 1484 1568 1668 1672
105 605 821 1587
50 531 803 1595
226 410 810 1378
27 925 933 966
131 261 687 1079
207 1054 1706 1764

Table 44: Rate 2/3

```
15 253 313 501 563 582 865 911 977 1266 1276 1356 1427
256 743 982 1109
343 525 976 1102
12 502 539 782
556 593 1120 1420
18 119 431 460
178 253 416 771
74 100 205 1214
```

Table 45: Rate 3/4

```
109 116 136 141 178 238 250 503 566 723 978 1065 1068
113 191 586 1003
219 426 583 1061
329 429 576 855
121 231 337 620
199 216 676 831
223 560 686 713
632 944 1015 1043
171 365 514 882
```

13.3 Addresses of parity bit accumulators for $N_{ldpc}$ = 16 200 of extended LDPC codes for incremental redundancy:

Note: new accumulator addresses written in bold numbers

Table 46: Rate 1/2 (true code rate 4/9)

| | | | | | | | | |
|---|---|---|---|---|---|---|---|---|
| 20 | 712 | 2386 | 6354 | 4061 | 1062 | 5045 | 5158 | 21931 |
| 21 | 2543 | 5748 | 4822 | 2348 | 3089 | 6328 | 5876 | 18516 |
| 22 | 926 | 5701 | 269 | 3693 | 2438 | 3190 | 3507 | 15208 |
| 23 | 2802 | 4520 | 3577 | 5324 | 1091 | 4667 | 4449 | 11103 |
| 24 | 5140 | 2003 | 1263 | 4742 | 6497 | 1185 | 6202 | 21832 |
| 0 | 4046 | 6934 | 11814 | 14492 | 14732 | 17441 | 22958 | 24158 |
| 1 | 2855 | 66 | 12677 | 15469 | 16590 | 17335 | 24881 | 25048 |
| 2 | 6694 | 212 | 9299 | 15472 | 16050 | 19318 | 22560 | 22621 |
| 3 | 3439 | 1158 | 9538 | 12794 | 13449 | 14563 | 18826 | 21857 |
| 4 | 3850 | 4422 | 15306 | 17348 | 19304 | 20302 | 22793 | 23203 |
| 5 | 5924 | 290 | 11561 | 12409 | 18036 | 19356 | 19690 | 21475 |
| 6 | 1467 | 4049 | 11589 | 14062 | 16483 | 18539 | 21450 | 24235 |
| 7 | 7820 | 2242 | 9828 | 9841 | 15815 | 19907 | 22539 | 24116 |
| 8 | 4606 | 3080 | 10697 | 10835 | 17101 | 17377 | 23005 | 24555 |
| 9 | 4633 | 7877 | 12248 | 17230 | 20460 | 21249 | 23993 | 24507 |
| 10 | 3884 | 6868 | 14656 | 16500 | 16657 | 19385 | 21933 | |
| 11 | 8935 | 4996 | 10180 | 13928 | 14642 | 20505 | 24121 | |
| 12 | 3028 | 764 | 10876 | 18480 | 19804 | 20591 | 21407 | |
| 13 | 5988 | 1057 | 10057 | 11363 | 22164 | 23159 | 24997 | |
| 14 | 7411 | 3450 | 11160 | 13421 | 21380 | 21482 | 22197 | |

Table 47: Rate 3/5

| | | | | | | | | | | |
|---|---|---|---|---|---|---|---|---|---|---|
| 71 | 1476 | 1901 | 2240 | 2649 | 2725 | 3592 | 3708 | 3965 | 4080 | 5733 | 6198 |
| 393 | 1384 | 1435 | 1878 | 2773 | 3182 | 3586 | 5465 | 6091 | 6110 | 6114 | 6327 |
| 160 | 1149 | 1281 | 1526 | 1566 | 2129 | 2929 | 3095 | 3223 | 4250 | 4276 | 4612 |
| 289 | 1446 | 1602 | 2421 | 3559 | 3796 | 5590 | 5750 | 5763 | 6168 | 6271 | 6340 |
| 947 | 1227 | 2008 | 2020 | 2266 | 3365 | 3588 | 3867 | 4172 | 4250 | 4865 | 6290 |
| 3324 | 3704 | 4447 | 9541 | 11280 | 15341 | 18544 | | | | | |
| 1206 | 2565 | 3089 | 9452 | 12449 | 16615 | 17605 | | | | | |
| 529 | 4027 | 5891 | 7794 | 19046 | 19119 | 21536 | | | | | |
| 141 | 1187 | 3206 | 11442 | 13540 | 13717 | 14366 | | | | | |
| 1990 | 2972 | 5120 | 14717 | 14754 | 19356 | 19725 | | | | | |
| 752 | 796 | 5976 | 12613 | 15111 | 16917 | 19627 | | | | | |
| 1129 | 2377 | 4030 | 12161 | 15392 | 20670 | 21691 | | | | | |
| 6077 | 6108 | 6231 | 9845 | 11360 | 15990 | 16564 | | | | | |
| 61 | 1053 | 1781 | 9635 | 10213 | 14108 | 20157 | | | | | |
| 2820 | 4109 | 5307 | 9245 | 10139 | 10168 | 13538 | | | | | |
| 2088 | 5834 | 5988 | 9474 | 11519 | 13449 | 21438 | | | | | |
| 3725 | 3945 | 4010 | 8280 | 13589 | 21139 | 22351 | | | | | |
| 1081 | 2780 | 3389 | 10660 | 10727 | 13101 | 16117 | | | | | |
| 659 | 2221 | 4822 | 8382 | 10072 | 16246 | 18001 | | | | | |
| 3033 | 6060 | 6160 | 11286 | 11644 | 13351 | 14707 | | | | | |
| 756 | 1489 | 2350 | 6953 | 7865 | 10732 | 19456 | | | | | |
| 3350 | 3624 | 5470 | 14395 | 15852 | 18311 | 21527 | | | | | |
| 357 | 1825 | 5242 | 10323 | 13913 | 15338 | 22082 | | | | | |
| 585 | 3372 | 6062 | 10231 | 14400 | 14922 | 16589 | | | | | |
| 561 | 1417 | 2348 | 12432 | 12887 | 17481 | 22485 | | | | | |
| 971 | 3719 | 5567 | 7091 | 8079 | 19378 | 20819 | 21275 | | | | |
| 1005 | 1675 | 2062 | 8692 | 10722 | 11912 | 17491 | 18163 | | | | |

Table 48: Rate 2/3

| | | | | | | | | | | | |
|---|---|---|---|---|---|---|---|---|---|---|---|
| 0 | 2084 | 1613 | 1548 | 1286 | 1460 | 3196 | 4297 | 2481 | 3369 | 3451 | 4620 | 2622 |
| 1 | 122 | 1516 | 3448 | 2880 | 1407 | 1847 | 3799 | 3529 | 373 | 971 | 4358 | 3108 |
| 2 | 259 | 3399 | 929 | 2650 | 864 | 3996 | 3833 | 107 | 5287 | 164 | 3125 | 2350 |
| 3 | 342 | 3529 | 7311 | 9608 | 13716 | 19002 | | | | | | |
| 4 | 4198 | 2147 | 8268 | 10733 | 15904 | 17839 | | | | | | |
| 5 | 1880 | 4836 | 14204 | 15736 | 16150 | 19640 | | | | | | |
| 6 | 3864 | 4910 | 5963 | 9085 | 10938 | 18686 | | | | | | |
| 7 | 243 | 1542 | 8274 | 12313 | 17889 | 20805 | | | | | | |
| 8 | 3011 | 1436 | 12182 | 16130 | 16958 | 21462 | | | | | | |
| 9 | 2167 | 2512 | 6827 | 7272 | 14255 | 18304 | | | | | | |
| 10 | 4606 | 1003 | 6318 | 8133 | 13289 | 18978 | | | | | | |
| 11 | 2835 | 705 | 9140 | 13667 | 15001 | 16738 | | | | | | |
| 12 | 3426 | 2365 | 7909 | 15603 | 19927 | | | | | | | |
| 13 | 3848 | 2474 | 13027 | 13777 | 20634 | | | | | | | |
| 14 | 1360 | 1743 | 10224 | 10971 | 14907 | | | | | | | |
| 0 | 163 | 2536 | 5747 | 10314 | 10395 | | | | | | | |
| 1 | 2583 | 1180 | 11198 | 15773 | 18917 | | | | | | | |
| 2 | 1542 | 509 | 9291 | 10938 | 12837 | | | | | | | |
| 3 | 4418 | 1005 | 5690 | 15533 | 16382 | | | | | | | |
| 4 | 5212 | 5117 | 9605 | 15605 | 19763 | | | | | | | |
| 5 | 2155 | 2922 | 6119 | 9142 | 16450 | | | | | | | |
| 6 | 347 | 2696 | 6956 | 8879 | 9200 | | | | | | | |
| 7 | 226 | 4296 | 15677 | 16248 | 20706 | | | | | | | |
| 8 | 1560 | 487 | 9608 | 16673 | 20611 | | | | | | | |

| | | | | | |
|---|---|---|---|---|---|
| 9 | 3926 | 1640 | 10581 | 16776 | 18039 |
| 10 | 149 | 2928 | 10531 | 17985 | 20550 |
| 11 | 2364 | 563 | 6090 | 12770 | 13369 |
| 12 | 635 | 688 | 10649 | 11835 | 11885 |
| 13 | 231 | 1684 | 11016 | 19381 | 20412 |
| 14 | 1129 | 3894 | 8889 | 16308 | 17018 |

Table 49: Rate 3/4 (true code rate 11/15)

| | | | | | | | | | | |
|---|---|---|---|---|---|---|---|---|---|---|
| 3 | 3198 | 478 | 4207 | 1481 | 1009 | 2616 | 1924 | 3437 | 554 | 683 | 1801 |
| 4 | 2681 | 2135 | 4880 | 8610 | 10402 | 18552 | 18691 | | | | |
| 5 | 3107 | 4027 | 7094 | 13641 | 15279 | 18429 | 18763 | | | | |
| 6 | 2637 | 3373 | 7959 | 9113 | 9380 | 12067 | 17043 | | | | |
| 7 | 3830 | 3449 | 8397 | 11573 | 11778 | 16710 | 19458 | | | | |
| 8 | 4129 | 2060 | 8239 | 16473 | 16672 | 16877 | 19512 | | | | |
| 9 | 4184 | 2742 | 5667 | 8630 | 16523 | 18761 | 20262 | | | | |
| 10 | 3946 | 1070 | 5058 | 8969 | 9009 | 13207 | 18960 | | | | |
| 11 | 2239 | 984 | 10122 | 12291 | 13316 | 20296 | | | | | |
| 0 | 1458 | 3031 | 4596 | 11080 | 15340 | 15725 | | | | | |
| 1 | 3003 | 1328 | 5428 | 7405 | 8681 | 18464 | | | | | |
| 2 | 1137 | 1716 | 10501 | 17975 | 19098 | 20286 | | | | | |
| 3 | 132 | 3725 | 11130 | 16523 | 16916 | 16937 | | | | | |
| 4 | 1817 | 638 | 12815 | 18149 | 18701 | 19052 | | | | | |
| 5 | 1774 | 3447 | 9354 | 10403 | 11261 | 13858 | | | | | |
| 6 | 3632 | 1257 | 6710 | 6902 | 7469 | 12837 | | | | | |
| 7 | 542 | 3694 | 6061 | 13335 | 18664 | 19075 | | | | | |
| 8 | 1015 | 1945 | 5882 | 9617 | 13423 | 18258 | | | | | |
| 9 | 1948 | 412 | 4816 | 5319 | 17280 | 19387 | | | | | |
| 10 | 995 | 2238 | 10836 | 18878 | 19179 | 19407 | | | | | |
| 11 | 4141 | 1907 | 9622 | 12008 | 12998 | 14110 | | | | | |
| 0 | 2480 | 3079 | 12195 | 12404 | 12898 | 16832 | | | | | |
| 1 | 3021 | 1088 | 4545 | 6886 | 10669 | 15877 | | | | | |
| 2 | 713 | 1379 | 5543 | 5731 | 12835 | 18802 | | | | | |
| 3 | 997 | 3903 | 7495 | 9283 | 11396 | 12961 | | | | | |
| 4 | 2323 | 3361 | 5879 | 8802 | 10942 | 13953 | | | | | |
| 5 | 1110 | 986 | 7231 | 10301 | 15987 | 17805 | | | | | |
| 6 | 2532 | 142 | 6304 | 14368 | 15820 | 19299 | | | | | |
| 7 | 1690 | 2405 | 5548 | 6086 | 14591 | 19907 | | | | | |
| 8 | 1298 | 1881 | 6109 | 11679 | 13019 | 13940 | | | | | |
| 9 | 615 | 174 | 6732 | 16552 | 16791 | 17769 | | | | | |
| 10 | 1648 | 3112 | 11481 | 11822 | 16125 | 19402 | | | | | |
| 11 | 1415 | 2808 | 8580 | 10110 | 16249 | 17972 | | | | | |

Table 50: Rate 4/5 (true code rate 7/9)

| 5 | 896 | 1565 | 3976 | 5177 | 5570 | 6450 | 7092 | 7119 | 9989 | 10690 | 11608 | 12337 | 13423 | 15147 | 15236 | 18042 | 18646 | 18943 |
|---|---|---|---|---|---|---|---|---|---|---|---|---|---|---|---|---|---|---|
| 6 | 2493 | 184 | 3974 | 4657 | 5219 | 6195 | 9757 | 10985 | 12739 | 12863 | 13032 | 15380 | 15493 | 15626 | 16209 | 17132 | 19188 | |
| 7 | 212 | 3210 | 4908 | 7027 | 15220 | 15928 | 18514 | 18586 | | | | | | | | | | |
| 8 | 727 | 1339 | 4798 | 9485 | 10059 | 15511 | 17301 | 19580 | | | | | | | | | | |
| 9 | 3428 | 612 | 4774 | 5359 | 9448 | 14264 | 14855 | | | | | | | | | | | |
| 0 | 2663 | 1947 | 6850 | 13950 | 14102 | 15231 | 18805 | | | | | | | | | | | |
| 1 | 230 | 2695 | 5852 | 8445 | 18066 | 18320 | 19412 | | | | | | | | | | | |
| 2 | 2025 | 2794 | 7267 | 11154 | 12026 | 13208 | 19569 | | | | | | | | | | | |
| 3 | 3039 | 283 | 7240 | 8439 | 15298 | 16123 | 19667 | | | | | | | | | | | |
| 4 | 862 | 2889 | 6077 | 11410 | 13343 | 13820 | 18151 | | | | | | | | | | | |
| 5 | 376 | 2110 | 6121 | 6934 | 7388 | 10517 | 19056 | | | | | | | | | | | |
| 6 | 2034 | 2286 | 3976 | 4115 | 8590 | 8739 | 18693 | | | | | | | | | | | |
| 7 | 951 | 2068 | 6200 | 8893 | 9899 | 12429 | 12652 | | | | | | | | | | | |
| 8 | 3108 | 3542 | 6829 | 9093 | 11279 | 12524 | 16270 | | | | | | | | | | | |
| 9 | 307 | 1421 | 3600 | 6992 | 7442 | 15036 | 17076 | | | | | | | | | | | |
| 0 | 2272 | 1197 | 3977 | 4102 | 5079 | 8412 | 11240 | | | | | | | | | | | |
| 1 | 1800 | 3280 | 3929 | 9085 | 13441 | 15445 | 16409 | | | | | | | | | | | |
| 2 | 331 | 2308 | 5185 | 5868 | 6671 | 13213 | | | | | | | | | | | | |
| 3 | 465 | 2552 | 10559 | 13450 | 14117 | 17859 | | | | | | | | | | | | |
| 4 | 1038 | 2479 | 14092 | 16158 | 17813 | 18198 | | | | | | | | | | | | |
| 5 | 1383 | 343 | 7226 | 9948 | 14578 | 15724 | | | | | | | | | | | | |
| 6 | 94 | 236 | 5079 | 6952 | 9415 | 17216 | | | | | | | | | | | | |

| 7 | 2619 | 121 | 7920 | 8676 | 12784 | 17382 |
| 8 | 1497 | 2774 | 9088 | 13324 | 15881 | 16949 |
| 9 | 2116 | 1855 | 4178 | 7510 | 15188 | 17138 |
| 0 | 722 | 1584 | 5610 | 7870 | 10084 | 13927 |
| 1 | 2767 | 1881 | 6763 | 8392 | 15336 | 15691 |
| 2 | 2701 | 1610 | 3902 | 6783 | 8083 | 13103 |
| 3 | 3283 | 1732 | 4311 | 6931 | 8934 | 12248 |
| 4 | 168 | 1099 | 4288 | 8166 | 17047 | 17578 |
| 5 | 3074 | 243 | 4470 | 5665 | 10952 | 12858 |
| 6 | 3460 | 945 | 6979 | 12352 | 14343 | 16203 |
| 7 | 2049 | 1746 | 5923 | 6842 | 9865 | 16902 |
| 8 | 566 | 1427 | 11410 | 11512 | 12141 | 16256 |
| 9 | 3545 | 1168 | 4269 | 6718 | 7336 | 11516 |

13.4 Addresses of parity bit accumulators for $N_{ldpc} = 4\,320$ of extended LDPC codes for incremental redundancy Note: new accumulator addresses written in bold numbers

Table 51: Rate 1/2

| | | | | | | | | | | | | |
|---|---|---|---|---|---|---|---|---|---|---|---|---|
| 118 | 375 | 395 | 490 | 552 | 599 | 895 | 954 | 1005 | 1517 | 1576 | 1739 | 2030 |
| 194 | 1547 | 1598 | 1801 | 2291 | 3086 | 5097 | 5184 | 5413 | | | | |
| 140 | 238 | 253 | 1734 | 3972 | 4567 | 4573 | 5834 | 6055 | | | | |
| 243 | 378 | 919 | 1188 | 3265 | 3707 | 4176 | 4272 | 6174 | | | | |
| 201 | 1005 | 1033 | 1128 | 2945 | 3257 | 3898 | 4022 | 5194 | | | | |
| 202 | 727 | 782 | 1100 | 3117 | 3773 | 4683 | 5859 | | | | | |

Table 52: Rate 7/12

| | | | | | | | | | | | |
|---|---|---|---|---|---|---|---|---|---|---|---|
| 125 | 447 | 543 | 634 | 864 | 1112 | 1124 | 1206 | 1268 | 1484 | 1568 | 1668 | 1672 |
| 105 | 605 | 821 | 1587 | 2609 | 3159 | 3333 | 4096 | 4237 | 4939 | | | |
| 50 | 531 | 803 | 1595 | 2026 | 2683 | 4028 | 4729 | 5215 | 5261 | | | |
| 226 | 410 | 810 | 1378 | 2195 | 4002 | 4456 | 4731 | 5724 | 5886 | | | |
| 27 | 925 | 933 | 966 | 2134 | 2424 | 3165 | 3400 | 4488 | 5474 | | | |
| 131 | 261 | 687 | 1079 | 2778 | 3519 | 4034 | 4809 | 6079 | 6109 | | | |
| 207 | 1054 | 1706 | 1764 | 2079 | 3178 | 3439 | 3616 | 5029 | 5304 | | | |

Table 53: Rate 2/3

| | | | | | | | | | | | |
|---|---|---|---|---|---|---|---|---|---|---|---|
| 15 | 253 | 313 | 501 | 563 | 582 | 865 | 911 | 977 | 1266 | 1276 | 1356 | 1427 |
| 256 | 743 | 982 | 1109 | 1441 | 2337 | 2387 | 2847 | 3209 | 3776 | | | |
| 343 | 525 | 976 | 1102 | 1854 | 2900 | 3787 | 4669 | 4673 | | | | |
| 12 | 502 | 539 | 782 | 2980 | 3827 | 5035 | 5297 | 5576 | | | | |
| 556 | 593 | 1120 | 1420 | 2937 | 3800 | 4130 | 4662 | 4881 | | | | |
| 18 | 119 | 431 | 460 | 1548 | 1982 | 3230 | 4599 | 4992 | | | | |
| 178 | 253 | 416 | 771 | 2488 | 3026 | 4657 | 4815 | 5294 | | | | |
| 74 | 100 | 205 | 1214 | 1999 | 2412 | 2680 | 2952 | 5446 | | | | |

Table 54: Rate 3/4

| | | | | | | | | | | | |
|---|---|---|---|---|---|---|---|---|---|---|---|
| 109 | 116 | 136 | 141 | 178 | 238 | 250 | 503 | 566 | 723 | 978 | 1065 | 1068 |
| 113 | 191 | 586 | 1003 | 1496 | 1650 | 3564 | 5149 | 5210 | | | | |
| 219 | 426 | 583 | 1061 | 1146 | 1338 | 2094 | 2605 | 4627 | | | | |
| 329 | 429 | 576 | 855 | 1265 | 1810 | 3878 | 3884 | 4241 | | | | |
| 121 | 231 | 337 | 620 | 1896 | 2360 | 3027 | 3443 | 4297 | | | | |
| 199 | 216 | 676 | 831 | 1430 | 4431 | 4450 | 5094 | | | | | |
| 223 | 560 | 686 | 713 | 3276 | 3286 | 4513 | 4612 | | | | | |
| 632 | 944 | 1015 | 1043 | 2715 | 3381 | 3863 | 4586 | | | | | |
| 171 | 365 | 514 | 882 | 2595 | 3456 | 4864 | 5136 | | | | | |

The invention has been illustrated and described in detail in the drawings and foregoing description, but such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. Encoder for error correction code encoding input data words (D) into codewords (Z1, Z2), comprising:
   an encoder input for receiving input data words (D) each comprising a first number $K_{ldpc}$ of information symbols,
   an encoding means for encoding each of the input data words (D) into one of the codewords (Z1, Z2, Z3, Z4) such that each of the codewords comprises a basic codeword portion (B) including a data portion (D) and a basic parity portion (Pb) of a second number $N_{ldpc} - K_{ldpc}$ of basic parity symbols, and an auxiliary codeword portion (A) including an auxiliary parity portion (Pa) of a third number $M_{IR}$ of auxiliary parity symbols, wherein said encoding means is adapted
   i) for generating said basic codeword portion (B) from one of the input data words (D) according to a first code, wherein each of the basic parity symbols is generated by accumulating an information symbol at a parity symbol address determined according to a first address generation rule, and
   ii) for generating said auxiliary codeword portion (A) from said one of the input data words (D) according to a second code, wherein each of the auxiliary parity symbols is generated by accumulating an information symbol m at a parity symbol address γ, wherein said parity symbol addresses γ are determined according to a second address generation rule $N_{ldpc} - K_{ldpc} + \{x + m \bmod G_a \times Q_{IR}\} \bmod M_{IR}$ if $x \geq N_{ldpc} - K_{ldpc}$, wherein x denotes the addresses of a parity symbol accumulator corresponding to the first information symbol of a group of size $G_a$ and $Q_{IR}$ is an auxiliary code rate dependent, predefined constant, and
   an encoder output for outputting said codewords (Z1, Z2).

2. Encoder according to claim 1,
   wherein said encoding means (1452) is adapted for generating said each of the auxiliary parity symbols by accumulating the information symbol m at the parity symbol address γ, wherein said parity symbol addresses γ are determined according to the first address generation rule $\{x + m \bmod G_b \times Q_{ldpc}\} \bmod (N_{ldpc} - K_{ldpc})$ if $x < N_{ldpc} - K_{ldpc}$, wherein x denotes the addresses of a parity symbol accumulator corresponding to the first information symbol of a group of size $G_b$ and $Q_{ldpc}$ is a basic code rate dependent, predefined constant.

3. Encoder according to claim 1 or 2,
   wherein $G_a = G_b$.

4. Encoder according to claim 3,
   wherein $G_a = G_b = 360$.

5. Encoder according to claim 1,
   wherein said encoding means is adapted for blockwise generating said basic parity symbols and said auxiliary parity symbols by use of a group of subsequent information symbols,
   wherein each information symbol i of said group of subsequent information symbols is accumulated at a set of different parity symbol addresses γ,
   wherein the set of parity symbol addresses, at which the first information symbol of said group is accumulated, is taken from a predetermined address table and wherein the parity symbol addresses, at which the subsequent information symbols of said group are accumulated, are determined from said set of parity symbol addresses according to said first or said second address generation rule, respectively, and
   wherein a separate set of parity symbol addresses is taken from said address table for generating each new block of basic parity symbols and auxiliary parity symbols.

6. Encoder according to claim 5,
   wherein said encoding means is adapted for subsequently taking a new row of the following address table as a new set of different parity symbol addresses γ for accumulating a new group of subsequent information symbols, said address table for $Q_{IR}=12$, $M_{IR}=4320$, $N_{ldpc}=4320$, $Q_{ldpc}=6$ and a code rate identifier of 1/2 being

| | | | | | | | | | | | |
|---|---|---|---|---|---|---|---|---|---|---|---|
| 118 | 375 | 395 | 490 | 552 | 599 | 895 | 954 | 1005 | 1517 | 1576 | 1739 | 2030 |
| 194 | 1547 | 1598 | 1801 | 2291 | 3086 | 5097 | 5184 | 5413 | | | |
| 140 | 238 | 253 | 1734 | 3972 | 4567 | 4573 | 5834 | 6055 | | | |
| 243 | 378 | 919 | 1188 | 3265 | 3707 | 4176 | 4272 | 6174 | | | |
| 201 | 1005 | 1033 | 1128 | 2945 | 3257 | 3898 | 4022 | 5194 | | | |
| 202 | 727 | 782 | 1100 | 3117 | 3773 | 4683 | 5859 | | | | |

7. Encoder according to claim 5,
wherein said encoding means is adapted for subsequently taking a new row of the following address table as a new set of different parity symbol addresses γ for accumulating a new group of subsequent information symbols, said address table for $Q_{IR}=12$, $M_{IR}=4320$, $N_{ldpc}=4320$, $Q_{ldpc}=5$ and a code rate identifier of 7/12 being

| | | | | | | | | | | | |
|---|---|---|---|---|---|---|---|---|---|---|---|
| 125 | 447 | 543 | 634 | 864 | 1112 | 1124 | 1206 | 1268 | 1484 | 1568 | 1668 | 1672 |
| 105 | 605 | 821 | 1587 | 2609 | 3159 | 3333 | 4096 | 4237 | 4939 | | | |
| 50 | 531 | 803 | 1595 | 2026 | 2683 | 4028 | 4729 | 5215 | 5261 | | | |
| 226 | 410 | 810 | 1378 | 2195 | 4002 | 4456 | 4731 | 5724 | 5886 | | | |
| 27 | 925 | 933 | 966 | 2134 | 2424 | 3165 | 3400 | 4488 | 5474 | | | |
| 131 | 261 | 687 | 1079 | 2778 | 3519 | 4034 | 4809 | 6079 | 6109 | | | |
| 207 | 1054 | 1706 | 1764 | 2079 | 3178 | 3439 | 3616 | 5029 | 5304 | | | |

8. Encoder according to claim 5,
wherein said encoding means is adapted for subsequently taking a new row of the following address table as a new set of different parity symbol addresses γ for accumulating a new group of subsequent information symbols, said address table for $Q_{IR}=12$, $M_{IR}=4320$, $N_{ldpc}=4320$, $Q_{ldpc}=4$ and a code rate identifier of 2/3 being

| | | | | | | | | | | | |
|---|---|---|---|---|---|---|---|---|---|---|---|
| 15 | 253 | 313 | 501 | 563 | 582 | 865 | 911 | 977 | 1266 | 1276 | 1356 | 1427 |
| 256 | 743 | 982 | 1109 | 1441 | 2337 | 2387 | 2847 | 3209 | 3776 | | | |
| 343 | 525 | 976 | 1102 | 1854 | 2900 | 3787 | 4669 | 4673 | | | | |
| 12 | 502 | 539 | 782 | 2980 | 3827 | 5035 | 5297 | 5576 | | | | |
| 556 | 593 | 1120 | 1420 | 2937 | 3800 | 4130 | 4662 | 4881 | | | | |
| 18 | 119 | 431 | 460 | 1548 | 1982 | 3230 | 4599 | 4992 | | | | |
| 178 | 253 | 416 | 771 | 2488 | 3026 | 4657 | 4815 | 5294 | | | | |
| 74 | 100 | 205 | 1214 | 1999 | 2412 | 2680 | 2952 | 5446 | | | | |

9. Encoder according to claim 5,
wherein said encoding means is adapted for subsequently taking a new row of the following address table as a new set of different parity symbol addresses γ for accumulating a new group of subsequent information symbols, said address table for $Q_{IR}=12$, $M_{IR}=4320$, $N_{ldpc}=4320$, $Q_{ldpc}=3$ and a code rate identifier of 3/4 being

| | | | | | | | | | | | |
|---|---|---|---|---|---|---|---|---|---|---|---|
| 109 | 116 | 136 | 141 | 178 | 238 | 250 | 503 | 566 | 723 | 978 | 1065 | 1068 |
| 113 | 191 | 586 | 1003 | 1496 | 1650 | 3564 | 5149 | 5210 | | | | |
| 219 | 426 | 583 | 1061 | 1146 | 1338 | 2094 | 2605 | 4627 | | | | |
| 329 | 429 | 576 | 855 | 1265 | 1810 | 3878 | 3884 | 4241 | | | | |
| 121 | 231 | 337 | 620 | 1896 | 2360 | 3027 | 3443 | 4297 | | | | |
| 199 | 216 | 676 | 831 | 1430 | 4431 | 4450 | 5094 | | | | | |
| 223 | 560 | 686 | 713 | 3276 | 3286 | 4513 | 4612 | | | | | |
| 632 | 944 | 1015 | 1043 | 2715 | 3381 | 3863 | 4586 | | | | | |
| 171 | 365 | 514 | 882 | 2595 | 3456 | 4864 | 5136 | | | | | |

10. Encoder according to claim 1,
wherein said basic codeword portion (B) is provided for regular decoding and said auxiliary codeword portion (A) is provided as incremental redundancy if regular decoding of the codeword by use of the basic codeword portion (B) is erroneous.

11. Transmitter for broadcasting data in a broadcasting system, comprising:
a data input for receiving at least one transmitter input data stream (I1, I2, . . . , In) segmented into input data words (D),
the encoder for error correction code encoding the input data words (D) into the codewords (Z1, Z2) according to claim 1,
a data mapper (16) for mapping the codewords (Z1, Z2) onto frames of a transmitter output data stream (O), and
a transmitter unit (18) for transmitting said transmitter output data stream (O).

12. Broadcasting system comprising the transmitter as claimed in claim 11 and one or more receivers for receiving data broadcast by said transmitter.

13. Encoding method for error correction code encoding input data words (D) into codewords (Z1, Z2), comprising the steps of:
receiving input data words (D) each comprising a first number $K_{ldpc}$ of information symbols,
encoding each of the input data words (D) into one of the codewords (Z1, Z2, Z3, Z4) such that each of the codewords comprises a basic codeword portion (B) including a data portion (D) and a basic parity portion (Pb) of a second number $N_{ldpc}-K_{ldpc}$ of basic parity symbols, and an auxiliary codeword portion (A) including an auxiliary parity portion (Pa) of a third number $M_{IR}$ of auxiliary parity symbols,
generating said basic codeword portion (B) from one of the input data words (D) according to a first code, wherein each of the basic parity symbols is generated by accumulating an information symbol at a parity symbol address determined according to a first address generation rule,
generating said auxiliary codeword portion (A) from said one of the input data words (D) according to a second code, wherein each of the auxiliary parity symbols is generated by accumulating an information symbol m at a parity symbol address γ, wherein said parity symbol addresses γ are determined according to a second address generation rule $N_{ldpc}-K_{ldpc}+\{x+m \bmod G_a \times Q_{IR}\} \bmod M_{IR}$ if $x \geq N_{ldpc}-K_{ldpc}$, wherein x denotes the addresses of a parity symbol accumulator corresponding to the first information symbol of a group of size $G_a$ and $Q_{IR}$ is an auxiliary code rate dependent, predefined constant, and outputting said codewords (Z1, Z2).

14. A non-transitory computer program comprising program code means for causing a computer to carry out the steps of encoding and mapping of the method as claimed in claim 13, when said computer program is carried out on a computer.

15. Transmission method for broadcasting data in a broadcasting system, comprising the steps of:
receiving at least one transmitter input data stream (I1 I2, . . . , In) segmented into input data words (D),
the encoding method for error correction code encoding the input data words (D) into codewords (Z1, Z2) according to claim 11,
mapping the codewords (Z1, Z2) onto frames of a transmitter output data stream (O), and
transmitting said transmitter output data stream (O).

* * * * *